US005249115A

United States Patent [19]
Reid

[11] Patent Number: 5,249,115

[45] Date of Patent: Sep. 28, 1993

[54] SWITCH INPUT TERMINATION ARRAY

[75] Inventor: Drew A. Reid, Cedar Rapids, Iowa

[73] Assignee: Square D Company, Palatine, Ill.

[21] Appl. No.: 814,737

[22] Filed: Dec. 26, 1991

Related U.S. Application Data

[63] Continuation of Ser. No. 722,814, Jun. 28, 1991.

[51] Int. Cl.[5] .............................................. G05B 11/01

[52] U.S. Cl. ...................................... 364/141; 364/492

[58] Field of Search ............... 364/141, 483, 492, 140, 364/480, 505, 557; 361/64

[56] References Cited

U.S. PATENT DOCUMENTS 4,167,786 9/1979 Miller et al. ........................ 364/493
4,402,059 8/1983 Kennon et al. ..................... 364/900
4,418,333 11/1983 Schwarzbach ..................... 340/310
4,489,385 12/1984 Miller et al. ........................ 364/493
4,497,031 1/1985 Froehling et al. ................. 364/557
4,771,185 9/1988 Feron et al. .......................... 307/39
4,835,706 5/1989 Asahi .................................. 364/492
4,920,476 4/1990 Brodsky et al. ..................... 364/140
4,965,694 10/1990 Dvorak et al. ........................ 364/64
4,996,646 2/1991 Farrington ......................... 364/483

*Primary Examiner*—Jerry Smith
*Assistant Examiner*—Jim Trammell
*Attorney, Agent, or Firm*—Larry I. Golden; Kareem M. Irfan

[57] ABSTRACT

In an electrical distribution system for controlling current paths through a plurality of associated circuit breakers, a programmable circuit arrangement operates the circuit breakers by remote control in at least the open and closed circuit positions. The circuit arrangement includes an array of termination points which are used in sets, such that each set includes a plurality of termination points, wherein each set receives a remotely generated control signal for commanding the circuit breakers to open or close. A control circuit includes a microcomputer, which is coupled to the array of termination points and responsive to the remotely generated control signal, for controlling the circuit breakers between the open and closed circuit positions. The microcomputer reads the termination points, via an X-Y grid, by polling the X axis and reading the Y axis.

12 Claims, 29 Drawing Sheets

RUN
HALT
MANUAL
REVIEW
PULSE
MAINTAIN
NO CHANNEL
CLOSE
OPEN
LATCH
RTC
RS-232
DATA MUX
E2PROM
μP
RESET
IRQ
SS
SCK
MISO
MOSI
TO 72
TO 50
RX
TX
CTS
RTS
EN
CHEN
TDO
RDO
RESET OF 72 (FIG.4)
TO 66 (FIG.4)
Vref
Vcc 261
P1
MCSENSE 4
MCSENSE 2
MCSENSE 0
232
SELECT 6
SELECT 5
SELECT 4
SELECT 3
SELECT 2
SELECT 1
CONT. ON FIG.10D
CONT. FROM FIG.10A

CONT. ON FIG.10D

CONT. FROM FIG.10A
262
262

262
262
CONT. FROM FIG.10B
CONT. FROM FIG.10C

70

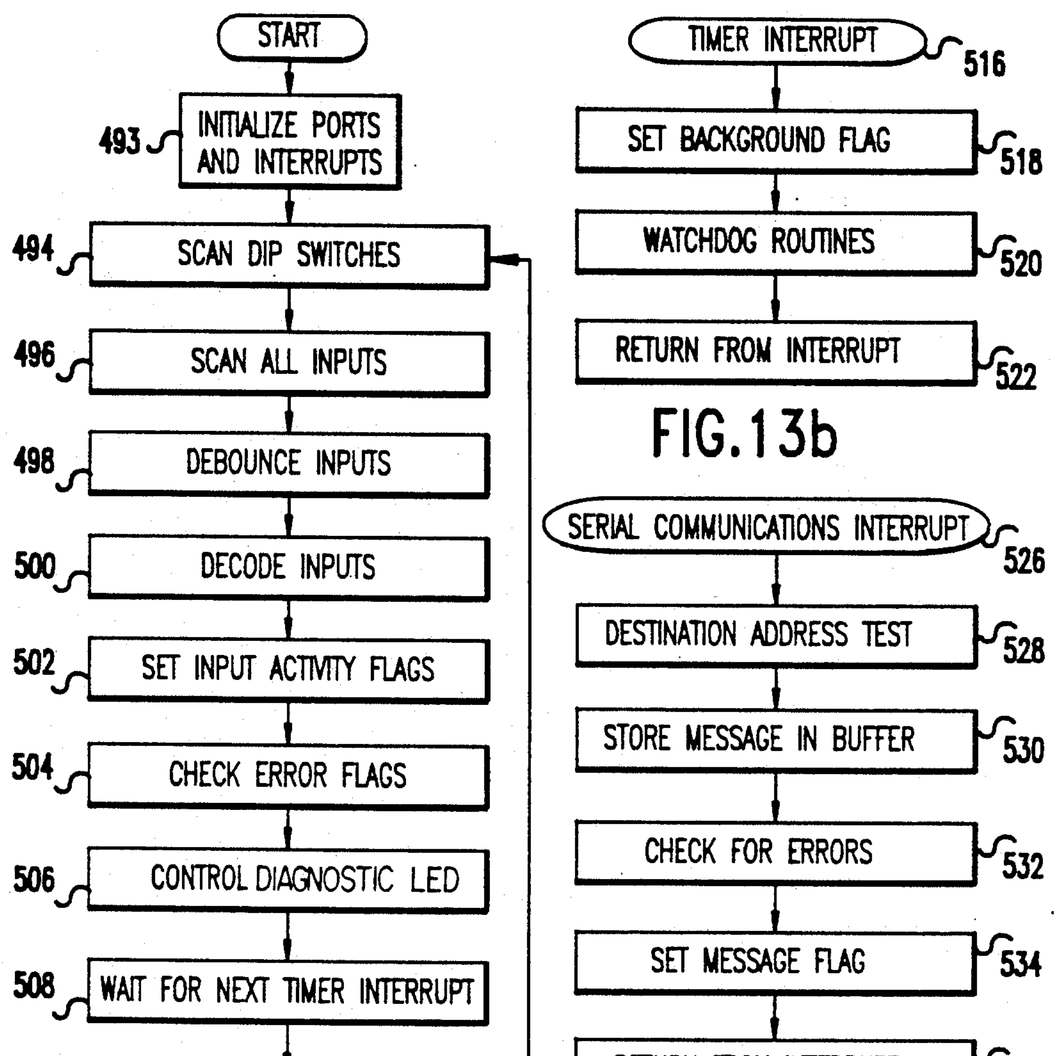
FIG.13a
FIG.13b
FIG.13c
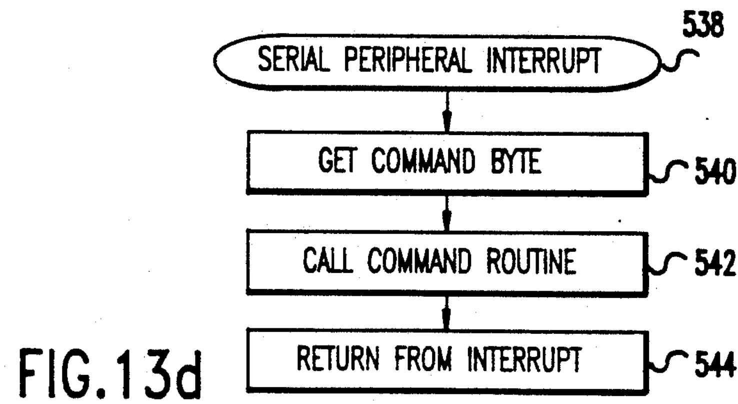
FIG.13d

SWITCH INPUT TERMINATION ARRAY

This is a continuation of U.S. patent application Ser. No. 07/722,814, entitled "Panelboard Arrangement With Improved Control," filed Jun. 28, 1991.

FIELD OF THE INVENTION

The present invention relates generally to circuit breaker load centers and, more particularly, to improvements in the control and monitoring of remotely controlled circuit breakers.

BACKGROUND OF THE INVENTION

Remote control circuit breakers are commonly used for temporary interruption of electrical service during peak use hours and for programmable lighting control of industrial locations. By opening and closing on demand from a remote location, these circuit breakers provide a significant improvement over manually operated circuit breakers in terms of convenience.

Systems using remote control circuit breakers typically include a circuit breaker load-center having circuit breakers wired to a remotely located computer for monitoring and/or controlling each circuit breaker. The wiring has been accomplished in such systems either by using a patch-board within the load-center, as described in U.S. Pat. No. 4,920,476 (Brodsky et al.), or by hard-wiring each circuit breaker input/output to a terminal in the remotely located computer.

Such systems, unfortunately, are not very accommodating to system control changes. Rather, the systems are designed to handle specific types of remote control signals, typically provided by a pair of wires that may be shorted to command the circuit breaker to close. Each time the circuit breaker control requirements change in these systems, the wiring and many system components must be reconfigured or replaced, thereby making these systems expensive and burdensome to maintain.

Another maintenance-related problem with these types of systems concerns the ability to control and monitor the system. Most load-center systems fail to provide a conveniently arranged monitoring system for the various circuit breakers and/or fail to provide a convenient method of on-line circuit breaker programming.

There is therefore a need for a remotely controlled circuit breaker load-center which is easier and more convenient to monitor and operate.

OBJECTS AND SUMMARY OF THE INVENTION

It is a general object of the present invention to provide an improved remote control circuit breaker arrangement which overcomes the aforementioned deficiencies of the prior art and which is more convenient to monitor and operate locally and remotely.

It is another object of this invention to provide an improved circuit breaker arrangement having reliable, yet inexpensive, local and remote signals for indicating whether power to the load has been interrupted.

It is another object of this invention to provide a circuit arrangement in a load-center for controlling current paths through a plurality of associated circuit breakers which are each operable by remote control in at least the open and closed circuit positions. The circuit arrangement may include a termination circuit for receiving different kinds of remote control signals, each of which is associated with at least one of the circuit breakers for commanding that each of the circuit breakers open or close the associated current path; and a programmable control circuit, responsive to each of the different kinds of remote control signals and to a prescribed map indicating the kind of remote control signal which commands the associated circuit breaker, for controlling the circuit breakers between the open and closed positions.

In accordance with one embodiment of the present invention, the foregoing objectives are particularly realized by implementing the circuit arrangement with a termination circuit, a programmable controller and an interface circuit. The termination circuit receives a plurality of different kinds of remote control signals, each of which is associated with one of the circuit breakers for commanding that each of the circuit breakers open or close the associated current path. The programmable controller responds to each of the different kinds of remote control signals and to a user-defined program indicating the kind of remote control signal which commands the associated circuit breaker, by generating control signals. Finally, the interface circuit responds to the generated control signals by controlling the circuit breakers between the open and closed positions.

Another aspect of the present invention is a circuit arrangement for an electrical distribution system used to control current paths through a plurality of associated electrical switching means, at least one of which is operable by remote control in at least open and closed circuit positions. The circuit arrangement includes an array of termination points which are used in sets, such that each set includes a plurality of termination points, wherein each set receives a remotely generated control signal for commanding the electrical switching means. A control circuit is included as part of the circuit arrangement to provide control processing. This is prefereably accomplished using a microcomputer, coupled to the array of termination points and responsive to the remotely generated control signal, for controlling the electrical switching means between the open and closed circuit positions.

The array preferably includes an X by Y grid, wherein X and Y are both integers greater than 1 and the microcomputer which reads the array of termination points by reading each axis of the grid. For example, if $X=Y=4$, the microcomputer reads the remotely generated control signals at the array of termination points by sending four poll signals and reading four associated status signals.

BRIEF DESCRIPTION OF THE DRAWINGS

Other objects and advantages of the invention will be apparent from the following detailed description and the accompanying drawings in which:

FIGS. 13*a*–13*d* comprise a flow chart which may be used to program the microcomputer shown in FIG. 11*a*.

Figure 1A:
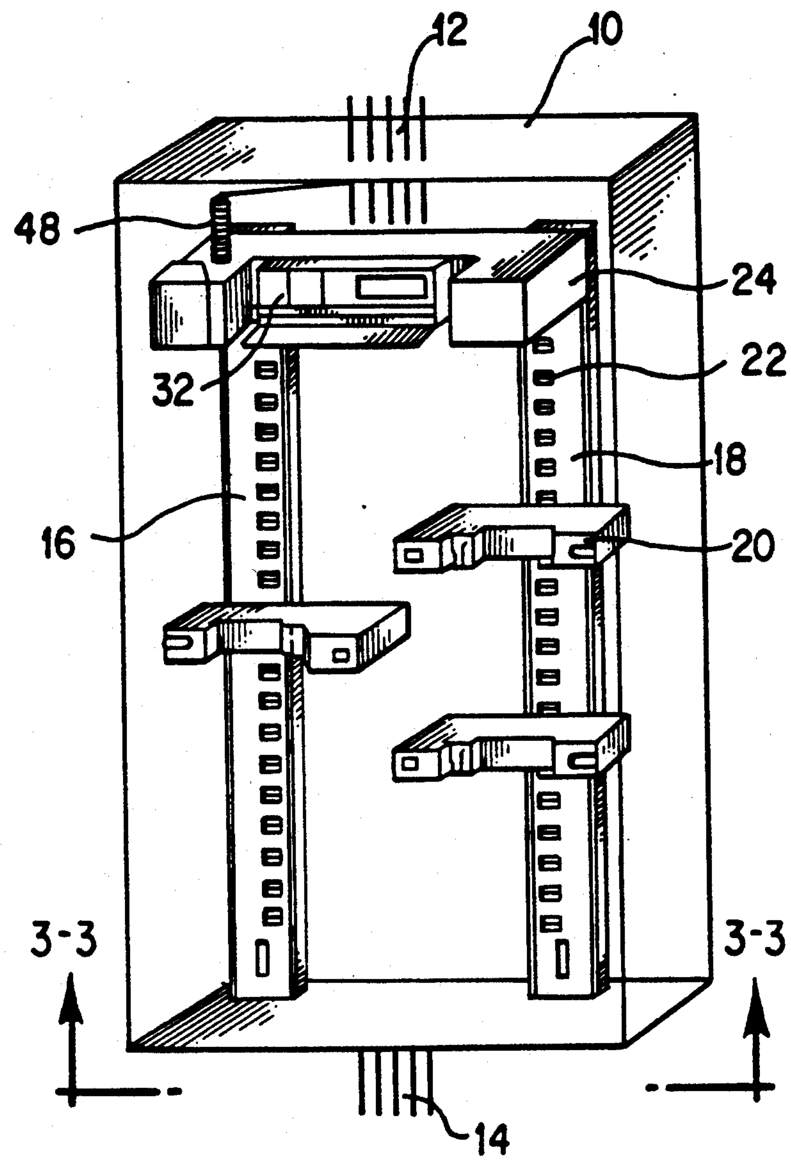
FIG. 1*a* is a perspective view of a load center arrangement or system, according to the present invention.
Figure 1B:
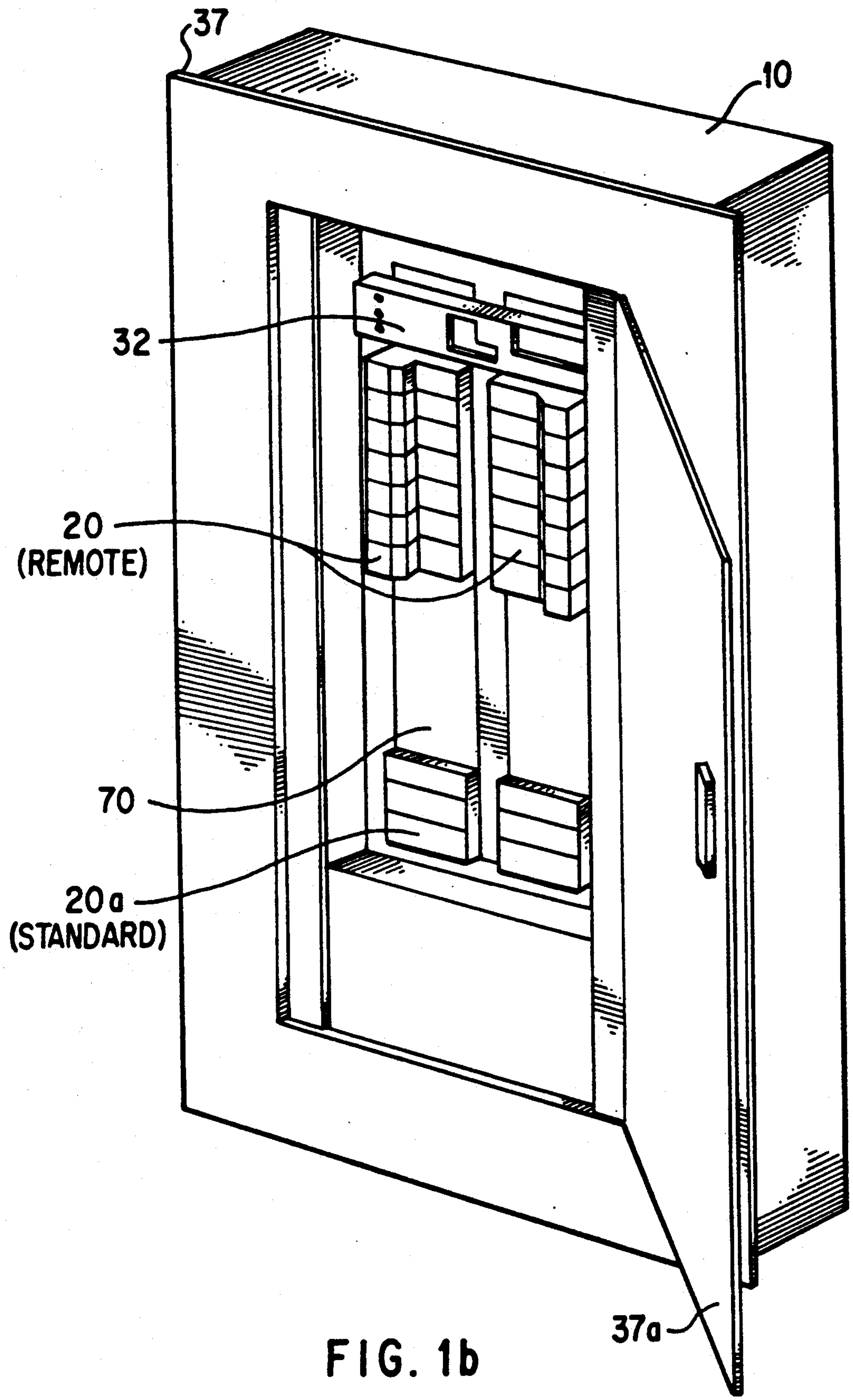
FIG. 1*b* is another perspective view of the load center arrangement of FIG. 1*a;*

While the invention is susceptible to various modifications and alternative forms, specific embodiments thereof have been shown by way of example in the drawings and will be described in detail. It should be understood, however, that it is not intended to limit the invention to the particular form described. On the contrary, the invention is to cover all modifications, equivalents, and alternatives falling within the spirit and scope of the invention as defined by the appended claims.

DESCRIPTION OF THE PREFERRED EMBODIMENT

In FIG. 1*a*, the present invention is shown to provide an electrical distribution system or arrangement which may include a panelboard or load-center enclosure 10 which receives a plurality of input power lines 12 from a power source (not shown). Lines 14 exit the enclosure 10 to distribute power to various loads (not shown). Bus boards 16 and 18, which may be implemented on the same board, are disposed in parallel on each side of the load-center for mounting remotely controlled circuit breakers 20, each having a plug-in socket which is coupled to one of a plurality of connectors 22 on the bus boards 16 and 18. The connectors 22 are used with the bus boards 16 and 18 to carry motor control and contact-status signals, via an interface module 24, to and from the circuit breakers 20. Electrical switching devices other than circuit breakers may be used such as contactors or electrical relays.

A preferred circuit breaker, which may be used to implement the remotely controlled circuit breakers 20, is described in copending patent application 07/722,814, entitled REMOTE CONTROL CIRCUIT BREAKER, which is filed herewith, assigned to the instant assignee and incorporated herein by reference. Another circuit breaker which may be used to implement the remotely controlled circuit breakers 20 is described in U.S. Pat. No. 4,623,859, Erickson et al., also assigned to the instant assignee and incorporated herein by reference.

Figure 2:
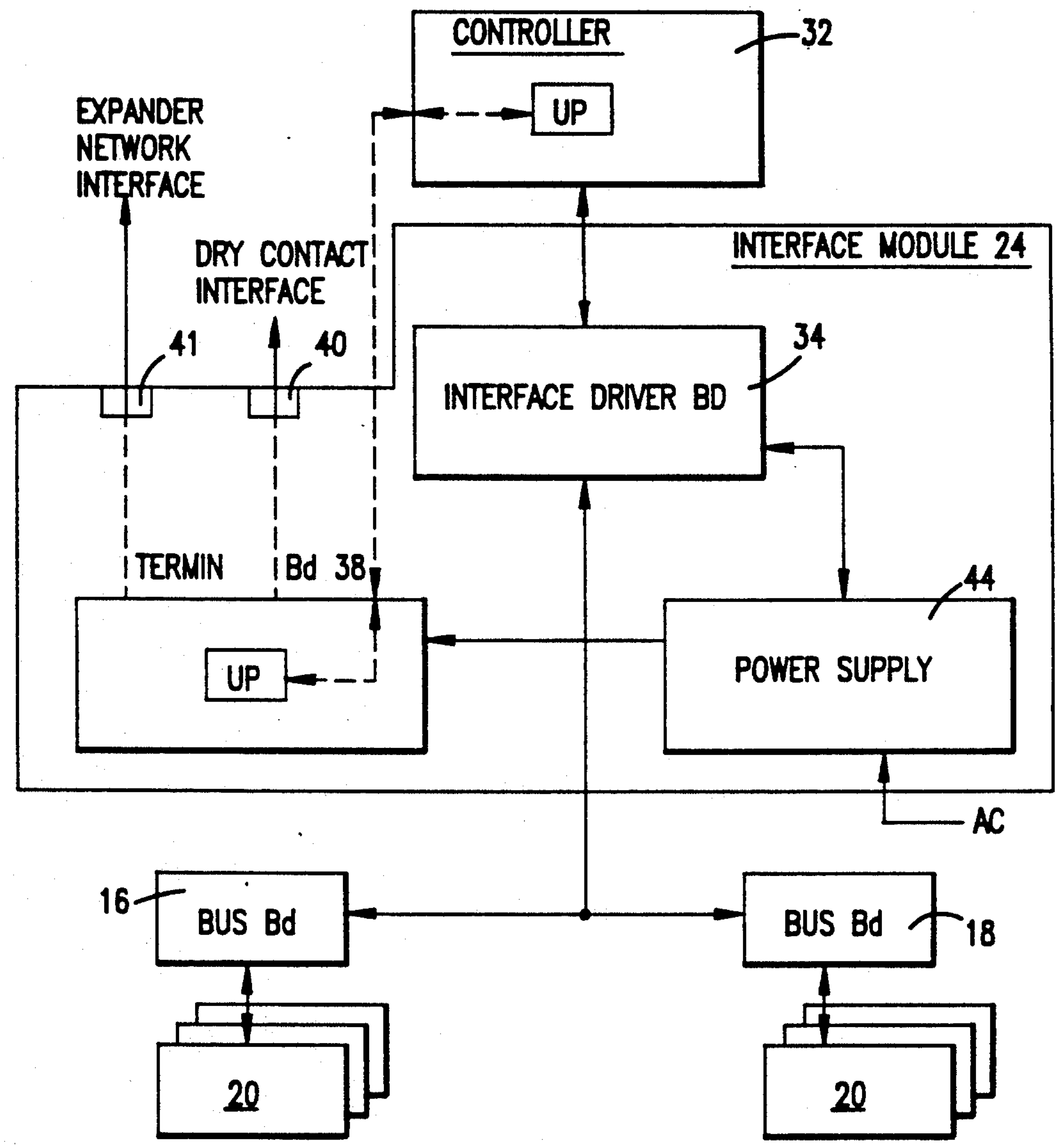
FIG. 2 is an electrical block diagram of the system shown in FIG. 1*a*, and including a controller, an interface module and a termination board which are intercoupled to provide the primary control functions of the system.
Figure 7:
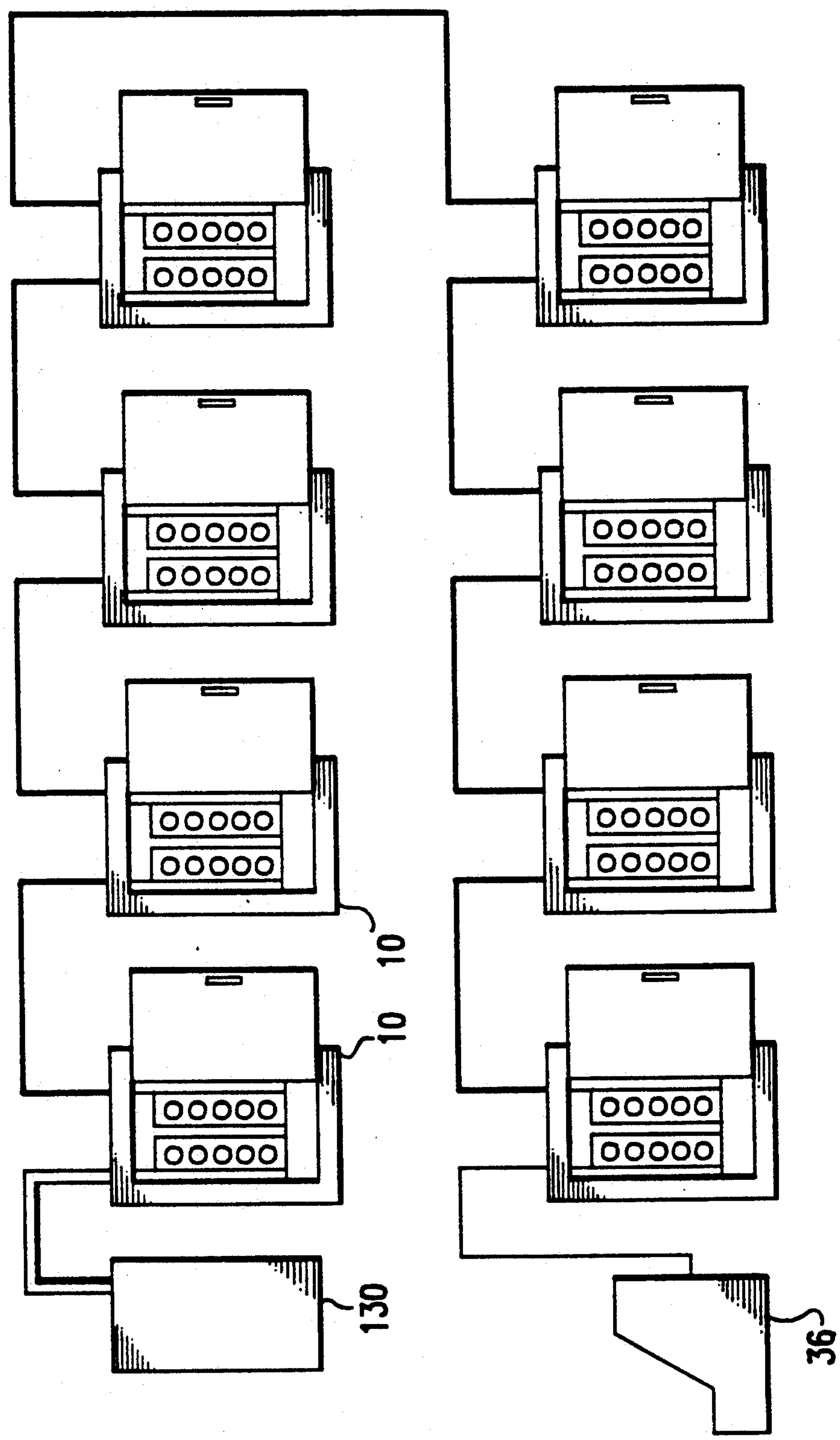
FIG. 7 illustrates a perspective view of a plurality of systems interconnected in accordance with the present invention.

As illustrated in the block diagram of FIG. 2, the interface module 24 interprets messages from a controller 32 so as to facilitate electrical control and monitoring functions from both local and remote locations. Both the control and monitoring functions are accommodated within the interface module 24 using an interface driver board 34. The interface driver board 34 provides a communications path between the circuit breakers 20 and the controller 32, which resides within, and as an integral part of, the load-center enclosure 10. The controller 32 may communicate with a remotely located control/monitoring device 36 (FIG. 7) via the termination board 38. Any such control or monitoring signal transmitted between the interface driver board and the circuit breakers is carried by one of two control buses on the bus boards 16 and 18.

The interface module 24 also includes a termination board 38, which is used to couple the control and monitoring signals between the interface driver board 34 and the remotely located control/monitoring device via the controller 32. Preferably, the control and monitoring signals are transmitted and received using either a direct-wiring (or dry contact) interface, as depicted at port 40 of the termination board 38, or a prescribed serial communication protocol (e.g., a wired or wireless LAN-type interface), as depicted at port 41 of the termination board 38. This coupling may also be accomplished using a number of different techniques, including, for example, those techniques discussed in U.S. Pat. No. 4,709,339 (issued to Fernandez), and co-pending U.S. patent application Ser. No. 07/503,267, by Lee Wallis.

Figure 3:
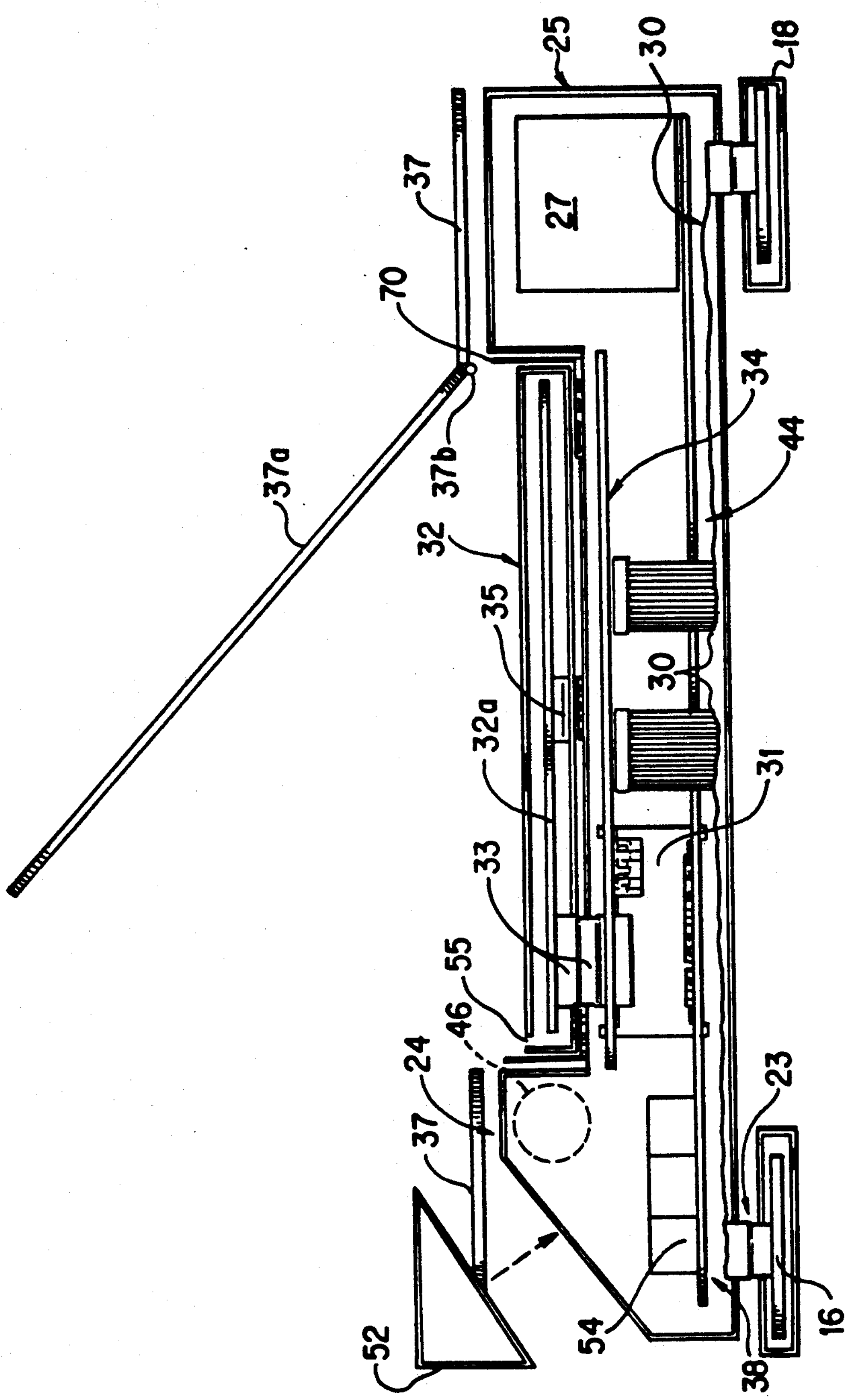
FIG. 3 is an end view, taken along line 3—3 of FIG. 1*a*, illustrating various interconnected components of the system of FIG. 1*a;*

FIG. 3, which shows an end view of load-center components of FIG. 1*a*, best illustrates the above-described electrical arrangement of FIG. 2 from a structural perspective. FIG. 3 illustrates a manner of interconnecting the bus boards 16 and 18, the controller 32 and the interface module 24, the latter of which includes an interface module housing 25 for enclosing the interface driver board 34, a power supply board 44 and the termination board 38. The interface module 24 may be coupled to the uppermost or lowermost portion of the bus boards 16 and 18 according to the preferred viewing position. The interface driver board 34 is preferably coupled to the bus boards 16 and 18 via a pair of ribbon cables 30 and associated DB25-type connectors 23, and the interface driver board 34 is coupled to the power supply board 44 and the termination board 38 using an interconnect board 31. The connectors 33 may be offset so that the controller 32 overhangs the top or bottom of the load-center if desired. The controller 32 may be secured to the front panel of the interface module 24 using DB-9 connectors 33.

The controller 32 includes a controller circuit board 32*a* which may be secured to the front panel of the interface module 24 using DB-9 connectors 33. A membrane keyboard 35 is used to receive user inputs for controlling the circuit breakers and for programming the system.

The power supply board 44 and the termination board 38 may be implemented on a single printed circuit board or separate circuit boards. Further, a power transformer 27 is preferably attached to the power supply board 44 to provide power to the interconnect board 31. The transformer 27 may include two primary windings and three secondary windings to provide signals which may be processed using full-wave rectifier/-regulator stages, such that +5 (Vcc), −5 and −24 Volts are provided along with their associated common signals, of which at least the latter two may be the same. In a preferred embodiment, one secondary winding provides the +5 Volt signal, the second secondary winding provides the −24 Volts signal, and the third secondary winding provides an isolated unregulated signal which is regulated to +5 Volts ($V_{iso}$ of FIG. 11*a*); and the −5 Volt signal emanates from the −24 Volt regulator.

A cover 37, including a cover door 37*a* rotating about a hinge 37*b*, is conventionally used to enclose the load center.

Also illustrated in FIG. 3 is a conduit mounting hole 46 on the interface module housing 25 for receiving leads, via conduit (not shown), which connect to input terminals 54 on the termination board 38. The leads include low voltage wiring for switch inputs, e.g., dry-contact type inputs or a LAN. A removable termination area cover 52 protects and allows access to the input terminals 54 of the termination board 38.

Another important part of the present invention concerns the location of the controller 32. As shown in FIG. 3, a deadfront panel 70 is used to isolate the power lines from operators and to cover the interface module 24 and most of the bus boards 16 and 18 and the circuit breakers 20 (FIGS. 1*a* and 2). The controller 32 is separated from the interface driver board 34 and located in front of the deadfront panel 70. This arrangement is advantageous for a number of reasons. For instance, it provides additional room for the circuitry within the interface module 24, which is located behind the deadfront panel 70.

Another advantage relates to the dissipation of heat generated by the circuitry within the interface module 24, as well as the circuit breakers 20. Unfortunately, the deadfront panel 70 has the potential to significantly increase the temperature resulting from the generated heat due to the lack of ventilation that would otherwise be provided to the interface module circuitry in the absence of the deadfront panel 70. Thus, by locating the controller 32 and its associated circuitry in front of the deadfront panel 70, the temperature of the circuitry is lowered and the cost and reliability of the circuitry is therefore improved.

Figure 5A:
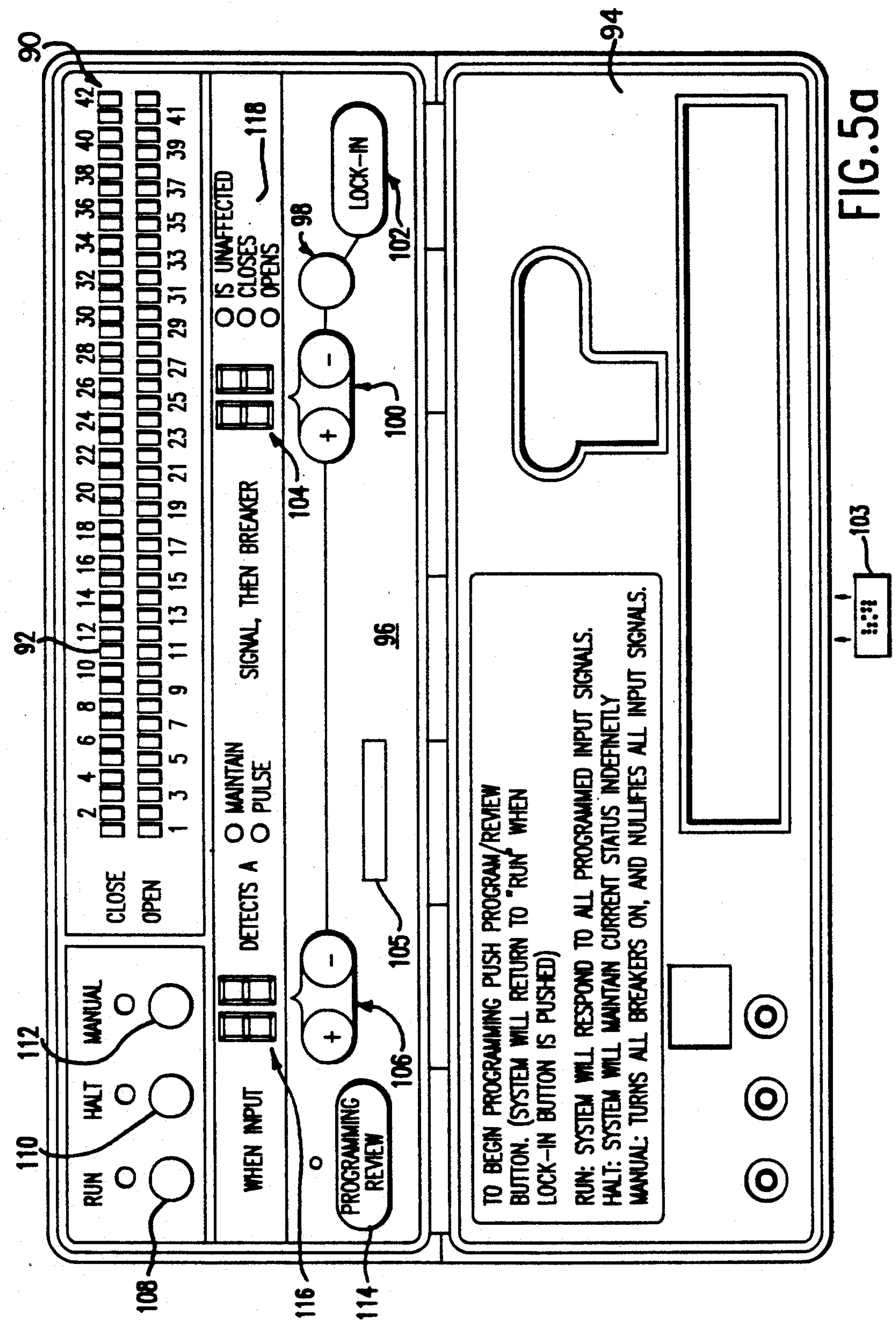
FIG. 5*a* is a perspective view of the display for the controller shown in FIGS. 1–4.

Yet another advantage provided by this controller arrangement is the additional access it provides for operator interface. By using an informationally sophisticated monitor/control panel, such as is shown in FIG. 5*a*, within the load-center enclosure 10, an operator will need complete access to the various displays and control keys on the monitor/control panel.

Further, this arrangement allows an operator to easily replace or upgrade the controller without removing the deadfront panel and thereby exposing the operator to the power lines.

In order to allow removal of the deadfront panel 70 without disconnecting the electronics between the controller 32 and the interface module 24, the controller 32 may be coupled to the interface module 24 by a hinged pivot. In the operating position, the controller 32 would be held in position by a connector which attaches to the interface module 24. The opposite side of the controller would be attached by the hinged pivot such that the controller 32 could be perpendicularly pivoted away from the panel to allow for removal of the deadfront panel 70.

Figure 4:
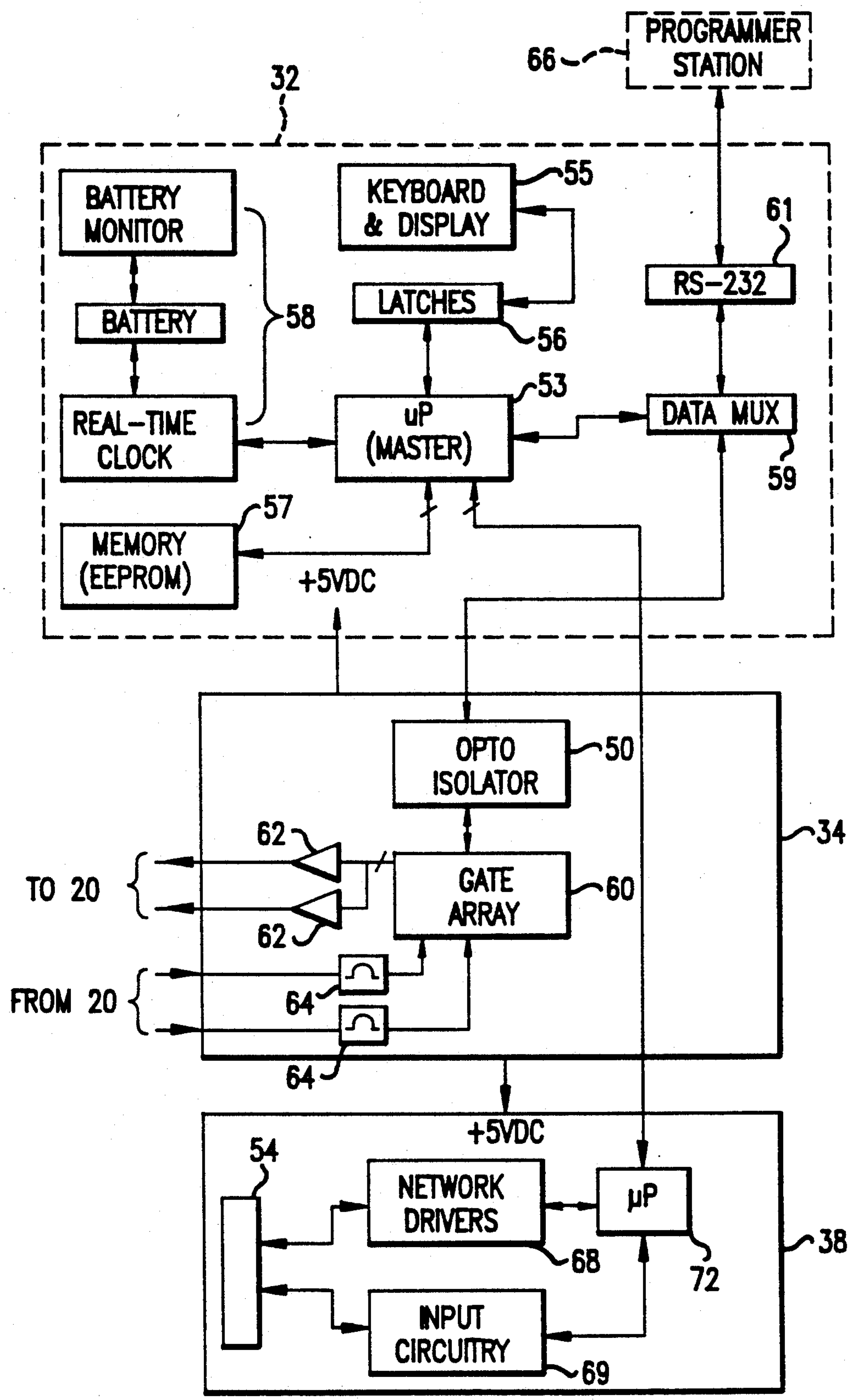
FIG. 4 is a more specific block diagram of the controller, the interface module and the termination board of FIG. 2.

In FIG. 4, an electrical block diagram of the controller 32, the interface driver board 34 and the termination board 38 is illustrated. The controller 32 includes a microcomputer 53, preferably an MC68HC05C4 (or C8) type available from Motorola, Inc., which communicates with a keyboard and display panel 55 through data latch circuitry 56. The user or operator is provided complete control over, and status of, the circuit breakers 20 through the keyboard and display panel 55.

The controller 32 also includes electrically alterable nonvolatile memory 57, which may be programmed by the user to contain specific information for operating each of the system's circuit breakers 20. Preferably, the memory 57 does not store the present state of the circuit breakers, since their state may be regularly accessed from the circuit breakers 20 themselves. However, a history of the circuit breaker activity may be recorded in the memory 57 for maintenance purposes.

In order to prevent memory endurance problems from limiting the life of the system, writes to the memory 57 are limited. Variable data is stored in the system RAM (internal to the microcomputer 53) as long as possible before any writes to the memory 57 are performed. Data is only written to the memory 57 at prescribed times during the programming mode of the controller 32. During the system run mode, data is not written to the memory 57 so as to prolong the life of the memory.

In order to prevent charge-drain off from the gates of the individual memory transistors (internal to the memory 57), the microcomputer 53 checks for valid data each time that the memory is read. Charge-drain off occurs to only one transistor at a time and is corrected by a single bit error code that determines the validity of the data in the memory. Normally, the data is valid and no further action with respect to the memory is required. However, if an error is detected, an algorithm is run to determine if the error is a charge drain-off error or a noise error. If it is an error due to noise, the correct data is read again from the memory and used. The erroneous bit will be corrected if the error is a hard error, and the corrected data will then be written to the memory. This is the only instance where the memory is written during the run mode rather than during the program mode.

Conventional circuitry 58 may be optionally provided to provide reliable, battery-backed real-time clock functions for the system. For example, this may be used to allow time-phased events to trigger certain ones of the circuit breakers 20.

The interface driver board 34 is shown as interfacing with the controller 32, through a data multiplexer 59, using an optical isolator 50 to maintain voltage isolation between the circuits and protect the circuits from power-line transients. The data multiplexer 59 also provides electronic programming capabilities from a programming computer or station 66 for accessing the controller functions. This is preferably accomplished using serial interface circuitry 61, e.g., for an RS-232 type protocol, between the data multiplexer 59 and the station 66. The interface driver board 34 and the controller 32 may be coupled in this manner using a serial protocol to reduce the number of pins required for communication therebetween.

The interface driver board 34 further includes a gate array 60 which couples the interface driver board 34 through amplifiers 62 to the motors of the remotely controlled circuit breakers 20 in order to significantly reduce the number of required driver transistors and PC board traces. When the interface driver circuitry is commanded to engage a breaker (i.e., open or close the breaker contacts), the gate array 60 essentially maps the address of the circuit breaker into a form which will turn on any two of a plurality of power output transistors associated with the gate array 60. Timers within the gate array 60 drive power transistors 62 external to the gate array 60 to control the circuit breaker motor engagement time and status read times. For example, a pair of power transistors may drive the circuit breaker motor in either of two directions for a controlled time period in order to turn the circuit breaker on or off by closing or opening the contacts. After the motor drive time period elapses, the status of the selected circuit breaker is automatically read after a specified settle time and is passed to the communications circuitry of the gate array 60. Only one circuit breaker can be switched at a time, and sets of breakers must be turned on or off sequentially.

Because of the limited physical space available for the power driver circuitry of the gate array 60, a minimum circuit breaker cycle time, i.e., the time period to complete the tasks and communications associated with a single command, is observed. This cycle time allows the power supply to sufficiently recharge the power supply storage capacitors (which may be located at the input of the −24 Volt regulator) to supply full voltage to the circuit breaker motors.

The status signals provided by the selected circuit breaker 20 are filtered by noise filters 64 before being provided to the gate array 60, which transmits the circuit breaker status to the controller 32 through the optical isolator 50.

In addition to controlling and monitoring the circuit breakers 20 from the keyboard and display panel 55, the circuit breakers 20 may be accessed using the microcomputer 53 of the controller through the termination board 38. For such communication with the controller 32, the termination board 38 includes a microcomputer 72 to communicate directly with the microcomputer 53. A significant advantage of this arrangement is that it allows a multitude of remote devices to control and monitor the circuit breakers in the same manner as with the keyboard and display panel 55.

The termination board 38 includes a communication or input terminal port 54 for remote device access to the controller 32. As previously indicated, such remote access may be provided by hard-wiring the devices to the input terminal port 54 with common, positive and negative leads at the respective terminals. A set of network drivers 68 may be used to provide the requisite network interface, and additional input circuitry 69 may be used to custom-program interface specifications.

The input circuitry 69 may include, for example, trinary DIP switches mounted to the termination board 38 which are utilized to program pulsed and maintained control modes of the plurality of inputs at terminal port 54. A single switch may be included for each of the plurality of input terminals 54. Each of the switches preferably have both pulsed and maintained labels to allow the system operator set the DIP switches according to whether the connected inputs are pulsed or maintained.

In one application, a pulsed input may refer to any of the plurality of input terminals at terminal port 54 which remains active for less than sixty seconds. Using this sixty second limitation, a maintained input then refers to an input signal which does not make two state transitions within a time period of less than sixty seconds, a transition being an input change between a pair of prescribed high and low voltage levels. The microcomputer 72 then uses the DIP switch setting to determine if an input is pulsed or maintained.

Common, positive and negative leads may be used to control either pulsed or maintained modes. For a maintained input, only two of the three terminals (common, positive and negative) are used and the DIP switch is set to its maintained position. The common terminal is always connected for any input. The positive terminal is connected to normally open contacts, the negative terminal is connected to normally closed contacts. If a closing contact is to cause an associated circuit breaker to switch, the two wires from the contacts connect between the positive and common terminals. If an opening contact is to cause a circuit breaker to switch, the wires connect between the negative and common terminals. If the DIP switch associated with a given input is set to the pulsed position, the input will be programmed to pulse mode operation. Two or three wires are connected to the terminals in the pulsed mode. When a positive terminal is connected, a closing contact causes each selected circuit breaker, or group of circuit breakers, to open or close according to the user program. When a negative terminal is connected, the closing contact causes each selected circuit breaker, or group of circuit breakers, to do the opposite of the positive terminal.

The pulsed mode is useful for normally open momentary wall switches used to override the automatic operation of the system. A first input is programmed to turn off a selected circuit breaker at a selected time. Next, a momentary, normally open two position wall switch is programmed to control the same circuit breaker using a second input. The system turns the selected circuit breaker on automatically when the contact of the first input is closed. The circuit breaker turns off when the contacts of the first input are open. The momentary switch of the second input may override the state of the contacts. If the switch is placed in the on position, the circuit breaker turns on regardless of the state of the contacts. Likewise, if the switch is pushed off, the associated circuit breaker would turn off regardless of the state of the contacts.

The contractor may optionally include a feature in the system while setting the input terminals wherein the system may autostep to used inputs while skipping unused inputs during programming. To enable this feature, the contractor sets the corresponding trinary DIP switch to the center position. When in program mode, the system looks for these shorts and does not display them on the front panel of the controller such that the user cannot program them. If this condition is not present, the system shows the inputs on its display during normal programming. The programmer may choose not to program these inputs thereby achieving the same result. If the condition is not present, the pulsed or maintained DIP switch settings are ignored.

The controller 32 initiates all communications to the gate array 60 by sending a two byte message which minimizes communications protocol errors. The first byte of the two transmitted bytes is equivalent for communications either to or from the interface driver board 34 or controller 32. A byte number is placed in the least significant bit position of all transmitted bytes to reduce the chance of unsynchronized messages. Accordingly, bit zero of the first byte always has a value of zero because it indicates the byte number. Bits one through four indicate the circuit breaker address and are the least significant bits of a particular circuit breaker address. Bits five through seven are check bits which are generated to check bits one through four. The format for the second byte of a message differs depending on whether it is sent from the interface driver board 34 or the controller 32. Messages sent from the controller 32 are command bytes. In the second command byte, bit zero is always one because it signifies byte two of the message. Bits one and two are the most significant two bits of the circuit breaker address. Bits five through seven are generated to check bits one through four. Bits three and four are encoded with four possible commands to the interface driver board 34. The controller commands are to read the motor, read the contact status, open a selected breaker or close a selected breaker. When the most significant bit of the command code is a zero, the interface driver board 34 only sends back a status. If the most significant of the two bits is a one, a switch command is sent to the interface driver board 34.

Messages sent from the interface driver board 34 are status bytes. The second byte of a status message may differ from the second byte of a command message in bit positions three and four. In a status byte, bit four is a status and bit three is always zero. These bits indicate the presence of a motor in the circuit breaker, the status of the contact, i.e., whether a selected breaker has been opened or closed.

If the interface driver board 34 detects an error in either byte one or byte two, no circuit breaker switching or status reading occurs. An all 1's error message is returned and the interface module is reset to wait for the first byte of the next command. The controller 32 then retransmits the previous message. Accordingly, if the controller 32 sends a read status message, the interface driver board 34 reads the circuit breaker status and returns the results to the controller 32. If the controller message is a switch command, the interface driver board 34 carries out the command by switching the breaker. It then reads and returns the contact status of the selected breaker. The interface module response to a read status message is the desired status of the contacts of the selected circuit breaker. The interface module response to a switch command is the actual status of the contact after the switch has occurred. The controller 32 uses the returned information to ascertain whether the selected circuit breaker has switched. If the returned status shows that the contacts are in the wrong state, the controller 32 may be programmed to attempt to correct the problem.

A seven bit cyclic hamming code detects errors in the most significant seven bits of a message byte. The byte number bit is excluded because there is no available hamming code which will detect seven bits with three check bits. The exclusion is insignificant since parity detects any odd bit error in any bit position. If a two bit error occurs in any message byte which includes bit zero, the hamming code will detect it because the other seven bits of the byte are checked by the code. If a controller command is retransmitted multiple times and an unexpected status is received from the gate array 60, the controller may be programmed to display the error and may then discontinue transmitting the command thereby assuming that the circuit breaker has failed.

As can be seen in FIG. 5*a*, the keyboard and display panel which is shown in FIG. 4 is preferably implemented as part of a flip-open housing which encloses the controller circuitry of FIG. 4, except for portions of the keyboard and display panel 55. The controller 32 comprises a system display which provides an interface to allow a user to program the system responses according to the programming provided at the input circuitry 69 of the termination board 38.

The system may operate in any of four modes: run, halt, manual or program. The run mode represents the normal operation of the system, including provision of the primary functions of controlling and displaying the status of the circuit breakers. When the system is first powered on or comes up after a power down, it may enter the run mode. In this mode, the controller 32 may drive the system display, scan the control buttons, and look for changes at the plurality of inputs.

The system regularly scans all of the circuit breaker status lines and displays the results on a plurality of LEDs 90. The LEDs 90, which indicate the open or closed status position of the circuit breakers 20 are conveniently arranged to correspond to the arrangement of the circuit breakers 20 as viewed from the front of the load center (as shown in FIG. 1*a*). When the system commands a circuit breaker to switch, the actual status of the circuit breaker will be displayed on a status indicator display 92. The status of all of the remotely controlled circuit breakers appears in the same configuration as the breakers are arranged in the load-center. The breaker statuses may be polled only periodically, rather than constantly, to avoid communications protocol traffic and reduce panel temperatures. Preferably, however, the breaker statuses are polled as fast as possible so as to provide immediate responses.

When the front cover 94 of the front panel 96 is closed, the status indicator 92, the breaker status button 98 and the breaker select button 100 are accessible to the user. While the enter button 102 is accessible to the user only when the front panel 96 is open, these buttons 98 and 100 allow a user to switch a selected circuit breaker and display the breaker status on the status indicator 92 while in the run mode. Instructions (not shown) may be affixed to the exterior of the front cover 94 to instruct the user as to operations for switching circuit breakers during the run mode.

The display will display the number of the last circuit breaker which the user programmed or manually switched. The status display 92 indicates whether that breaker is open, closed or unaffected by the switch. If the breaker statuses are polled only periodically, the breaker status indicator 92 is blank in order to limit the amount of power continuously dissipated in the circuit breaker status read circuitry. If the status LEDs 90 were on continuously, power would be dissipated in the opto-isolator drive circuitry raising the temperature inside the breaker to that which may exceed the opto-isolator specifications.

In order to manually open or close a selected circuit breaker, the user selects the desired circuit breaker by pressing the breaker select button 100 until the number of the desired circuit breaker appears in the breaker display 104. Each time that the breaker select button 100 is pressed, the system automatically scans for the next installed circuit breaker. The position of the circuit breaker that is found is displayed in the breaker display 104. The user continues to press the circuit breaker select button 100 until the number of the selected circuit breaker appears in the breaker display 104. The circuit breaker that is manually switched will remain in the desired state until another manual or automatic signal causes it to switch.

Alternatively, the status indicator display 92 and the breakers status button 98 may be replaced by status indicator lights and a breaker status button located on the front of the load-center dead front 70 next to each circuit breaker 20. When the system is in operation, the indicator light of each breaker is lit when the breaker is on, and is unlit when the breaker is off. When the programmer selects an input by using the input select button 106, the desired circuit breaker is selected by pressing the button next to that breaker.

When the front cover 94 is opened, additional buttons and display become accessible. The system mode is selected using the run mode button 108, the halt mode button 110, the manual mode button 112 or the program/review mode button 114. When the system first enters the run mode from either the halt or manual modes, it scans the terminals at input terminal port 54. Since pulsed inputs are lost in both the half and manual modes only the maintained inputs are available for scanning. As the inputs are scanned, the equations for all of the available circuit breakers are solved, and the breakers are switched accordingly. After this initial scan, the system reverts to normal run mode operation and scans both pulsed and maintained inputs. The system regularly scans the inputs and display buttons while driving the various display devices. There are no other controller actions until an input transition occurs, or a button is pressed.

If an input transition occurs, the microcomputer on the termination board will debounce and interpret the input. The microcomputer on the controller receives the interpretted input from the termination board and then switches the circuit breakers accordingly. Similarly, if a button on the front of the controller is pressed, the microcomputer on the controller will debounce, process, and act on the user input according to the function of the button. As the circuit breakers are switched, their actual status is displayed on the status indicator 92. Additionally, the last input which goes through a transition is displayed on the input display 116.

The system enters the halt mode when the halt mode button 110 is pressed by the user. The halt mode ignores the plurality of input terminals 54 and leaves the system in its present state. Once the halt mode is entered, the system remains there until the user presses another mode button. System status information is not stored while in the halt mode such that if a pulse occurs it will be missed. To exit the halt mode, the user presses any of the other three mode buttons. If the system is halted and either the manual or program/review button is pressed, the selected mode is entered with no further action from the controller 32. If however, the run mode is entered after the halt mode, the system will scan all programmed inputs and set the system circuit breakers 20 according to the values present on the maintained inputs. Pulsed inputs that occurred prior to entering the run mode are not acted upon.

The manual mode is entered by pressing the manual mode button 112. In the manual mode, the system sequentially switches all circuit breaker motors to their on state and then displays the current status on the status indicator 92. This action places the circuit breakers in a mode which emulates standard manual circuit breakers. While in this mode, the circuit breakers can only be controlled by the handles of the individual breakers because all inputs are ignored as in the halt mode. The manual mode differs from the halt mode in that it changes the state of the circuit breakers to their on position. When the system is in the manual mode and either the halt or program/review buttons are pressed, the system immediately enters the new mode without further action by the controller. If the run mode button is pressed, the system scans the maintained inputs and sets the affected breakers accordingly.

The program/review mode is one means by which the system may be programmed. This mode is used to enter, modify or review circuit breaker control programs. The user presses the program/review button 114 to enter the program/review mode. When this mode is entered, the system remains in the run mode from the standpoint of the system's reaction to input transitions. The system continues to process input transitions even if the user is programming the circuit breakers. Unlike the other operating modes, the program/review mode has an auto exit feature. If no button is pressed for a selected time period while the system is in the program/review mode, the system reverts to its previous mode.

Upon entering the program/review mode, the input channel to be programmed is displayed in the input display 116 and the circuit breaker to be programmed is displayed in the breaker display 104. The input display 116 and breaker display 104 are incremented or decremented by using the input select button 106 and breaker select button 100, respectively. As described above, the system automatically scans for the next installed selection as either of these buttons is pressed. If no circuit breakers are installed in the system, the system display is blank in order to prevent a never ending loop. When the + button of the respective buttons 106 or 100 is pressed, the inputs or breakers are scanned in ascending order and the next available input or breaker is displayed. Conversely, if the − button of the buttons 106 or 100 is pressed, the next available input or breaker is displayed after scanning the inputs or breakers in descending order. In program/review mode, the status indicator 92 will display how the circuit breaker on the breaker display 104 will respond to the input on the input display 116 rather than displaying the actual circuit breaker status. The input signal type is displayed on the signal display 118 as maintained or pulsed.

To aid the programmer in configuring the system, a technique is employed to ease understanding of the logical connections. The programmer completes a sentence for each input, wherein the sentence is "When input (number) detects a (pulse or maintained) signal, the breaker (number) (opens, closes or is unaffected)." This sentence is printed on the input and breaker display area of the display panel. The programmer simply enters the input number, signal type, breaker number and desired circuit breaker status and presses the enter button to program the system. No permanent program saving function occurs until the enter button is pressed. If enter is not pressed, the front panel button can be pressed without permanently changing the program. This method is used to review the program content.

An input which overrides all other inputs for a given circuit breaker may be programmed by the user as a pulse input. This input is defined as an override off and is represented on the display panel 55 by an open circuit breaker status light on the status indicator 92 while in program mode. An override off input opens a given circuit breaker regardless of the status of the other inputs. If a selected input is not programmed as an override off, it remains unprogrammed or is programmed as a normal input.

The circuit breakers 20 of FIG. 1*a* are numbered in two columns: circuit breakers in the left column start at one and are odd numbered, and circuit breakers in the right column start at two and are even numbered. The LEDs 90 are preferably arranged and numbered in the display of FIG. 5*a* to correspond physically to the arrangement of the circuit breakers 20 of FIG. 1*a*.

An example may be helpful to explain the convenient manner in which the display of FIG. 5*a* may be programmed and monitored to control the circuit breakers 20 of FIG. 1*a*. In this example, a user is to program a three pole circuit breaker occupying circuit breaker positions numbered 7, 9 and 11 and a single pole breaker in circuit breaker position 16 to be in the same states at the same time. Assume that inputs A, B and C are connected to terminals 1, 2 and 3 (of the eight input terminals of the termination board 38) respectively, and the override off input is connected to terminal 12. Inputs A, B and C will be normally open maintained contacts. An override off will be a pulsed input. The first three terminals have one contact wire connected to its positive terminal, and one wire connected to its common terminal. The DIP switches associated with inputs 1, 2 and 3 are set to the positions corresponding to the maintain mode. The override off input wires are connected to the positive and common terminals and the DIP switch is set to its pulsed position. The motor pole of the three pole breaker is in the center and is in circuit breaker position number 9, and the single pole breaker motor will be in circuit breaker position number 16.

Proceeding from left to right on the front display panel, input 1 is selected by pressing the input select + button until a 01 appears in the input display. Next, the user selects the desired circuit breaker by pressing the breaker select + button until a 09 appears in the breaker display 104. Each time the + button is pressed, the system automatically searches for the next breaker motor. This method eliminates the possibility of a user programming an unused circuit breaker position since empty circuit breaker positions do not appear in the display. When the 09 appears in the breaker display 104, the status appears on the status display and MAINTAIN appears on the signal display signifying that the input is maintained. An appearance of a maintained signal is to cause a circuit breaker to close; therefore, the breaker status button 98 will be pressed until the LED next to "CLOSES" is lit and the CLOSE LED associated with breaker in position 9 in the open/close LED array also lights. While in this programming mode, all LEDs associated with the circuit breakers to be controlled by the displayed input will light as either an open or close.

At this point, the programmer can press any of the buttons without danger of changing any of the programming. If the operator presses the halt mode button, the system will enter the halt mode without changing anything. If the operator fails to press a button for a given controlled time, the system will revert to its previous state automatically. However, if the enter button is pressed, the information on the current display will be permanently stored in memory. The status display will momentarily flash to signify that the breaker is now permanently programmed.

After breaker 9 is programmed using input 1, breaker 16 is programmed by pressing the breaker select button until a 16 appears in the breaker display. When the 16 appears in the breaker display, the current breaker program appears in the status display and MAINTAIN appears signifying that the input is maintained. The breaker select button is pressed until the LED next to "CLOSES" lights. After the enter button is pressed, the input display will display a 01. The breaker display will contain a 16, and the status display close lights will be on in the 9 and 16 positions. Note that while in program/review mode the status indicator display displays the affect that one input has on all of the breakers. After programming all breakers associated with a given input, the next input is selected by pressing the input + button once so that a 02 appears in the input display. The breaker and breaker status are selected as described above. The same procedure is followed for input 3.

Now that the three inputs A, B, and C are programmed, the override off input is programmed to complete the programming operation. The input + button is pressed until a 12 appears in the input display and the pulse light appears on the signal display to signify that the input is a pulse. The breaker number is then selected as described above. Programming proceeds as described above except that status open is selected instead of status closed. When the enter button is pressed, the status indicator display shows a closed light under circuit breakers at positions 9 and 16 to signify that the input and breakers are programmed. Note that the override off input will override any of the other inputs regardless of their states to open the circuit breakers at positions 9 and 16.

Figure 5B:
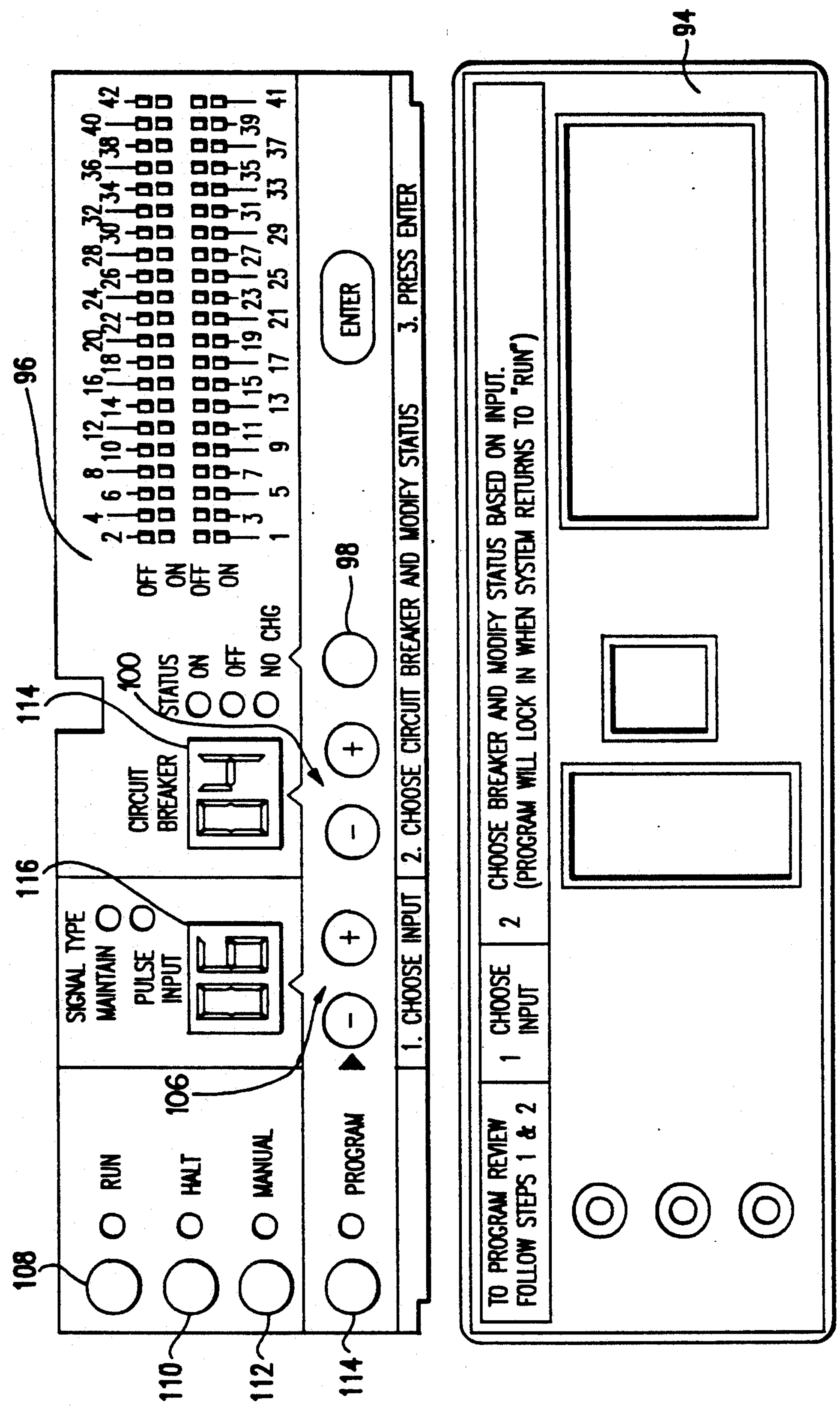
FIG. 5*b* is a perspective view of an alternate display for the controller shown in FIGS. 1–4.

An alternative display embodiment of the present invention is illustrated in FIG. 5*b*. In this embodiment, a three-step programming configuration is used in place of the sentence-programming configuration discussed above in connection with the embodiment of FIG. 5*a*. In terms of function, this display embodiment is the same as the display shown FIG. 5*a*; thus, the reference numerals depicting the various components in FIG. 5*a* are used to depict the corresponding components in FIG. 5*b*.

The primary difference between the respective embodiments of FIGS. 5*a* and 5*b* is that the enter or "LOCK-IN" button of FIG. 5*a* is replaced by the "enter" buttom in FIG. 5*b*. Rather, the display of FIG. 5*b* locks in the programmed inputs when the system returns to the RUN mode via button 108.

As a controller circuit option, unauthorized access to the programming function of the controller 32 may be prevented using a key card mechanism 103 (FIG. 5*a*) to lock out the programming function. The key card 103 comprises a small durable card having a pattern of holes wherein the card is designed to be placed into a card slot 105 in the front of the controller 32. An LED/-photo detector combination located within the controller 32 detects the presence of the key and determines the particular function from the key card pattern. The key card allows access to particular modes of operation thereby providing security for the system. An exemplary key card mechanism is described in U.S. Pat. No. 4,489,359, incorporated herein by reference.

Figure 6:
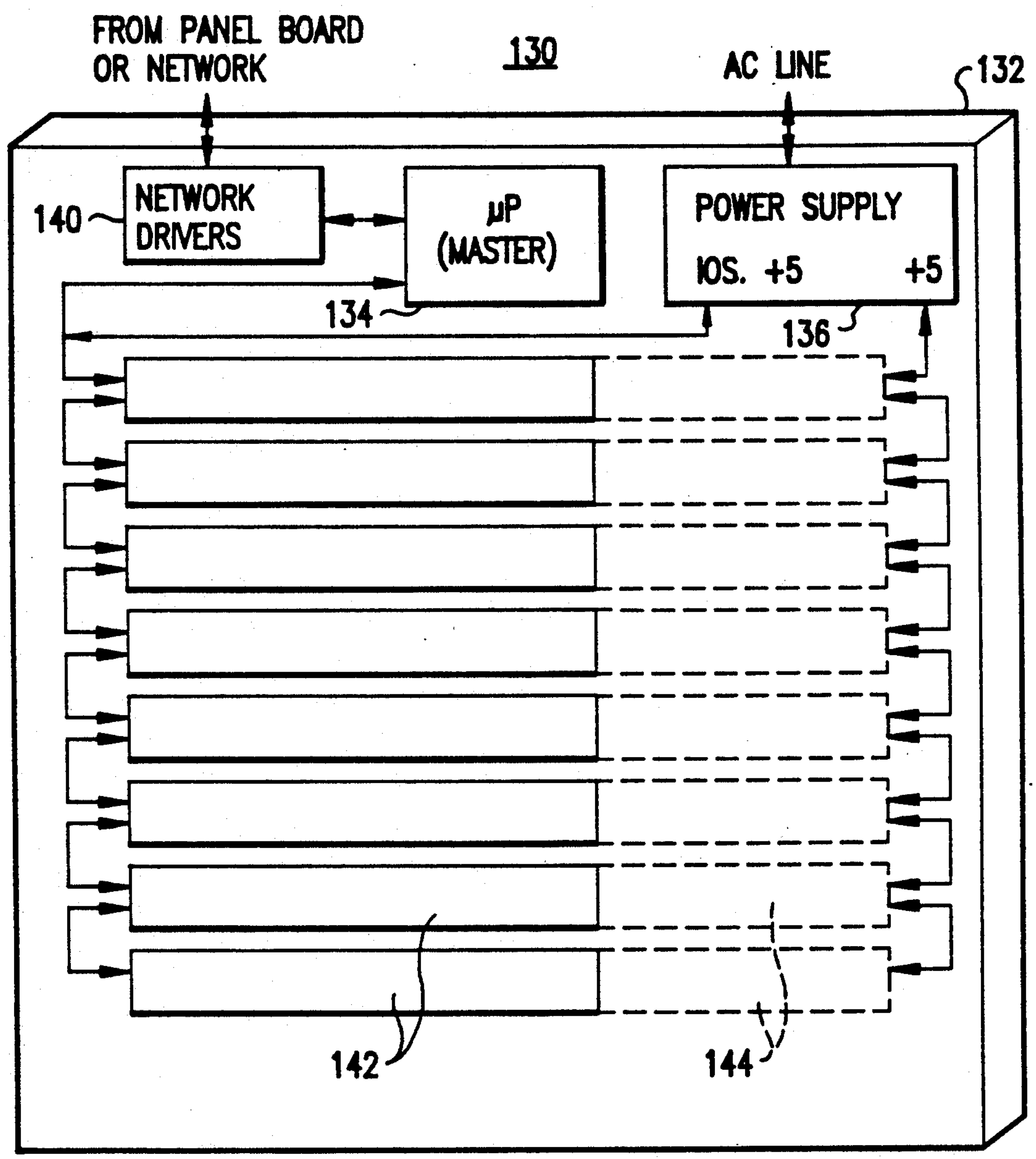
FIG. 6 is a block diagram of an expansion module, according to the present invention, which may be used to interconnect a various types of accessories into the system of FIG. 1*a;*

FIG. 6 illustrates an expander panel 130 which may be optionally coupled to one or more load centers, such as the load center 10 shown in FIG. 1*a*, to provide a number of communication-related features to the load center shown in FIG. 1*a*. The expander panel 130 is enclosed in a housing 132 and may include a microcomputer 134 for controlling communication with the load centers. A power supply 136, fed by a conventional AC line, may be used to provide power to the circuits contained within the housing 132, and a network driver circuit 140 may be used to interface the microcomputer 134 with a communication network or protocol required for communication with the load centers.

By employing one or more terminal ports 142 within the housing 132, external devices may be electrically coupled to the microcomputer 134 for additional kinds of remote control and monitoring of the circuit breakers, their associated current paths and other equipment associated with the controller. Ideally, the microcomputer 134 communicates through the network driver circuit 140 of FIG. 6 to the controller 32, via the network drivers 68 of the termination board 38 (FIG. 4). LAN or other types of conventional communication protocols may be used to implement this kind of interface, as previously discussed.

The expander panel 130 may also include one or more option cards (or circuits) 144 for providing customized functions. In a preferred embodiment, one of the option cards 144 is a telephone interface circuit, which is designed using conventional techniques to provide access to the controller 32 (FIG. 4) through standard telephone lines. Other option cards 144 may include, for example, an input expander card for allowing additional devices to be coupled into the system, an isolated RS232 computer interface, data logging memory with battery back-up, data logging printer interfaces, telephone network access card, telephone modem cards, wireless (FM) communication links and fiber optic repeater cards. The functions described in the expander panel may be built and installed as separate functional elements.

The expander panel, which has plug-in modularity, may be used to provide a number of network-communication type features. Although multiple load center (such as 10 of FIG. 1*a*) may be networked without the expander panel, FIG. 7 exemplifies an application in which a plurality of load centers may be connected in a LAN by networking the loadcenters 10 with one of the expander panels 130 of FIG. 6. This kind of arrangement can provide significant maintenance-related savings when used in an industrial-type application.

Figure 8:
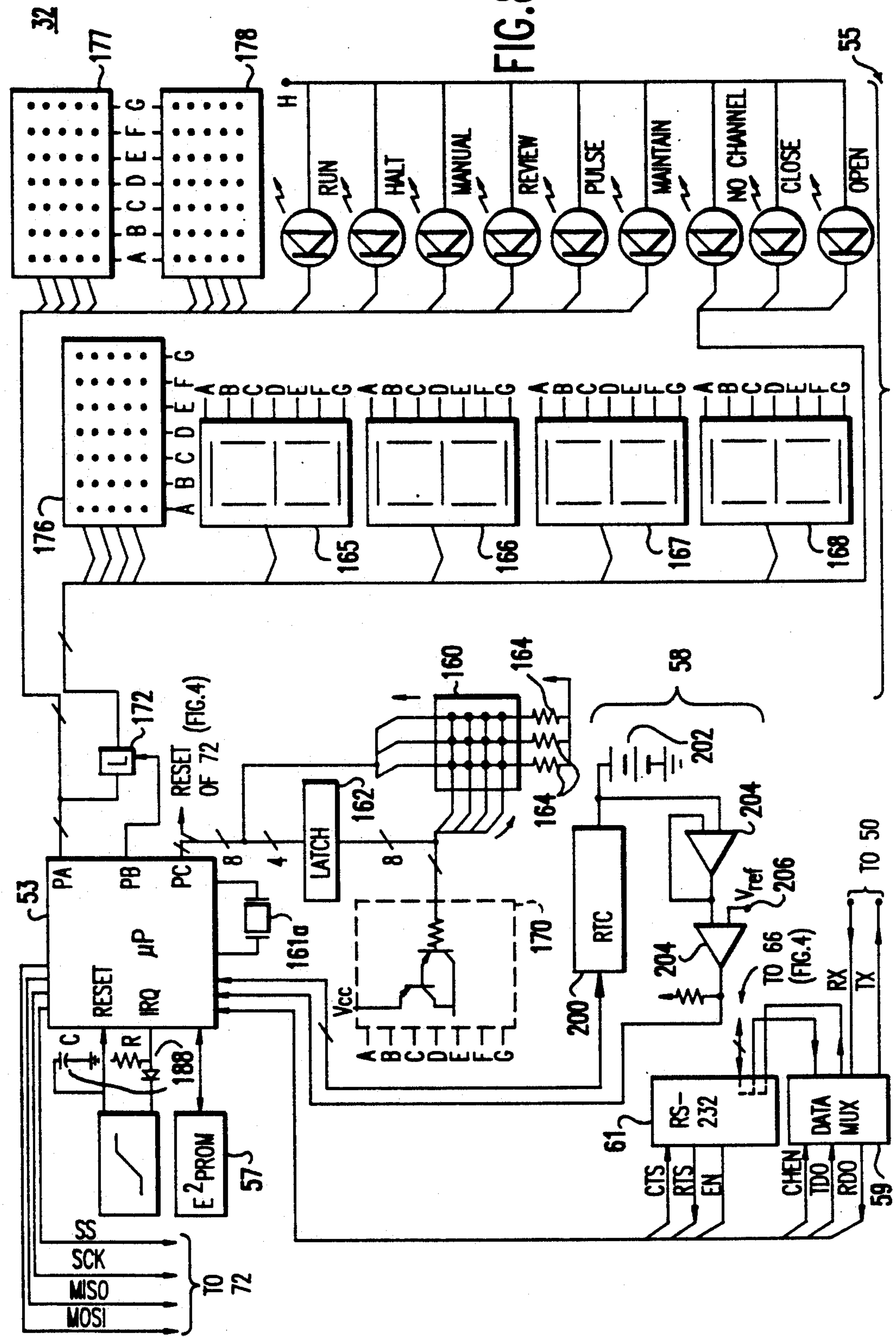
FIG. 8 is a schematic diagram of the controller shown in FIGS. 1–4.

Turning now to the schematic diagram of FIG. 8, the controller 32 (from FIG. 4) is shown with the keyboard and display 55 (FIG. 4), the real-time clock circuitry 58, the data multiplexer 59 and the RS-232 interface circuitry in detail. The keyboard and display 55 includes a 10-key membrane keypad 160 which is regularly scanned using a four-by-three switch matrix. To determine which, if any, of the membrane keys have been depressed, the microcomputer 53 latches logic "0"s from each of four bits from the microcomputer's C port into a latch 162, and it polls three bits from the same port to determine if any of the three bits are shorted to one of the latched four bits by the depression of the associated membrane switch. Pull-up resistors 164 bias the three polled bits so that a logic "1" is read at each polled bit if the associated four switches are not depressed.

The latch 162 and the microcomputer's C port are used in combination with the microcomputer's A port to control all of displays on the controller 32, including four 7-segment LED package displays 165-168. As discussed in connection with the breaker display 104 and input display 116 of FIG. 5*a*, the displays 165-168 are used to identify for the user or operator the particular input (at the termination block 38) and circuit breakers being addressed by the keypad. A network of eight Darlington transistors 170 is coupled to the output of the latch 162 to provide the proper drive level for display matrix for which the outputs (A-H) of the transistors 70 drive the row side of the matrix. The column side of the display matrix is driven by 8 bits which are provided directly from the A port of the microcomputer 53 and 8 bits which are provided indirectly from the A port, via latch 172, to enable each LED of the displays. Because the display does not require being display-refreshed more than 40 times per second, the microcomputer 53 is able to use its C port to monitor the keypad 160 and control the displays 165-168 without conflict.

The microcomputer 53 employs the latch 172 at the output of its A port to control stand-alone NO CHANGE, CLOSE and OPEN LEDs and four columns of a 7-by-5 dot matrix display 176. The A port of the microcomputer 53 directly controls stand-alone RUN, HALT, MANUAL, REVIEW, PULSE AND MAINTAIN LEDs and four columns each of 7-by-5 dot matrix displays 177 and 178. The displays 176-178 are used to indicate the contact positions of the 42 circuit breakers represented by the status indicator display 92 of FIG. 5*a*. The three displays 176-178 are configured so that only four columns of each are used; thereby providing 28 LEDs on each part so that the 84 required displays (two per circuit breaker) are accommodated.

A variety of staple components may be used to implement the circuit illustrated in FIG. 8. For example, the latch 162 may be implemented using a 3-8 74HC137 encoder-type IC, while the latch 172 may be implemented using a 74HC373-type IC. The displays 165-168 may be implemented using a HDSP7503-type part, and the displays 176-178 may be implemented using a HDSP4701-type part. The RUN LED is preferably implemented using a green HLMP-1790 part, and all other stand-alone LEDs are preferably implemented using a red HLMP-1700 part. Each LED type is available from Hewlett Packard Co.

Conventionally, displays are controlled by sequentially turning on one digit or display group at a time, but repetitiously and sufficiently rapid so that all devices appear to be on simultaneously. The requisite driving current (or power) for such conventional displays is proportional to the number of segments that are turned on in each display device. Accordingly, as each display is sequentially switched, the amount of current drawn from the power supply can vary significantly. For example, no current flows if all segments are off, while the maximum current flows if all segments are on. The power supply in such conventional displays must, therefore, be able to supply the peak value of the current, even if the average value is much less.

The display design of the present invention provides a significant improvement over this deficiency of the prior art. The display on the controller 32 is preferably designed and controlled to provide a significant reduction of peak power usage. This design multiplexes the display elements by grouping segments together from different displays, rather than treating each display as a group. If the variation from minimum to maximum is kept as small as possible, the peak value of current is reduced, allowing a smaller and lower cost power supply to be used.

In accordance with the display design described above, attached hereto is an Appendix A which illustrates a table for controlling the LEDs of the display. The table includes 128 status entries defined by 16 rows and 8 columns. The entries are grouped to multiplex the display elements by grouping LED segments together from different displays to lessen power usage as described above. Preferably, two pairs of rows at a time are read by the microcomputer and written out the parallel buses to update the status of each corresponding LED. For example, the first row includes: two bits to designate the proper status of circuit breaker 16—one bit is for its OPEN LED and the second bit is for its CLOSED LED; two bits to designate the proper status of circuit breaker 15—one bit is for its OPEN LED and the second bit is for its CLOSED LED: etc. The OPEN and CLOSED LEDs are either both off or one of them is on; therefore, only three of the four states provided by each pair of circuit breaker status entries are used.

The second row of the table includes: a bit to designate the proper status of segment A of the 7-segment display 4 (D4Sa) (display 4, e.g., corresponds to display 168 of FIG. 8); a bit to designate the proper status of segment A of display 3 (D3Sa); . . . ; two bits to designate the proper status of circuit breaker 30—one bit is for its OPEN LED and the second bit is for its CLOSED LED; etc. The bottom two rows of the table include the proper status of the labeled LEDs on the display, such as Maintain, Pulse, Review, etc. Since all segments in these groups will never by on, arranging the devices in this manner results in a lower peak current for the worst-case condition.

Also within the Appendix A and below the table is a program written in MC68HC05 assembly language code which may be used as a basis for controlling the display using the table of Appendix A in the above described manner, and with the microcomputer updating the LEDs at about 40 Hertz.

Certain ones of the C port peripheral bits may be used to program and read the EEPROM 57, which may be implemented using an X24C16 type IC, and to reset the microcomputer 72 of the termination board when necessary. Also, a reset IC 174, such as an MC34164 IC, along with conventional RC timing circuitry may be used to reset and interrupt the microcomputer 53 upon power-up and when power decays during power down or due to other low voltage occurrences.

The real-time clock circuitry 58 is optional to the remaining circuitry of the controller 32 and may be used to provide time-based circuit breaker control functions. For example, the microcomputer 53 and the real-time clock circuitry 58 may be programmed by the programmer station 66 (FIG. 4) so that the real-time clock is polled by, or interrupts, the microcomputer at one or more prescribed periods to inform the microcomputer 53 that it is time to open or close a current path associated with a certain circuit breaker. In response to this type of prompt, the microcomputer 53 commands the designated circuit breaker to open or close its associated current path, provided that a command of a higher priority for the same circuit breaker was not received by the microcomputer 53 before the prompt occurred.

Commands of various priorities which may be received by the microcomputer 53 for the same circuit breaker, in addition to the aforementioned programmed prompt from the real-time clock, include a variety of commands sent through the termination board 38 (FIG. 4), commands received from the programmer station 66 (FIG. 4) and commands received from the keyboard and display 55 (FIG. 4). It is preferred that the order of priority for conflicting commands is that: commands received from the keyboard and display 55 are treated as the most important due to servicing requirements; commands received from the programmer station 66 are treated as the second most important since servicing may also be performed from the programmer station 66; commands sent through the termination board 38 are treated as the next most important; and commands prompted by the real-time clock are treated as the least important since they are likely to be representative of a previously desired mode and, therefore, requiring an override via one of the higher priority command paths.

The real-time clock circuitry 58 is preferably implemented using a 3.0 Volt Lithium battery 202 to backup an MC68HC68T1-type real-time clock IC (integrated circuit) 200. A pair of LM393A-type amplifiers 204 may be used to monitor the battery 202 by comparing the voltage level of the battery 202 to a stable reference voltage level (Vref), e.g., about 2.3 Volts, at lead 206. For additional information concerning the implementation of the real-time clock circuitry 58, reference may be made to the data sheets and application notes for the MC68HC68T1 IC, available from Motorola, Inc.

The data multiplexer 59 is used by the microcomputer 53 to route data to and from both the programmer station 66 and the gate array 60 of the interface driver board 34. Data is passed to and from the programmer station 66 using a conventional RS-232 interface circuit 61, e.g., using a LT1180-type IC, while the data passed to and from the gate array 60 is processed using an asynchronous, serial-data protocol. As depicted in FIG. 8, data is passed to and from the microcomputer 53 via its RDO and TDO ports through the data multiplexer 59, which is preferably implemented using a 74HC4052-type IC. A peripheral bit on the microcomputer 53, depicted as CHEN, is used to select (or "enable") one of two channels through the data multiplexer 59. The first channel couples the TDO and RDO ports of the microcomputer 53 with comparable ports of the gate array 60 of the termination board 38, and the second channel couples the TDO and RDO ports with the transmit and receive ports of the RS-232 interface circuit 61. Another peripheral bit on the microcomputer 53, depicted as EN, is used to enable the RS-232 interface circuit 61 so that its CTS and RTS signals are inactive when the RS-232 interface circuit 61 is not being used.

The microcomputer 53 communicates with the microcomputer 72, with the former acting as the master and the latter acting as the slave and with each microcomputer 53 and 72 employing a conventional crystal oscillator circuit 161*a* or 161*b* which drives the respective microcomputer at 3.6864 Mega-Hertz. Three of the bits from the D port of the microcomputer 53 may be respectively employed as the data transmit, data receive and synchronous clock paths for communication with the microcomputer 72 of the termination board. For example, using the MC68HC05-type microcomputers to implement the microcomputers 53 and 72, the MISO (master-in-slave-out), MOSI (master-out-slave-in), SCK (synchronous clock) and SS (slave select) microcomputer pin-outs (FIGS. 8 and 11*a*) provide an adequate interface. The protocol preferably includes error detection and error correction schemes to prevent erroneous messages from causing the interface driver board 34 to execute an incorrect command. For example, if an erroneous message is received by the interface driver board 34, the protocol detects the error and corrects it in a subsequent message from the controller.

Figure 9A:
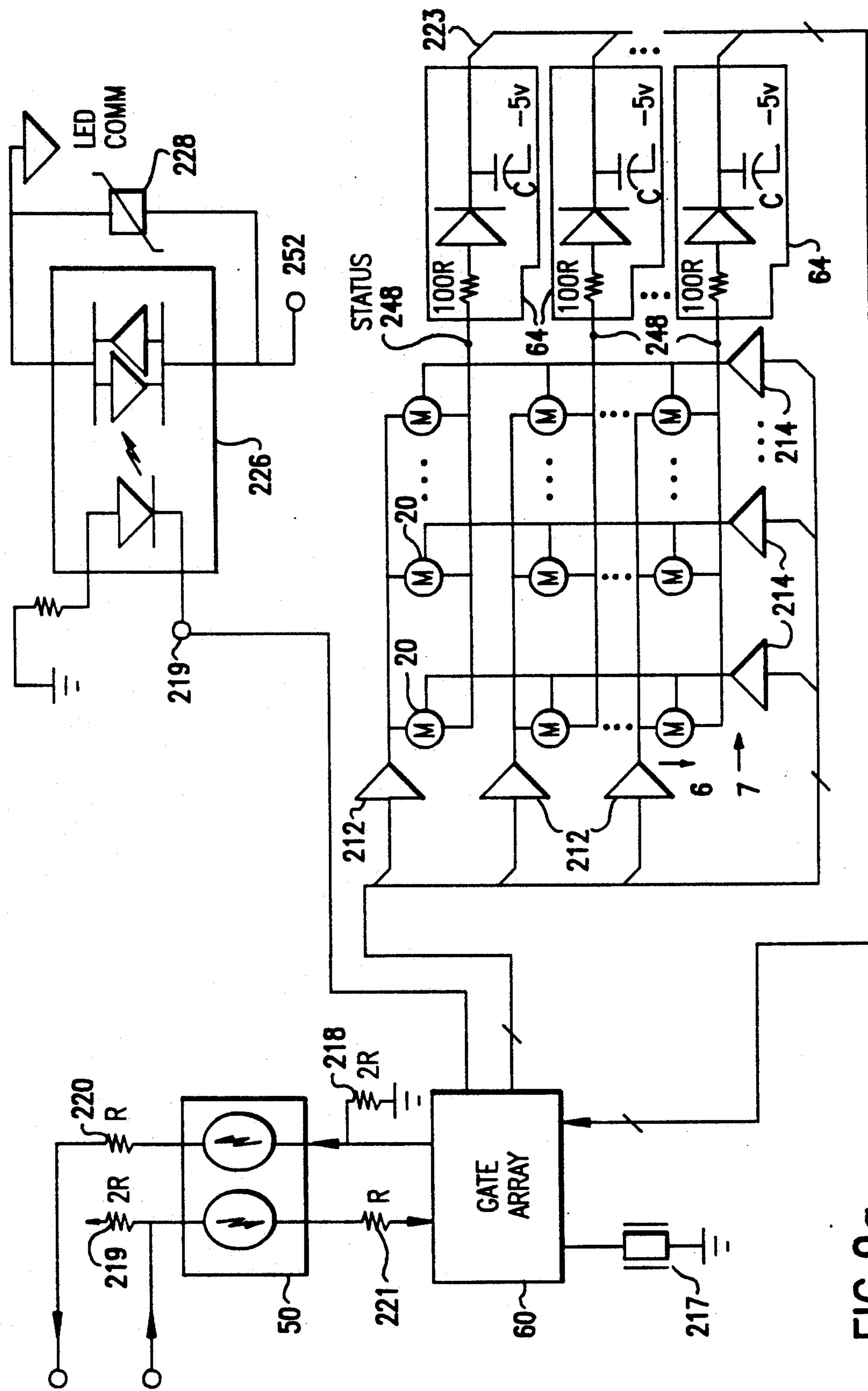
FIGS. 9*a*–9*c* comprise a schematic diagram of the interface driver board shown in FIG. 4.
Figure 9B:
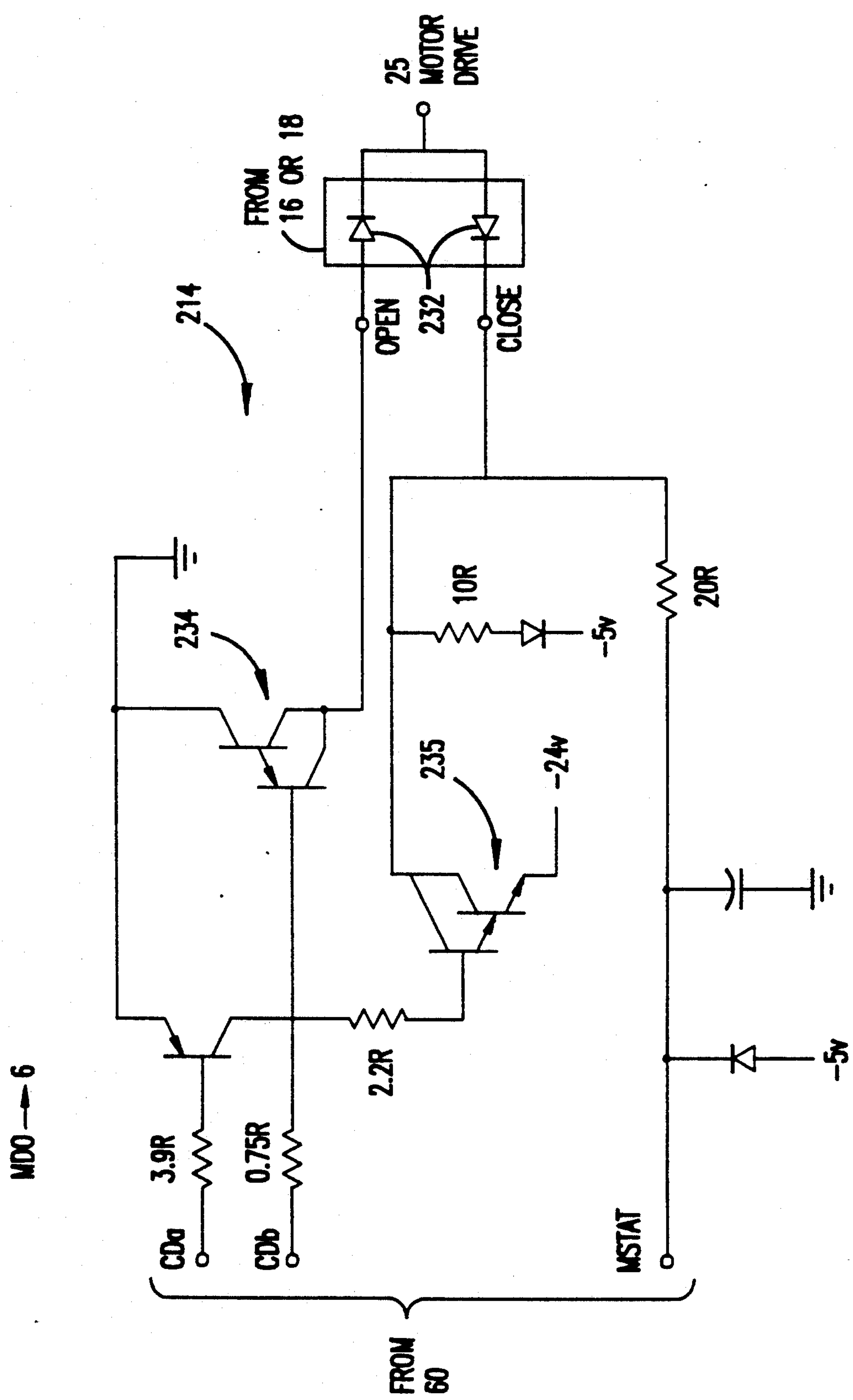
Figure 9C:
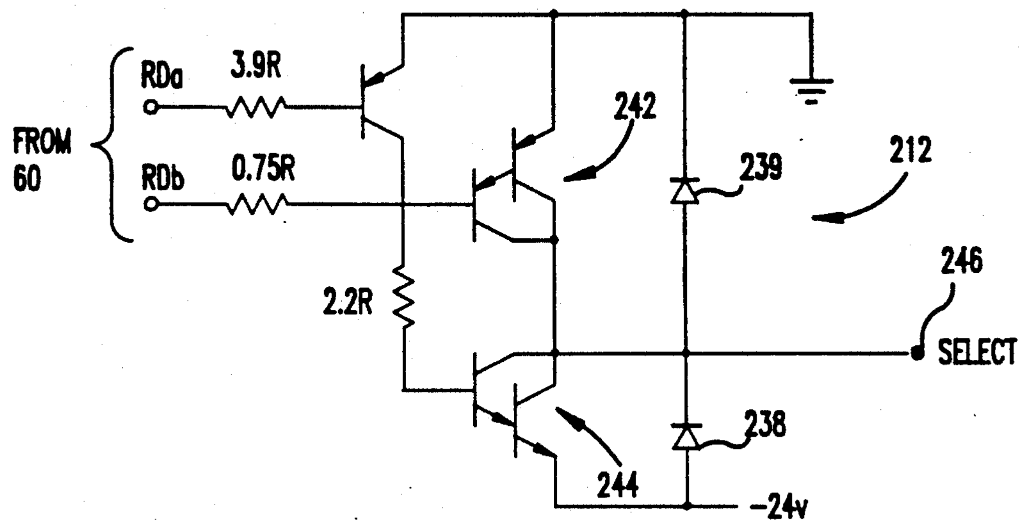

FIGS. 9*a*–9*c* illustrate the interface driver board 34 of FIG. 4 schematically. The optical isolator 50, the gate array 60 and the status filters 64 are depicted as in FIG. 4. However, the representative amplifiers 62 from FIG. 4 are shown as circuit breaker row drivers 212 and circuit breaker column drivers 214. The other elements shown will be introduced and discussed in turn.

The interface driver board also includes a conventional oscillation circuit 217 which is used to provide the appropriate clock (e.g., a 455 kHz clock) for the gate array. For further information regarding the gate array 60, reference may be made to the data sheets published and made available by ACTEL, Inc. of Sunnyvale, Calif.

The optical isolator 50 is preferably implemented using two NEC2501-1 type parts with resistors 218–221 (R=1 k Ohm in FIGS. 9*a*–9*d*) providing the appropriate bias at the inputs and outputs of the optical isolator 50.

The circuit breaker row and column drivers 212 and 214 are configured seven down and six across, respectively, for controlling the motors of the forty-two circuit breakers 20 of FIG. 1*a*. Each row driver 212 is used to select (or enable) the circuits of six circuit breakers, while each column driver 214 is used to actuate the circuit breaker motor which is selected by the intersecting row driver 212.

Each status filter 64, which is used to report whether the contacts of the circuit breaker are open or closed, are operative when two conditions are present: the corresponding column driver 214 must select the column of circuit breakers in which the status filter 64 is associated; and the gate array 60 must actuate a triac circuit (e.g., a Siemens IL420) to provide, simultaneously, a momentary common path (LED COMM on the bus boards 16 and 18) for the input ports of the optical isolators 230 (FIG. 9*d*) of all forty-two of the circuit breakers 20. The gate array 60 then reads all six statuses and determines which of these statuses are to be sent to the controller 32. The circuit breaker contacts are preferably monitored using a lead 231 (FIG. 9*d*) connected to the load terminal of the circuit breaker 20.

A varistor 228, such as a GE-V30DLA2, is coupled across the output ports of the triac circuit 226 to provide circuit protection against voltage and current transients.

In FIG. 9*b*, the column driver 214 is shown as being controlled by the gate array 60 using CDa, CDb and MSTAT leads so as to drive the motor on the selected circuit breaker 20. The diodes 232 through which the motor drive signal passes are located on the bus board 16 or 18 to allow a current path through only one circuit breaker 20. The CDa and CDb signals from the gate array 60 are controlled in a polarized manner between −5 Volts and common so that if either signal is absent, the designated circuit breaker 20 cannot be commanded to open or close its contacts.

The MSTAT signal is used to indicate whether or not a motor is present. This type of status check operates in substantially the same manner as the statuses from the associated circuit breaker load, as described above. The MSTAT signal is operative when the corresponding column driver 214 selects the column of circuit breakers associated with the circuit breaker under test. The gate array 60 then reads all six MSTAT signals and determines which of these signals are to be sent to the controller 32.

In FIG. 9*c*, the row driver 212 is shown as being controlled by the gate array 60 using RDa and RDb leads so as to select the appropriate row of circuit breakers 20. The diodes 238 and 239 are used to mitigate the effect of transient signals received from the bus boards 16 and 18.

Figure 9D:
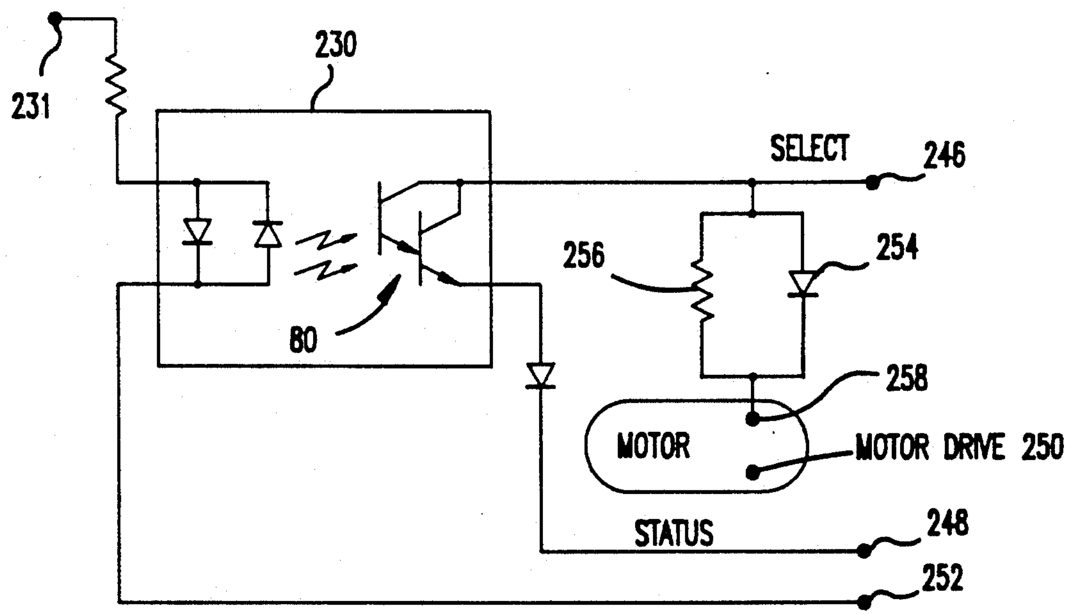
FIGS. 9*d* is a schematic diagram of the electrical portion of a circuit breaker illustrated in FIG. 1*a;*

FIG. 9*d*, which illustrates the electrical control portion of the preferred remote control circuit breaker 20, depicts four leads carried by each plug-in connector 22 of the bus boards 16 and 18. They include: the select lead 246, status lead 248, motor drive lead 250 and an isolator enable lead 252; the signals of each lead performing the previously described functions.

A parallel resistor/diode arrangement 254/256 serves two functions. The diode 254 may be used to provide current flow in a unilateral direction, while the resistor 256 is used to control the power provided from lead 258 to the motor of the circuit breaker 20. The value of the resistor 256 is selected according to the necessary current specified to operate the motor. In the event that the lead 258 is used to control a plurality of poles, e.g., for controlling two or three circuit breaker poles, the resistance required will vary. For single pole operation by the FK130S-10300 Mabuchi motor exemplified in the above referenced copending application, the value of the resistor 256 is preferably 12 Ohms.

Figure 9E:
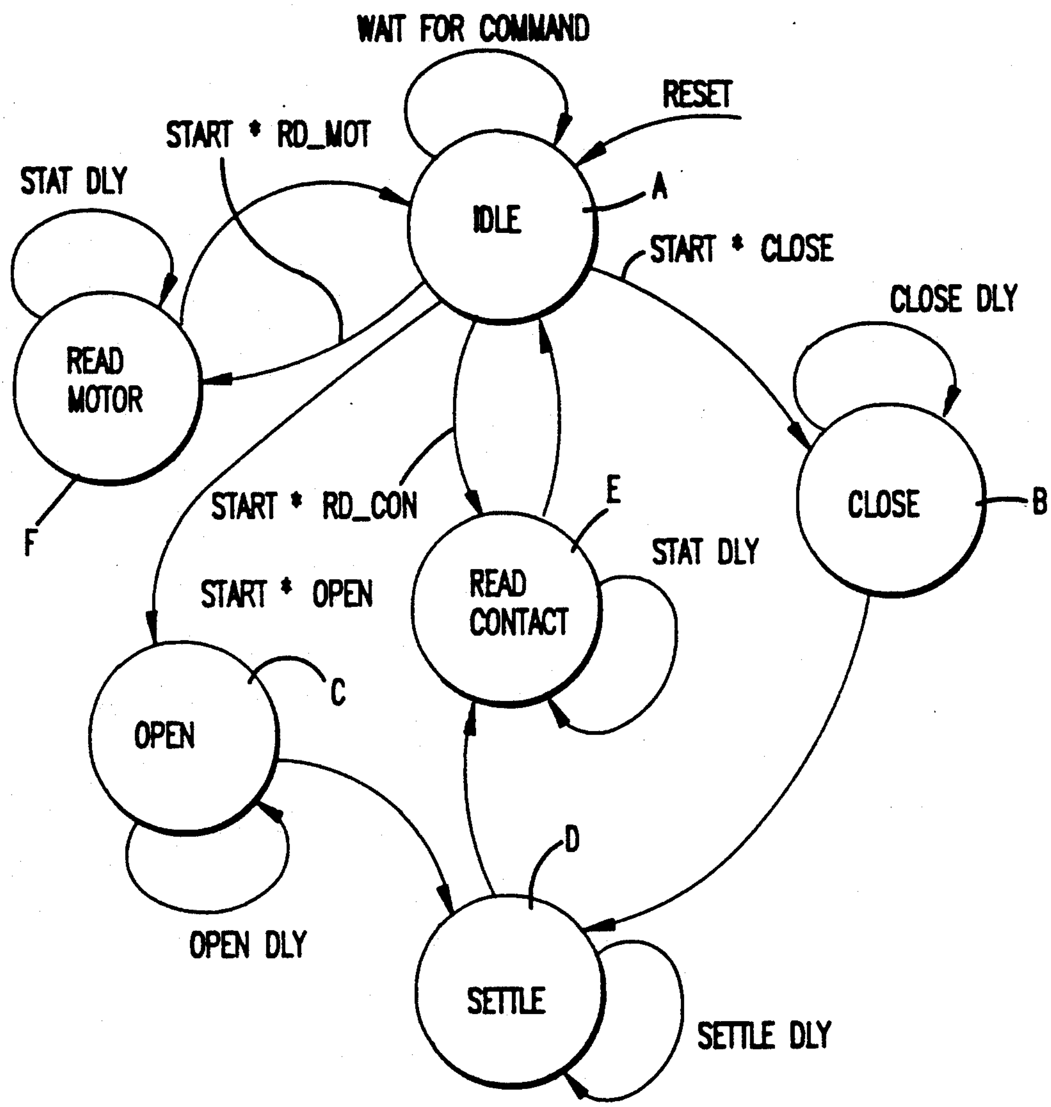
FIGS. 9*e*–9*g* Comprise three state diagrams which depict the power driver, data transmit and data receive operation of the gate array illustrated in FIG. 9*a;*

FIG. 9*e* is a state diagram which depicts the power driver operation of the gate array illustrated in FIG. 9*a*. The diagram includes six states, depicted A-F. Beginning at state A, the gate array waits for a command from the controller. The command may be one of four commands: a close contacts command which instructs a particular circuit breaker to close its contacts, depicted by the sequence of states A-B-D-E-A; an open contacts command which instructs a particular circuit breaker to open its contacts, depicted by the sequence of states A-C-D-E-A; a read contacts command to determine if a particular circuit breaker's contacts are closed or open, depicted by the sequence of states A-E-A; and a read motor command to determine if the motor is present, depicted by the sequence of states A-F-A. The state delay associated with state D is to allow the contacts sufficient time to settle before reading the status of the contacts at state E. The state delays associated with states B and C are to allow the contacts sufficient time to react before commencing the settling-time delay of state D. The state delays associated with states E and F are to provide the gate array with the appropriate timing response before reporting to the controller with the requested status.

Figure 9F:
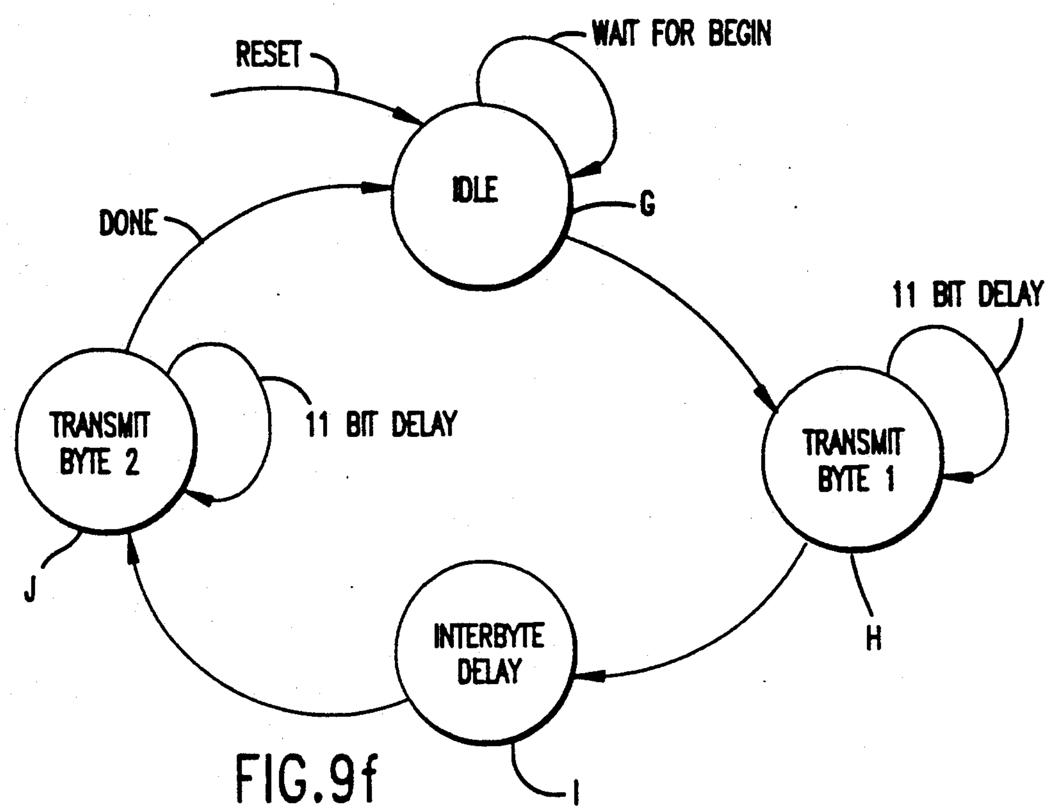

FIG. 9*f* depicts the message transmit operation of the gate array illustrated in FIG. 9*a* in state diagram form. The diagram includes four states, depicted G-J. Beginning at state G, the gate array waits for flow from states E and F for transmitting a contact status or motor status response. Once received, flow proceeds to block H where the first of the two bytes is transmitted. Since each byte consists of a start bit, 8 data bits, a stop bit and a parity bit, an 11 bit delay is illustrated. From state H, flow proceeds to state I where the gate array waits for prescribed interbyte delay before moving to state J. At state J, the second of the two bytes is transmitted, and, after the 11 bit delay, the transmission is complete.

Figure 9G:
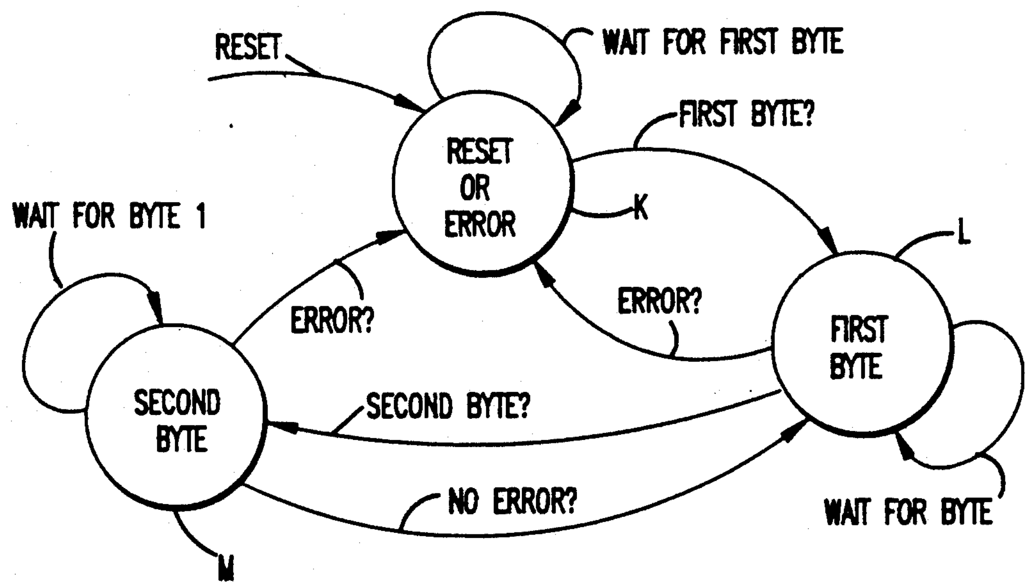

FIG. 9*g* depicts the message receive operation of the gate array illustrated in FIG. 9*a* in state diagram form. The diagram includes states K, L and M. Beginning at state K, the gate array is reset and flow proceeds to state L to wait for reception of the first byte of the two-byte message from the controller. If the first byte is received with an error, flow returns to state K for corrective action (e.g., a reset and a communication to the controller that an error occurred). Once the first byte is received, flow proceeds to state M where the gate array waits for the second of the two bytes. Once the second byte is received, the gate array determines whether or not the second byte was received with an error. If the second byte is received with an error, flow returns to state K once again for corrective action. Otherwise, the reception of the second byte completes the reception mode for a two-byte message and flow returns to state L.

The gate array 60 is preferably implemented using an ACTEL A1020APL84I-type gate array which is fused according to the information attached hereto in Appendix B, which includes parts I–IV. Part I is the fuse file, which constitutes the main input to the ACTEL fusing program for the subject part. To save space, the file is presented with seven parallel columns of fusing data, which is read top to bottom / left to right. To actually use the file, the seven columns of data on each page must be converted to a single column on the far left of the page. Part II is a definition file which is also required to program the subject ACTEL device. Part III is a gate array pin list which is also presented to the ACTEL fusing program so that the program can determine which pins correspond to which device circuits. The parenthetical comments to the right of the PIN numbers may be used to correlate the listed PIN numbers to the schematics of FIGS. 9*a*, 9*b* and 9*c*.

Part IV consists of four sheets of commands sent from the controller and proper responses from the gate array. The first sheet includes 42 commands which may be used to instruct each of the 42 circuit breakers to report as to whether or not a motor (or circuit breaker) is present in the load center. The second sheet includes 42 commands which may be used to instruct each of the 42 circuit breakers to report as to whether the associated circuit breaker contacts are open or closed. The third sheet includes 42 commands which may be used to instruct each of the 42 circuit breakers to open the associated contacts; the response by the gate array is one which indicates whether the contacts are open or closed after the controller command is executed. The fourth sheet includes 42 commands which may be used to instruct each of the 42 circuit breakers to close the associated contacts; the response is similar to that for the open command in that the gate array indicates whether the contacts are open or closed after the controller command is executed.

FIGS. 9*h*–9*k* comprise a series of timing diagrams which respectively depict the receive message, open contacts, read status and read motor timing operations of the gate array. There are fourteen signals shown in the figures: RCV is the receive signal (and gate array pin) which is used by the gate array to receive a two byte message from the controller; ENABLE SAMPLE is an internal signal to the gate array which tracks the timing for receive data sent between the controller and the gate array; XMIT is the send signal (and gate array pin) which is used by the gate array to transmit a two byte message to the controller; DRVTRIAC corresponds to the isolator enable lead 252 and is an active low signal (and gate array pin) which is used to drive the triac circuit 226 when the gate array is preparing for a status read; DRVCOND corresponds to the signal 219 of FIG. 9A and is driven low when the status is not actually being read—when this signal is low, the status filters drive the inputs to the gate array; PSEL#-DRV and NSEL#-DRV are active low signals which are respectively used to drive the select or row drivers 212 during status/motor read and open command execution (where #designates one of the six rows); PMOT#-DRV and NMOT#-DRV are active low signals which are respectively used to drive the PNP and NPN motor or column drivers 214 during open command execution and close command execution (where # designates one of the seven columns); PS[] represents the combination of all PNP select or row power transistor drivers 212; NS[]represents the combination of all NPN select or row power transistor drivers 212; PM[] represents the combination of all PNP motor or column power transistor drivers 214; and NM[]represents the combination of all NPN motor or column power transistor drivers 214. The PS[], NS[], PM[] AND NM[] are denoted in hexidecimal form in each of the diagrams.

Figure 9H:
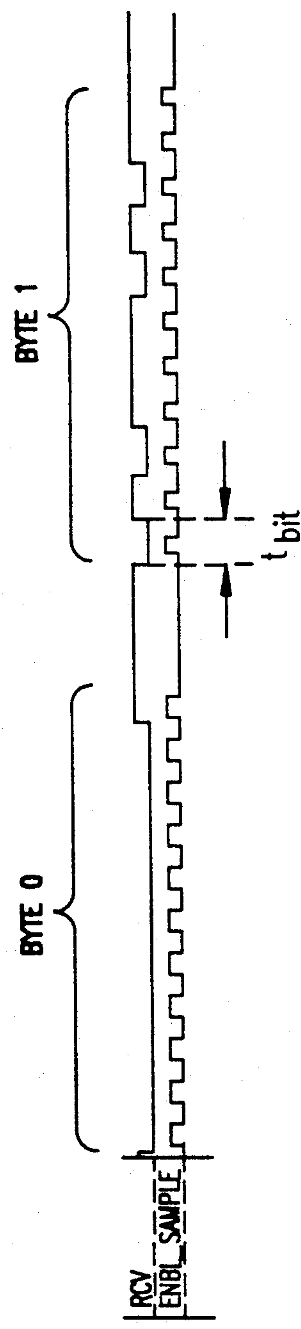
FIGS. 9*h*–9*k* comprise a series of timing diagrams which respectively depict the receive message, open contacts, read status and read motor operations of the gate array illustrated in FIG. 9*a;*

FIG. 9*h* illustrates byte 0 and byte 1 being received by the gate array from left to right, with the least significant bit being on the left and the most significant bit being on the right. The enable sample signal being high indicates when the gate array latches in a bit from the receive signal. The bit definitions for each byte are the same. Each includes an active low start bit, a byte number bit (0 for byte 0 and 1 for byte 1), four data bits for the message, three check bits for detecting communication errors, a parity bit and an active high stop bit. The notation $t_{bit}$ represents 1/1200 second bit width for a 1200 baud rate transmission.

Figure 9I:
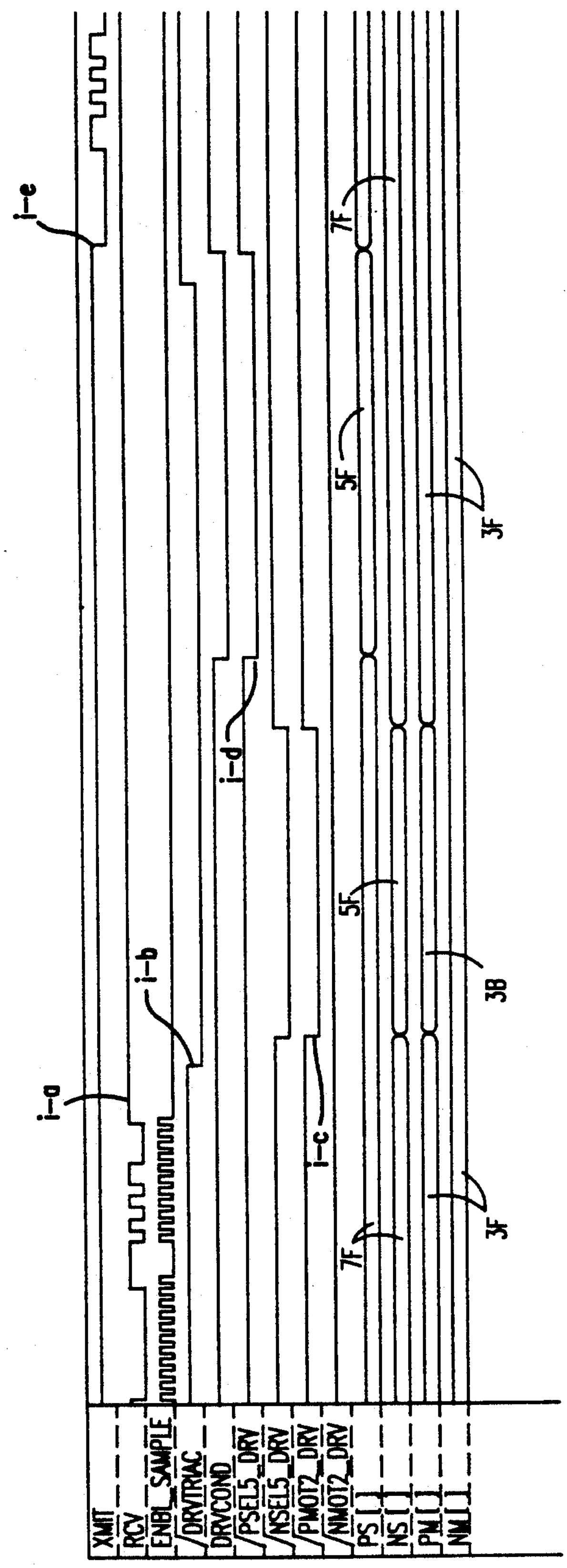

FIG. 9*i* illustrates the gate array timing when an open contacts command is being received and executed. At point i-a of the diagram, the two byte message or command is received by the gate array. At point i-b, the triac is enabled, and at point i-c the particular column and row drivers for the designated circuit breaker are enabled to open the circuit breaker contacts. The hexidecimal representation of NS[] and PM[] (5F and 3B) reflect one bit of the row drivers and one bit of the column drivers being low so as to select the correct circuit breaker from the circuit breaker array. At point i-d, the gate array prepares to read the status of the circuit breaker contacts, and at point i-e the gate array begins reporting the status of the circuit breaker contacts to the controller.

FIG. 9*j* illustrates the gate array timing when a read status command is being received and executed. At point j-a of the diagram, the two byte message or command is received by the gate array. At point j-b, the triac is enabled, and at point j-c the particular column driver for the designated circuit breaker is enabled to allow the CSTAT signal to read the selected filter. At point j-d, the gate array begins reading the status of the circuit breaker contacts, and at point j-e the gate array begins reporting the status of the circuit breaker contacts to the controller.

Figure 9:
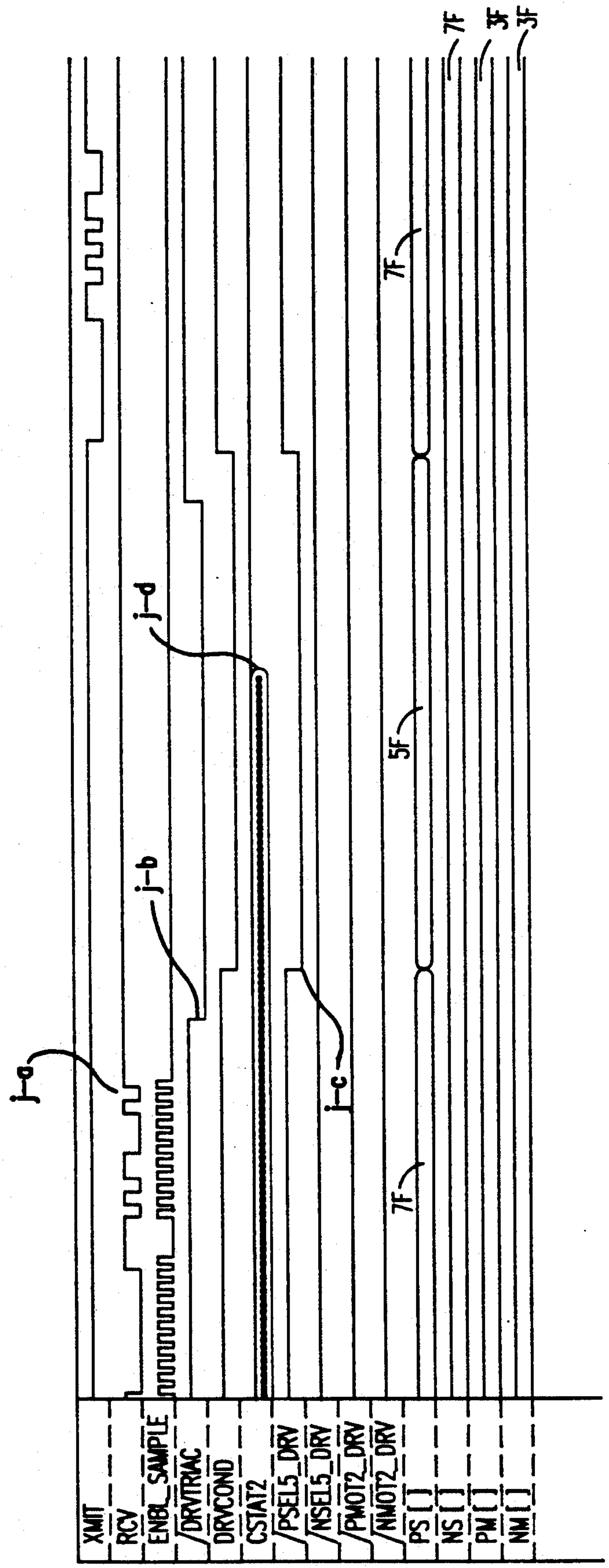
Figure 9K:
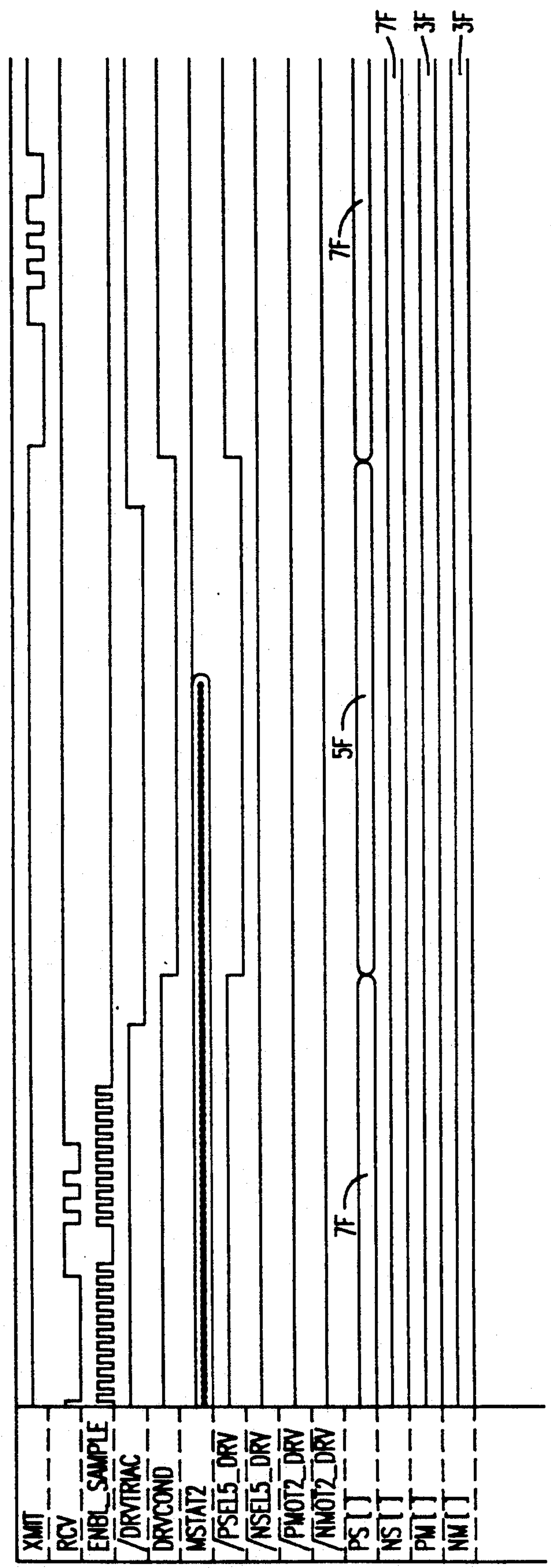
Figure 10A:
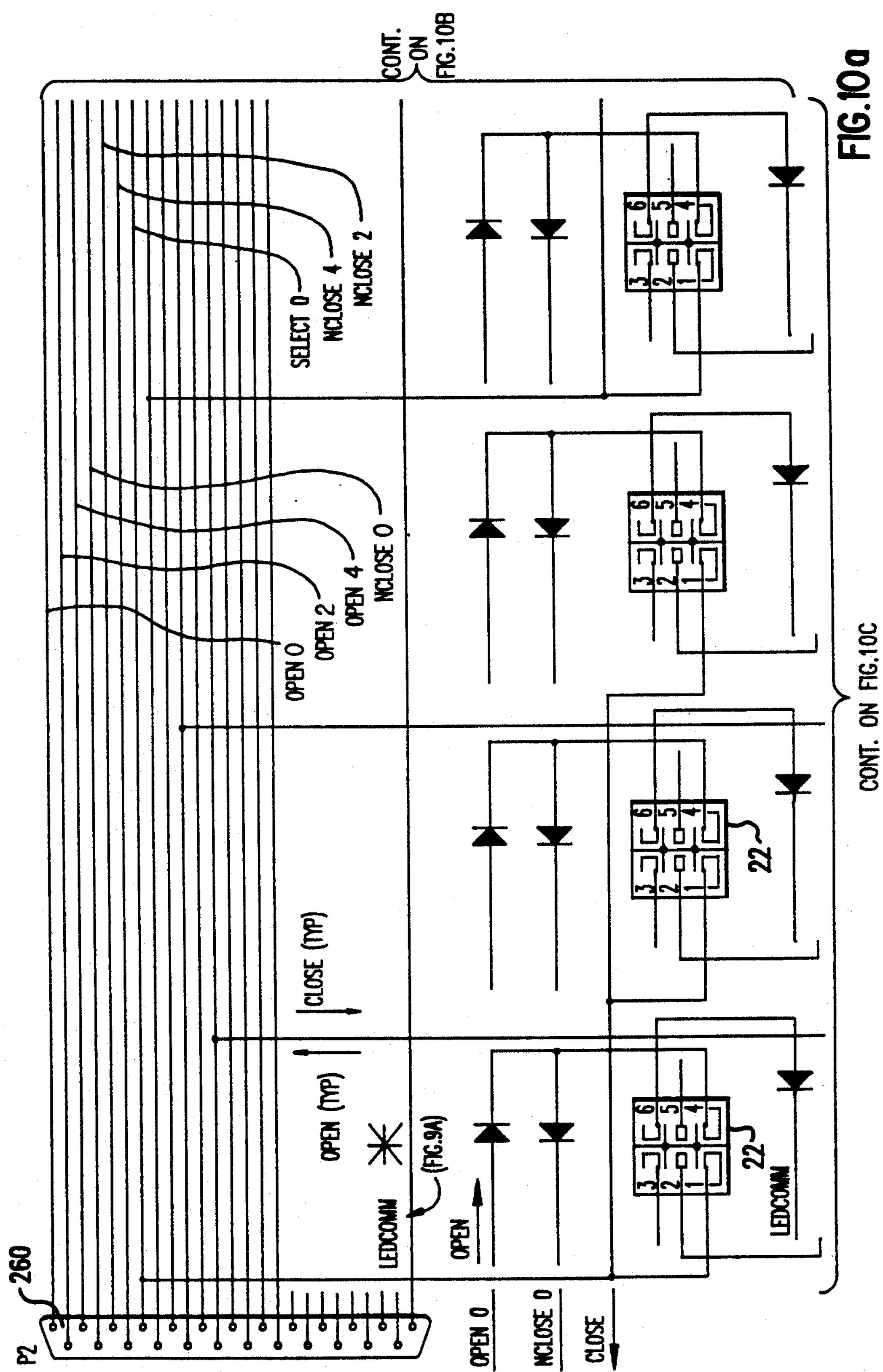
FIGS. 10*a*–10*d* are schematic diagram of a control bus shown in FIG. 2.
Figure 10B:
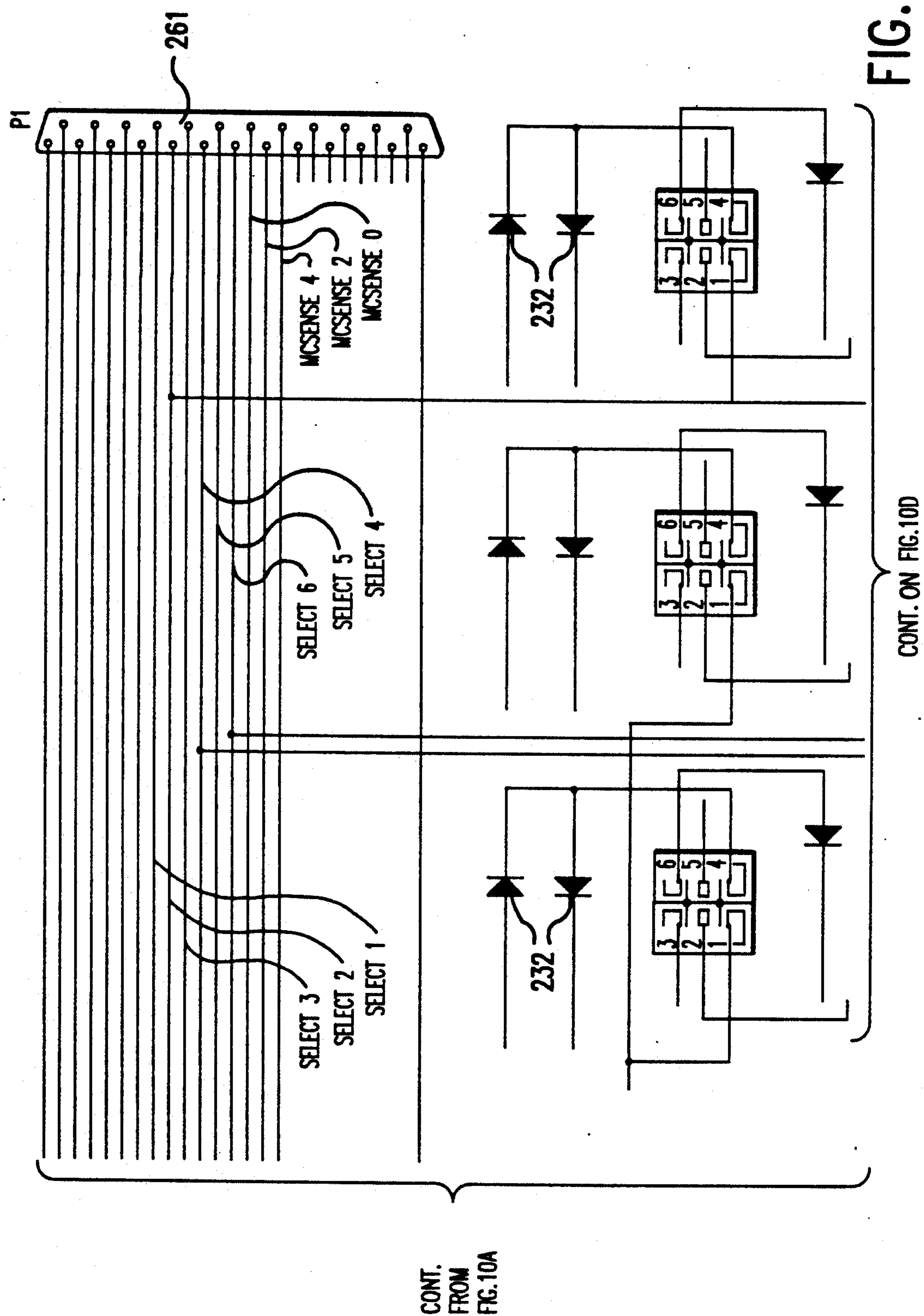
Figure 10C:
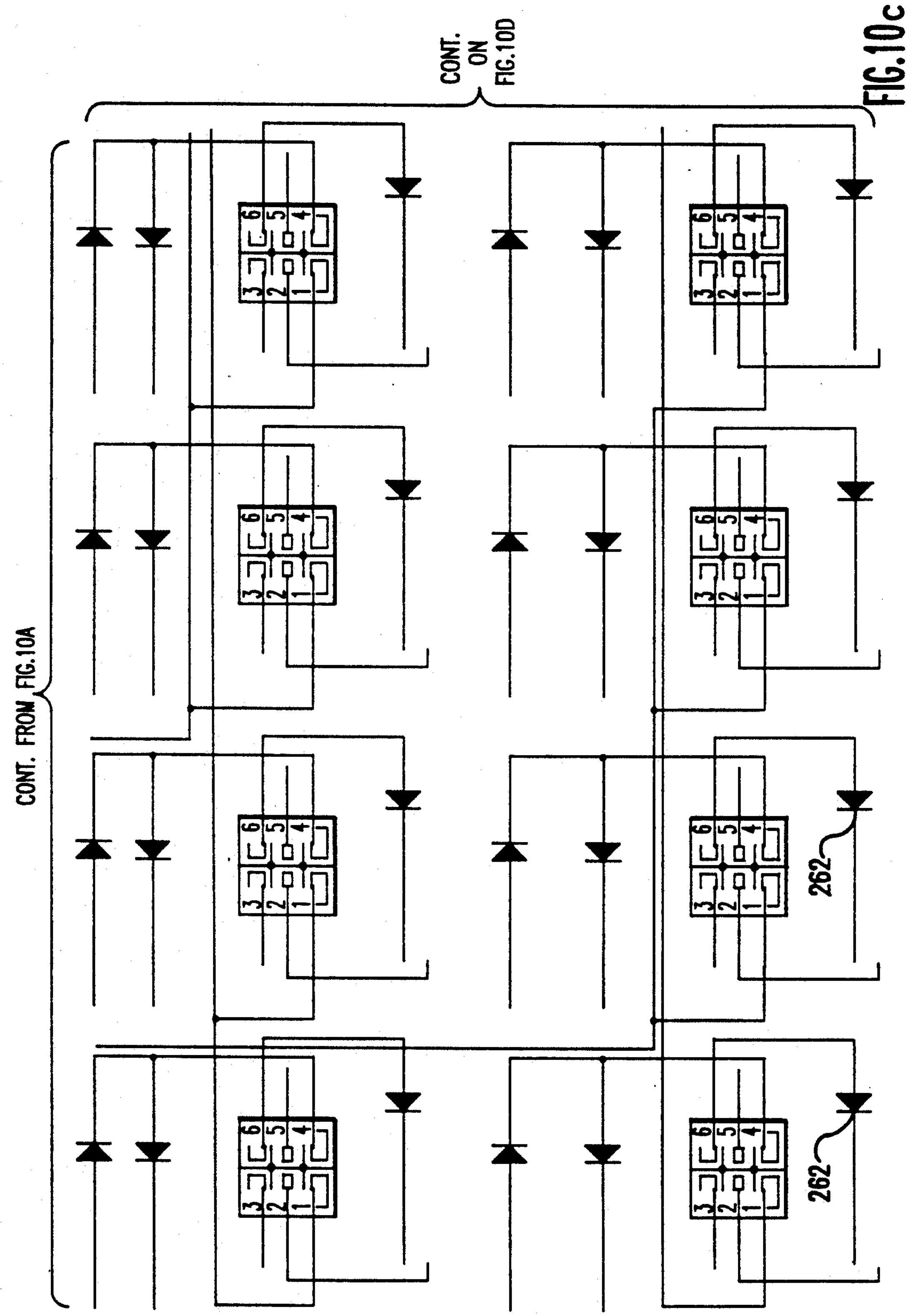
Figure 10D:
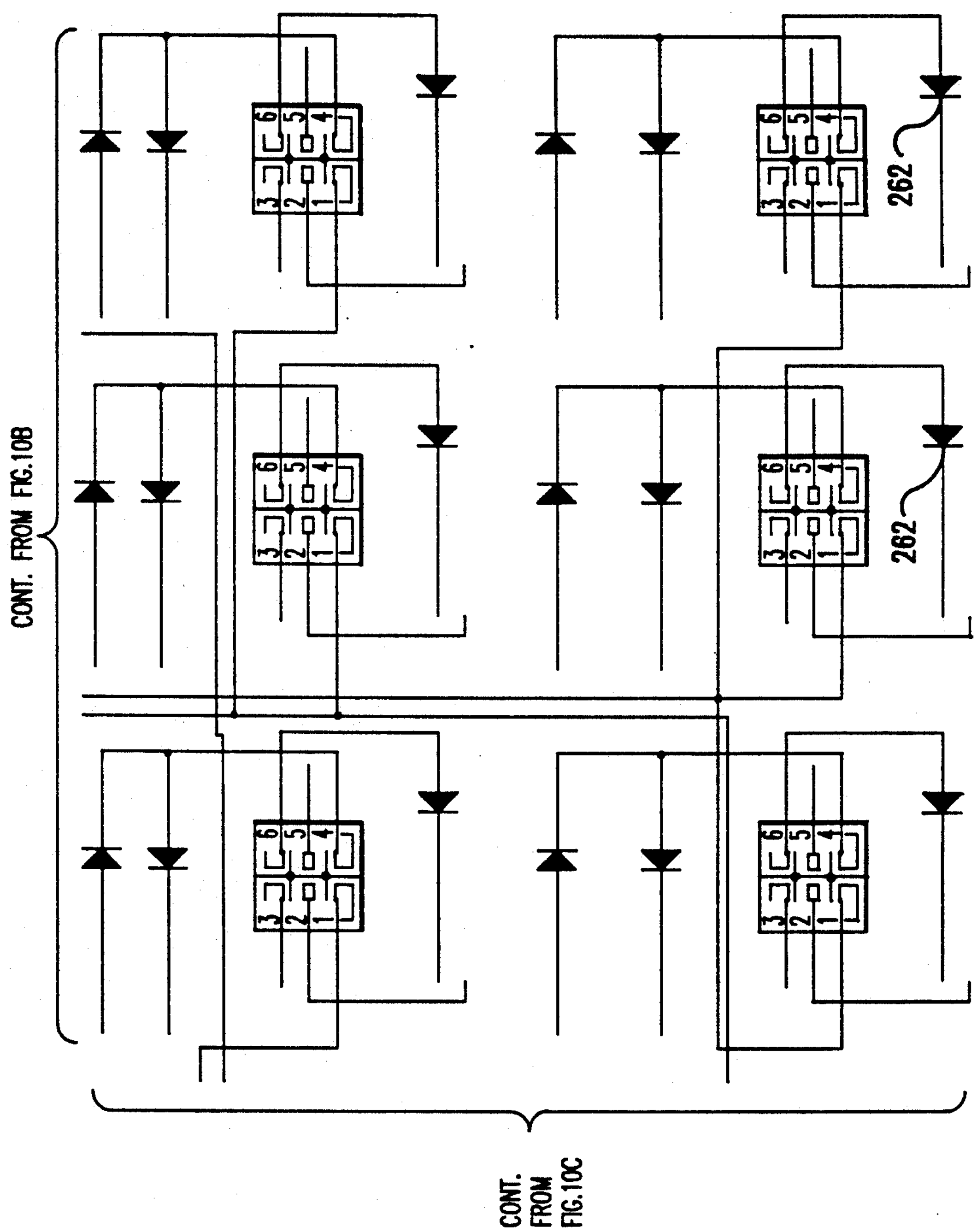

FIG. 9*k* illustrates the gate array timing when a motor read command is being received and executed. The only substantive difference between the signal transitions of the diagrams FIGS. 9*j* and 9*k* is MSTAT is used in place of CSTAT.

FIG. 10 illustrates one of the identical bus boards 16 and 18 of FIG. 4 from a schematic perspective. Shown are twenty-one connectors 22 for each of the twenty-one remote control circuit breakers 20. Each connector 22 carries each of the four signals (the select lead 246, status lead 248, motor drive lead 250 and the isolator common lead 252) between the interface driver board 34 and the circuit breaker 20. The diodes 232 are also illustrated and discussed in connection with the circuit in FIG. 9*b*. The connectors 260 or 261 may be used to connect the bus board 16 or 18 with the interface driver board 34 at either the top or the bottom, respectively, of the load center 10. The diodes 232 are used to provide current blocking so that only one motor can be selected at a time, and the diode 262 is used to provide current blocking so that all the current must flow through the opto triac circuit 226, rather than through the other various available paths.

Figure 11A:
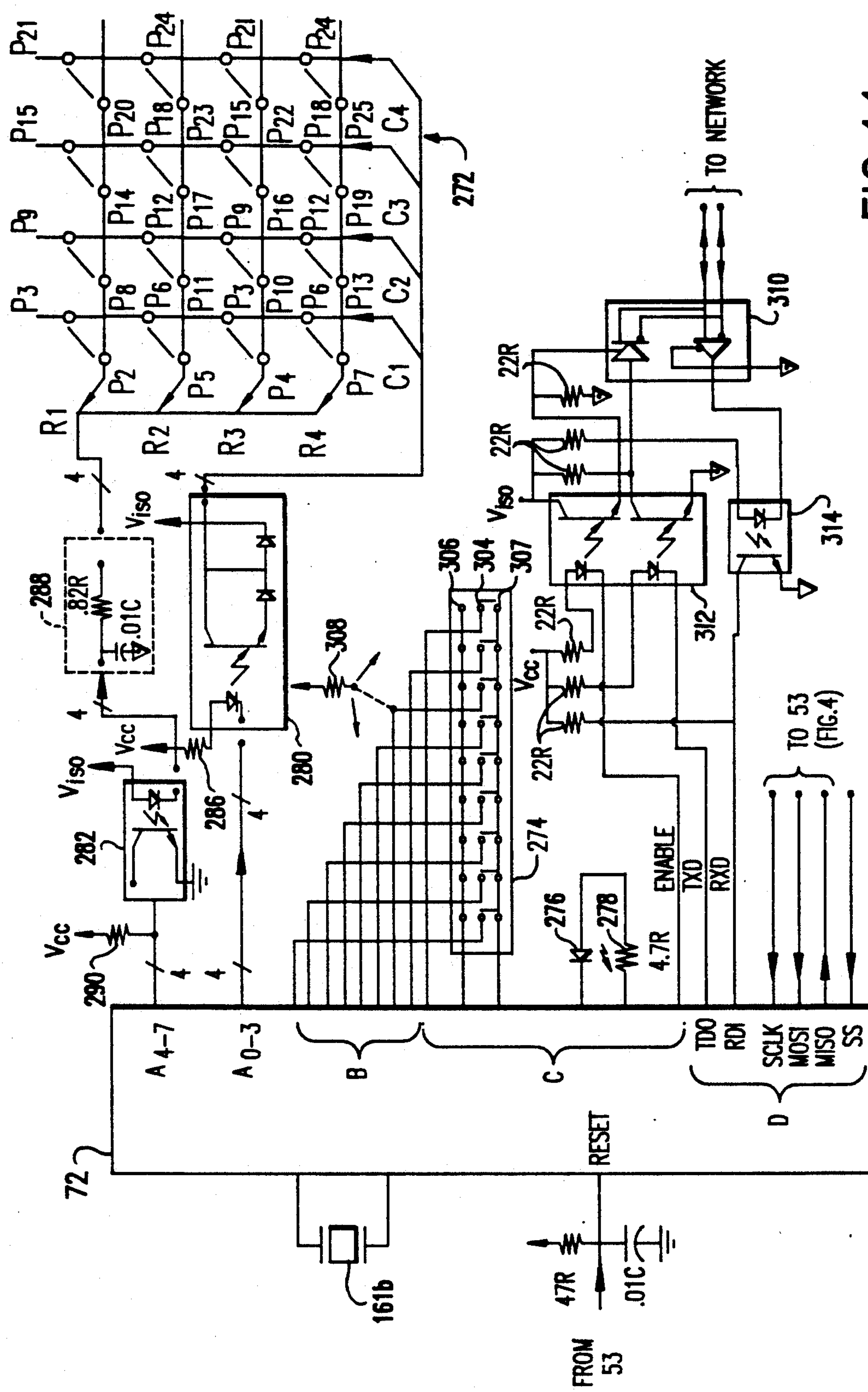
FIGS. 11*a*–11*d* represent various implementations of the termination board shown in FIG. 2 from a schematic perspective.
Figures 11B, 11C:
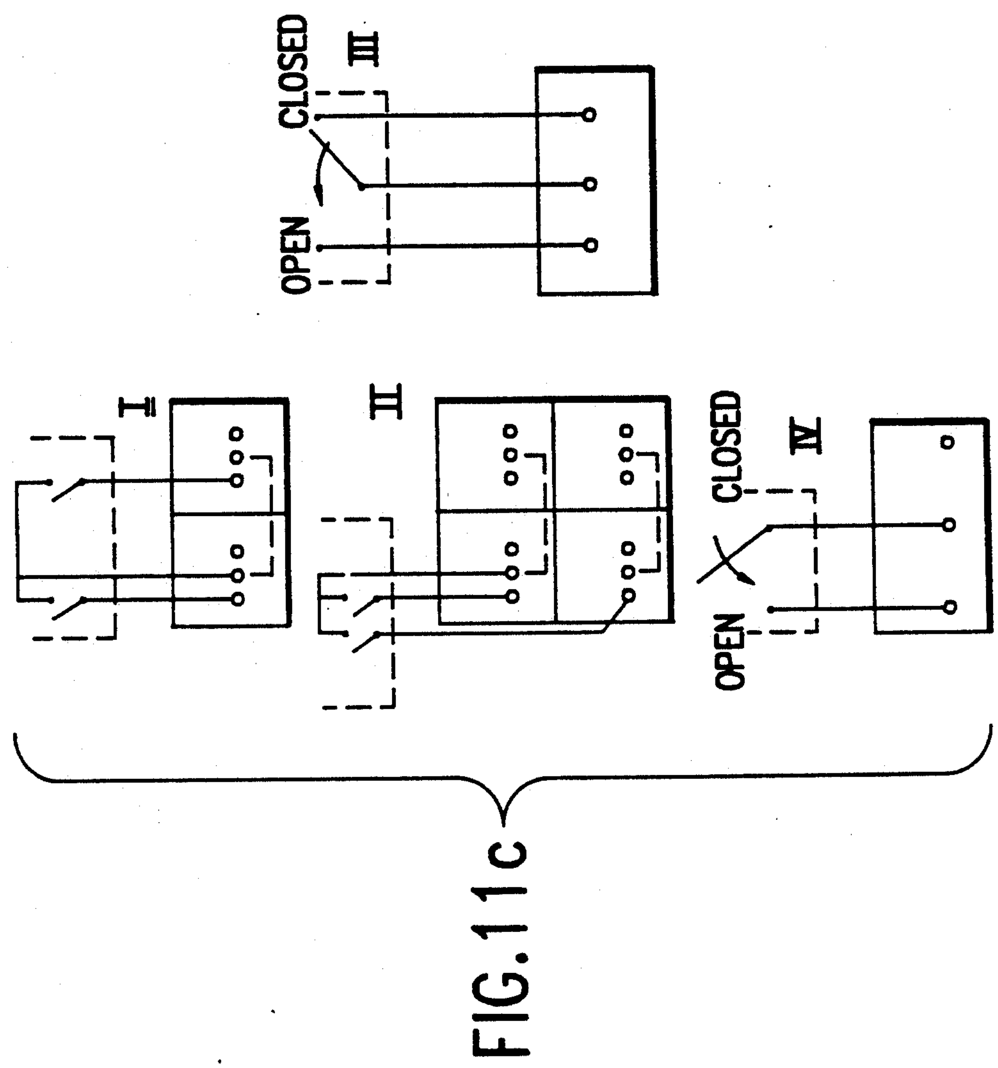

FIGS. 11*a*–11*d* represent various aspects of the termination board 38 in considerably more detail than FIG. 4. FIG. 11*a*, by itself, illustrates each of the components of the termination board 38 in schematic form, except for certain matrix circuitry 272 which is shown schematically in FIG. 11*d*. FIGS. 11*b* and 11*c* illustrate terminal blocks 270 (implementing the input terminals 54 of FIG. 4), which may be used for connecting dry-contact switches or relays to the termination board 38.

The microcomputer 72 of FIG. 11*a*, which may be implemented using the same type of IC as that used for the microcomputer 53 of FIG. 8, controls the termination board using ports A, B and C, along with certain designated bits from the D port for serial communication. The A port is used to scan or read the terminal blocks 270 (illustrated as part of the matrix circuitry 272) in a highly efficient manner, as will be discussed. The B port and the first three bits of the C port are used to read a set of nine trinary DIP switches 274. The C port may also be used for controlling a multi-color LED 276, via resistor 278, to provide diagnostic-related information regarding the operation of the termination board.

The matrix circuitry 272 is optically isolated from the remainder of the termination board 38 using a pair of quad NEC PS2501-4 ICs, opto-couplers 280 and 282, so as to isolate Vcc (and its common) from Viso (and its common) to protect the termination board circuitry from induced electrical noise received from the remote control devices connected to the terminal blocks 272 and to block the radiation of noise into the wiring. The A port bits A:0-3 are individually received at the anode side of the four inputs of the opto-coupler 280 and coupled past a pair of transient protecting diodes 284 to provide four optically isolated control bits C1 through C4, which are used to drive four columns of the matrix circuitry 272. The cathode side of each of the four inputs of the opto-coupler 280 is preferably connected to Vcc (+5 Volts) through a 820 Ohm pull-up resistor.

Four rows of the matrix circuitry 272 are read by the A port bits A:4–7 via four optically isolated control bits R1 through R4. Each of the control bits R1 through R4 is individually received at the collector side of an associated one of the four outputs of the opto-coupler 282 and coupled from a low pass filter circuit 288, which removes high frequency noise. From the low pass filter circuit 288, each control bit R1 through R4 is received at the anode side of a respective one of the four inputs of the opto-coupler 282, which couples R1 through R4 to the A port bits A:0–3. Each of the collector outputs of the opto-coupler 282 are pulled to Vcc via 1 k Ohm resistors 290.

In the matrix circuitry 272, C1 through C4, which are normally at a logic high, are alternately set low (0 Volts) while the microcomputer 72 scans each of R1 through R4 for each C1 through C4. If any switch input, e.g., defined by P2-P3 in the upper left corner of the matrix circuitry 272, is shorted, the microcomputer 72 is then able to detect that short by scanning R1 through R4.

Figure 11D:
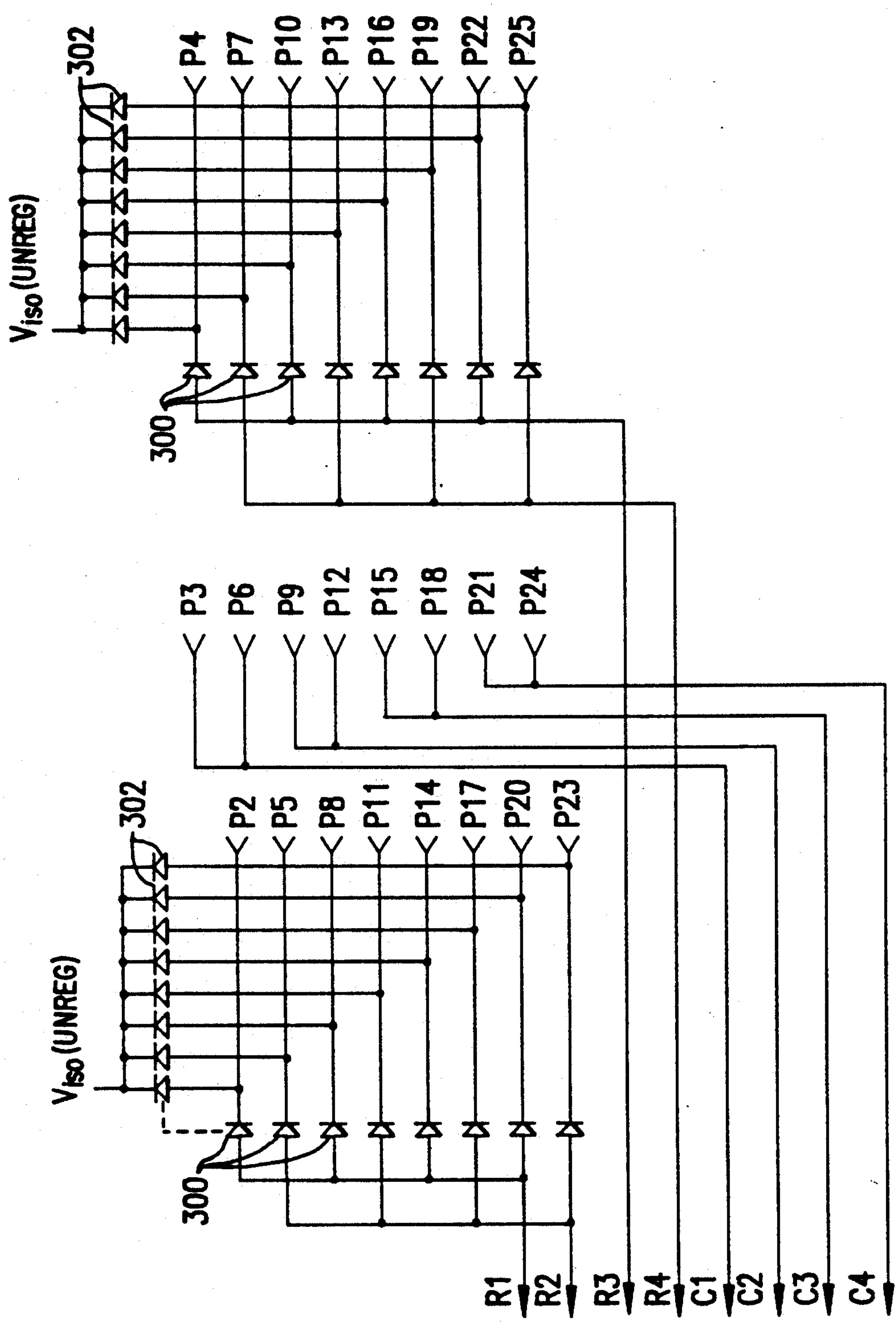

FIG. 11*d* illustrates the matrix circuitry 272 schematically, with each of the switch pairs (e.g., P2-P3, P8-P9, P17-P18, etc.) shown separated out for illustrative purposes. The diodes 300 are selectively placed to prevent the microcomputer 72 from falsely determining that one of the switch inputs is in the shorted state. Without the diodes 300, such a condition could occur if, for example, the adjacent three switch inputs (forming a square in the matrix) were each shorted simultaneously. The diodes 302 are used to provide transient protection.

FIG. 11*b* illustrates a preferred manner of arranging the switch inputs, each of which is labeled with a circle around the respective number 1-8, such that a three-wire signal, having positive, common and negative (as previously discussed), may be received by each of the switch inputs to control one, or a set, of the circuit breakers 20. The terminals of each switch input, e.g., P2, P3 and P4, are designated in FIG. 11*b* to indicate the corresponding switch input in FIGS. 11*a* and 11*d*.

FIG. 11*c* is used to illustrate the proper manner of connecting the signal wires to the switch inputs. Embodiment III illustrates a preferred way of wiring a three-wire pulsed (momentary) or maintained signal at a single one of the eight switch inputs, while embodiment IV illustrates a preferred way of wiring a two-wire maintained signal at a single one of the eight switch inputs. The embodiments depicted I and II respectively illustrate an acceptable manner of connecting two two-wire signals and an unacceptable manner of connecting a three-wire signal (or two two-wire signals) to the switch inputs. In order to avoid false switching or undetected switching, no three-wire signals should be connected across vertical terminal blocks 270; thus, embodiment I is proper and embodiment II is improper. The dotted lines in each terminal block depict a shared common between the wire terminals, and each terminal block includes only three wires terminals for a total of 24 possible wire terminals.

Eight of the nine trinary DIP switches 274 are used to program the microcomputer 72 for the kind of remote control signal (e.g., pulsed or maintained) which is to be received at each of eight input terminals (FIGS. 11*b* and 11*c*), as previously discussed. As an alternative, the function of the first eight trinary DIP switches 274 may be implemented by programming the microcomputer 72 through the controller 32 (e.g., via the programmer station 66) or through one of the input terminals (assuming that the microcomputer 72 has a known default mode for receiving this information). The remaining one of the trinary switches 274 is used to program the microcomputer 72 for the network configuration. For example, each of the three positions of the remaining trinary switch can be used to indicate point-to-point, multidrop (e.g., RS485-type) and a disable network communication mode, respectively.

Each of the trinary DIP switches 274 is read by the microcomputer 72 by scanning the center terminal 304 of the switches 274, while, alternately, driving a logic low on each outside terminal 306 or 307. By pulling up to Vcc each of the center terminals 304 using pull-up resistors 308, the microcomputer 72 is able to determine the position of each trinary switch 274.

As previously discussed in connection with the microcomputer 53 of FIG. 8, the SCLK, MOSI, MISO and SS ports of the microcomputer 72 are directly connected with the corresponding ports of the microcomputer 53 of FIG. 8 to provide synchronous serial communication therebetween. Although not shown, a pair of diodes may be situated on each of the lines emanating from the SCLK, MOSI, MISO and SS ports to provide protection from both high and low level power transients.

The network drivers 68 of FIG. 4 are preferably implemented using an LTC-485 type IC 310, which is optically isolated from the microcomputer-related circuitry using NEC PS2501 type opto-couplers. The purpose of the optical isolation is to eliminate noise and ground-loop related problems. This conventional arrangement may include transient-resistant diodes to provide reliable and efficient RS485 type network capabilities for the system.

Figure 12D:
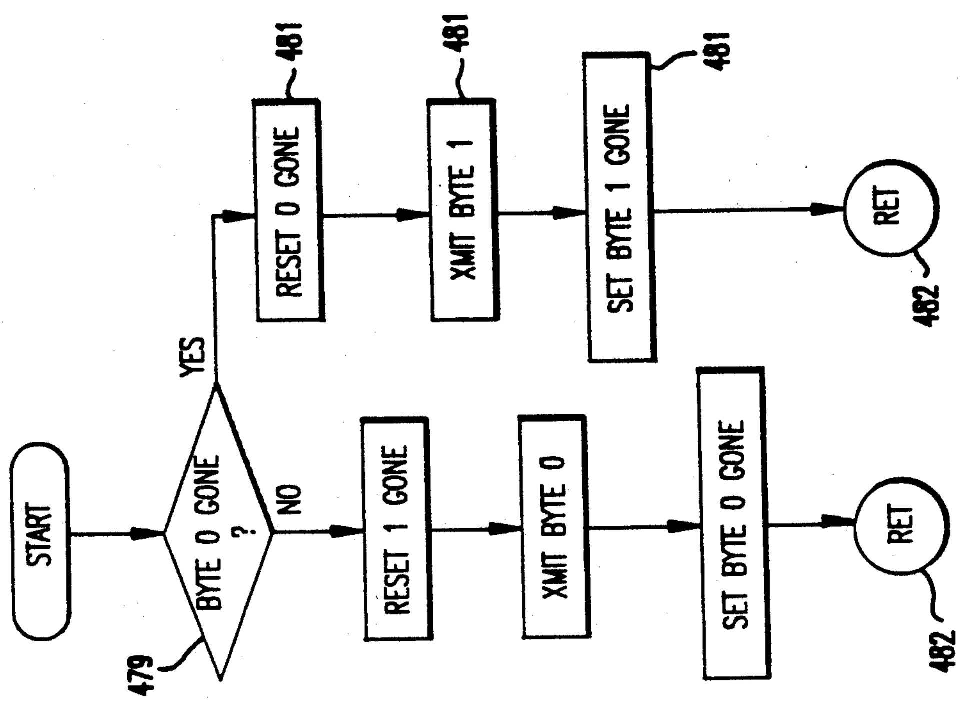
FIGS. 12*a*–12*d* comprise a flow chart which may be used to program the microcomputer shown in FIG. 8.
Figure 12A:
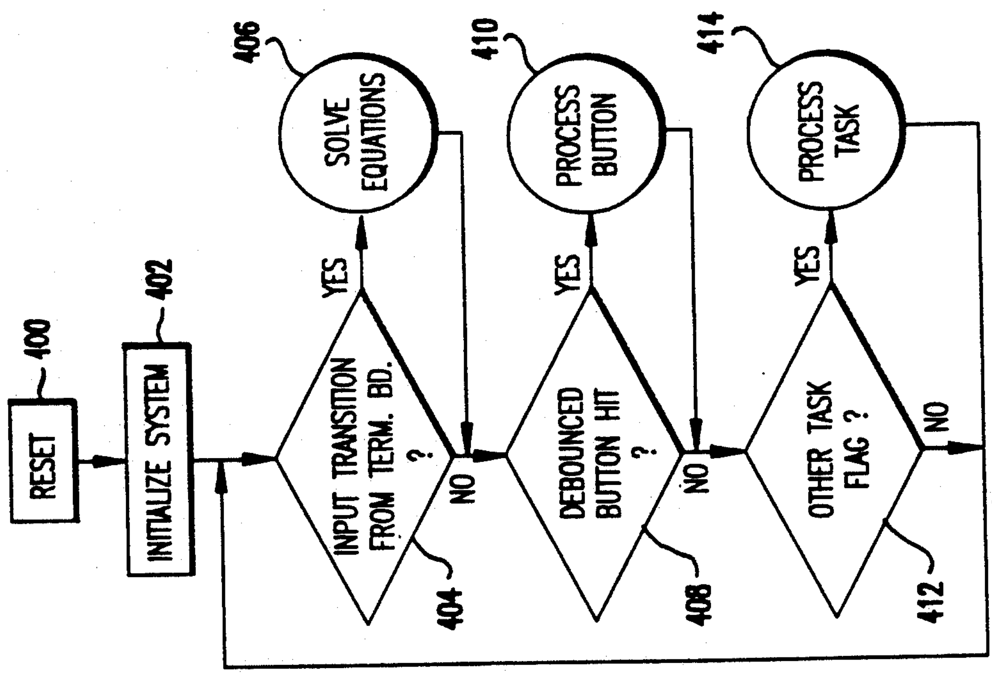

FIG. 12*a* illustrates a preferred flow chart which may be used to implement the operating program for the microcomputer of the controller 32 of FIG. 4. The flow chart begins at blocks 400 and 402 where the microcomputer is depicted transitioning from the reset to system initialization stage. At block 404, a test is performed to determine if any signal transitions have been detected at the input terminals of the termination board. As previously discussed, any such signal transitions are interpreted by the termination board 38 and passed to the microcomputer of the controller 32 via the synchronous link. Once the microcomputer of the controller 32 receives notification of such a signal transition, flow proceeds from block 404 to block 406 where the microcomputer determines which circuit breakers are associated with the signal transition and which tasks must be scheduled in accordance with the signal transition. From block 406, or if no signal transition was detected at block 404, flow proceeds to block 408.

Figure 12B:
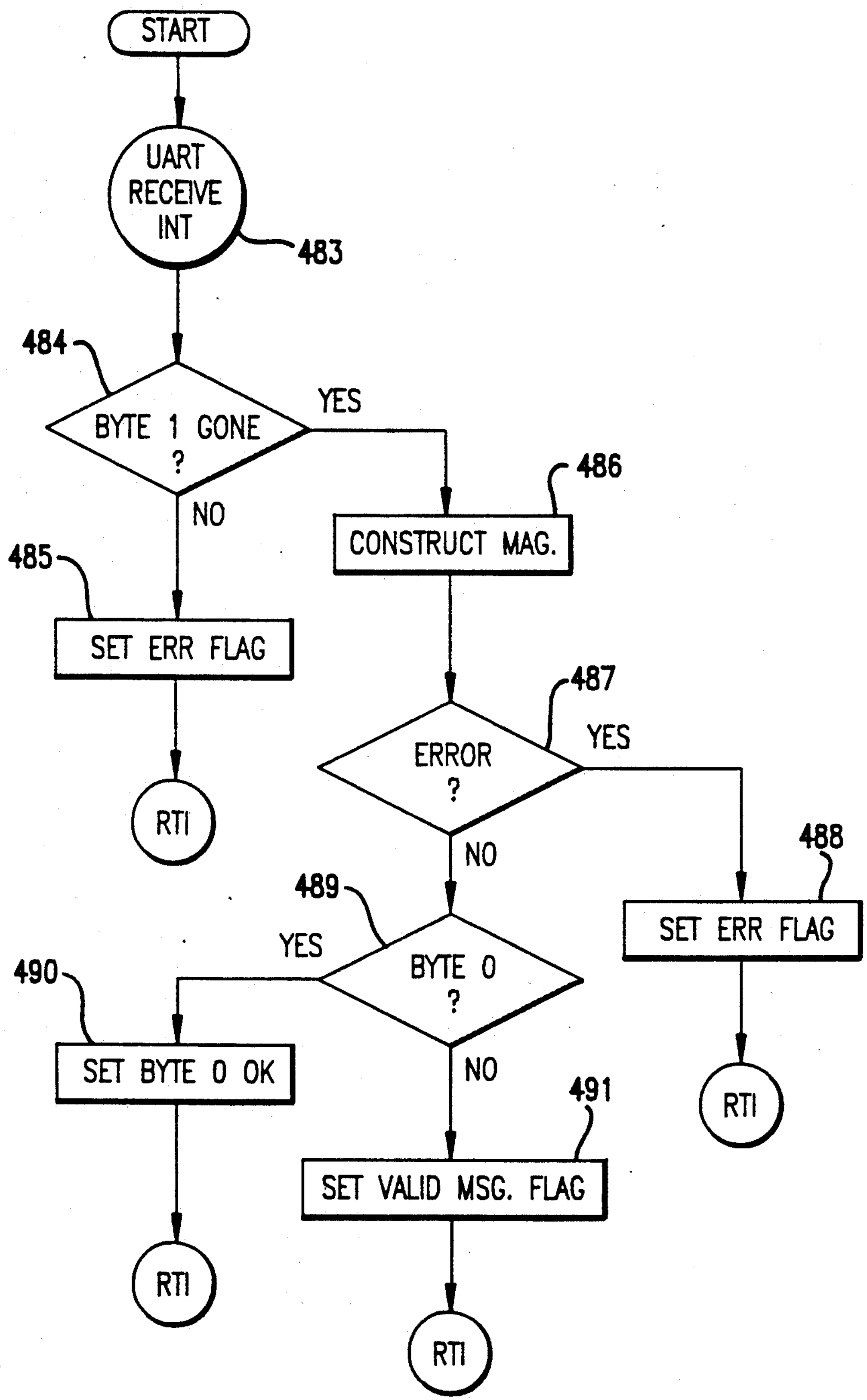
Figure 12C:
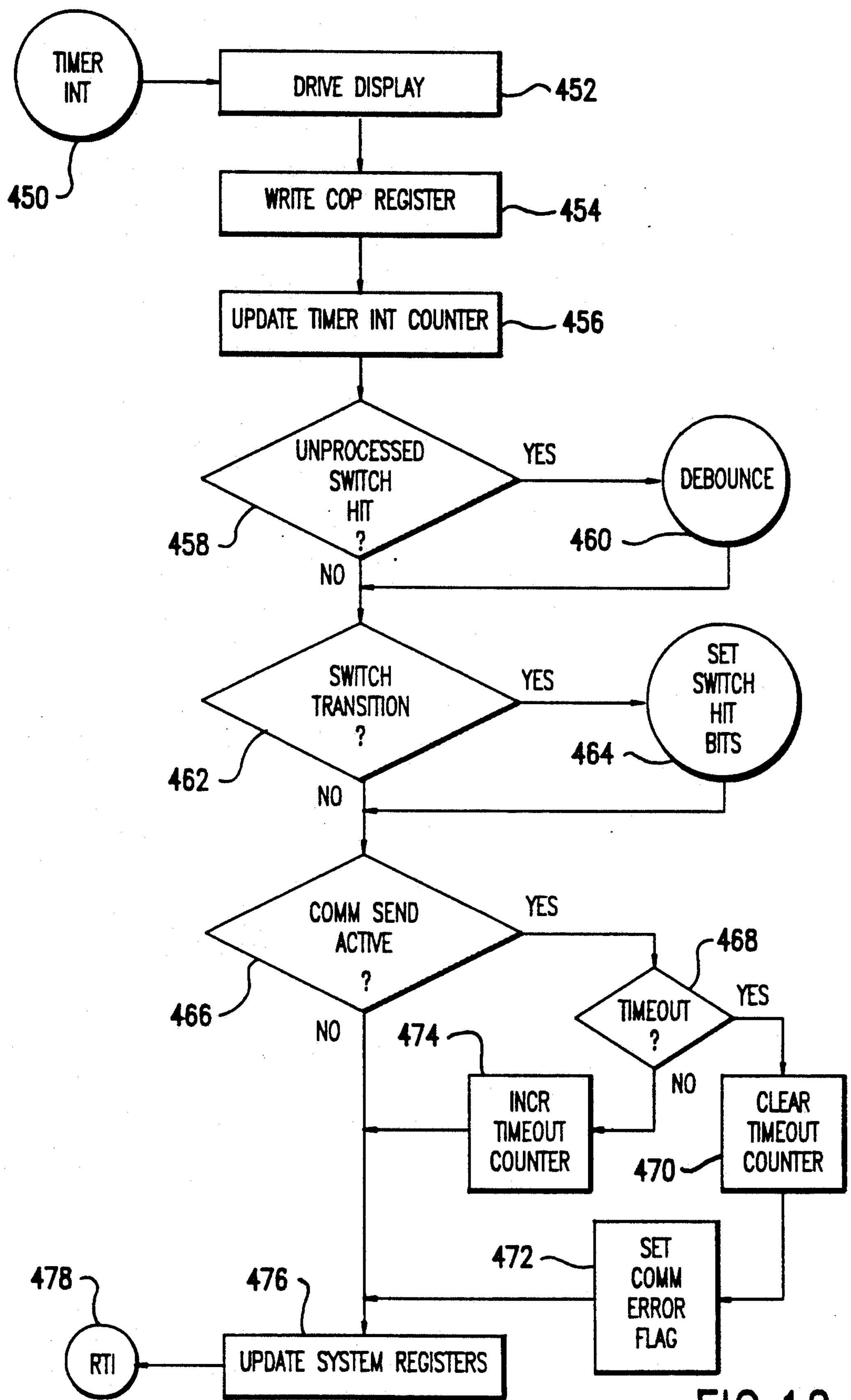

At block 408, the microcomputer performs a test to determine if any manual inputs have been received and debounced via the timer interrupt routine of FIG. 12*c*. In response to the reception of such an input, flow proceeds from block 408 to block 410 where the requisite tasks associated with that input are processed. From block 410, or if no manual input was received at block 408, flow proceeds to blocks 412 and 414 where the microcomputer performs any tasks which have been scheduled for execution; for example, such a task would include any automatic action to be taken as a result of a prompt from the real time clock. From blocks 412 and 414, flow returns to block 404 for additional monitoring of the signal inputs at the termination board and the manual inputs at the front panel of the controller 32.

FIG. 12*b* illustrates a preferred manner of receiving the two-byte message from the gate array. The flow chart begins at block 483 where the microcomputer receives a byte via an interrupt. At block 484, the microcomputer determines if the second byte (byte 1) has been sent to the gate array for a proper response. If not, flow proceeds to block 485 where the microcomputer sets a flag indicating an error (e.g., both bytes must be transmitted before a valid response can be received) and that corrective action needs to be taken. Otherwise, flow proceeds to block 486 where the microcomputer constructs and interprets the received message from the gate array. At block 487, the microcomputer checks for errors. If an erroneous response was received, flow proceeds to block 488 where an appropriate error flag is set for subsequent action. Otherwise, flow proceeds to block 489 where the microcomputer determines whether byte 0 or byte 1 has been received. If byte 0 wa received, a flag is set (block 490) to indicate that another byte is forthcoming. If byte 1 was received, a flag is set (block 491) to indicate that a valid message was received and, if needed, further action taken. From blocks 485, 488, 490 and 491, a return from interrupt command is executed.

FIG. 12*c* illustrates a flow chart which may be used to implement a timer interrupt routine for the microcomputer 32. This routine services, upon the receipt of the timer interrupt, various inputs to the controller including the switches on its front panel. The routine starts at block 450 where the microcomputer of the controller is depicted being interrupted from its normal flow. From block 450, flow proceeds to block 452 where the microcontroller updates the display as previously described. At block 454, the microcomputer refreshes its internal COP (computer operating properly) register to prevent a reset from occurring. Block 456 depicts the microcomputer presetting the counter which is used to generate the next timer interrupt.

From block 456, flow proceeds to block 458 where the microcomputer performs a test to determine if there are any switch inputs at the front panel of the controller that have to be processed. If there are any switch inputs that have to be processed, flow proceeds from block 458 to block 460 where the microcomputer debounces the next unprocessed switch input. Any such manual input is preferably debounced using conventional software debouncing steps. If there are no switch inputs that have to be processed, or from block 460, flow proceeds to block 462.

At block 462, the microcomputer performs a test to detect switch transitions caused by manual inputs at the front panel. If such transitions have occurred, flow proceeds to block 464 where flags (bits) are set to record which switches have been selected. Otherwise, flow proceeds to block 466.

Blocks 466 through 476 represent a timeout procedure to ensure that the gate array is responding to the commands sent from the controller. If the gate array does not respond within a certain time limit (block 468) by returning the requisite acknowledgement or status report, the associated timer is cleared and an error flag is set (block 472) for appropriate action during the main flow chart (block 412 of FIG. 12*a*). If the gate array responds within the time limit, flow proceeds from block 468 to block 474 where the timer counter is incremented for the next pass through block 468. Before exiting the routine at block 478, any restoration of system registers occurs at block 476.

FIG. 12*d* illustrates a more detailed perspective of a preferred manner of sending the two-byte message from the controller to the gate array. The flow chart begins at block 479 where the microcomputer determines if the first byte (byte 0) has been sent yet. If not, flow proceeds to blocks 480 where the microcomputer resets a flag indicating that byte 1 has been transmitted, then transmits byte 0, and then sets a flag indicating that byte 0 has been transmitted. If the microcomputer determines that the first byte has been sent, the opposite occurs at blocks 481; the microcomputer resets a flag indicating that byte 0 has been transmitted, then transmits byte 1, and then sets a flag indicating that byte 1 has been transmitted. This subroutine, which may be called from block 412 of FIG. 12*a*, is exited at block 482.

FIGS. 13*a*–13*d* respectively illustrate a main routine, a timer interrupt routine, a serial communications interrupt routine, and a serial peripheral interrupt routine as a preferred manner of programming the microcomputer of the termination board 38 (FIG. 11*d*). FIG. 13*a* begins at block 493 where the microcomputer is depicted transitioning from the reset to initialization stage. At block 494, the microcomputer scans the trinary DIP switches to determine the configuration set by the operator.

At blocks 496 through 500, the microcomputer scans, debounces and decodes all inputs to determine which tasks must be executed. Activity flags, as depicted at block 502, may be set to record the types of tasks to be performed. Blocks 504 and 506 depict the microcomputer checking for and displaying errors that may have transpired via the scanned inputs. Other tasks may also be processed at this point in response to messages or flags being sent from any of the other routines.

From block 506, flow proceeds to block 508 where the microcomputer waits for the timer interrupt routine to prompt another reading of the DIP switches and other inputs to the microcomputer.

The timer interrupt routine, illustrated in FIG. 13*b* and beginning at block 516, comprises two basic steps, depicted at blocks 518 and 520. At block 518, the microcomputer sets a background flag to indicate that the time has come to once again scan the DIP switches and other inputs to the microcomputer. Thus, when the microcomputer returns from block 508, it proceeds to block 494.

From block 518, flow proceeds to block 520 where the microcomputer refreshes an internal conventional watchdog timer circuit (e.g., an internal COP register), which protects the microcomputer from entering into nonprogrammed modes. Other watchdog routines may also be implemented at this point to ensure proper operation external to the microcomputer. The interrupt routine is exited via block 522.

The serial communications interrupt routine, illustrated in FIG. 13*c*, illustrates a preferred manner for the termination board to communicate with external devices via the network drivers. The routine begins at blocks 526 and 528 where the microcomputer enters the routine and checks the network address to determine if the communication over the network contains the destination address of the subject termination board. At blocks 530, 532 and 534, the microcomputer stores, validates and flags the communication. The message flag set at block 534 may be executed, for example, in the main routine of FIG. 13*a* or the interrupt routine of FIG. 13*d*, depending on the particular type of message. The routine is exited at block 536 via a return from interrupt command.

FIG. 13*d* illustrates a preferred manner for the termination board to communicate with the controller board via the previously discussed master/slave interface. The routine begins at blocks 538 and 540 where the microcomputer enters the routine and retrieves the command being sent from the controller. At block 542, the microcomputer calls the appropriate subroutine for executing the command sent from the controller. For example, the microcomputer may be instructed to send the current status of each of the eight input switches to the controller. In this instance, the microcomputer would call a subroutine which reads the status of each switch and transmits that data to the controller. The routine is exited at block 544 via a return from interrupt command.

While the invention has been particularly shown and described with reference to a few particular embodiments, it will be recognized by those skilled in the art that modifications and changes may be made to the present invention described above without departing from the spirit and scope thereof. For instance, the termination board 38 may be used as one of several types of circuit boards used to interface with various types of outside devices and/or to provide varying levels of control to the circuit breakers.

APPX A

DISPLAY TABLE
distab is a 1 to 1 map of the display LED's. Bits in this table are sent directly to PORTS A and B to drive the control panel LED's.

The table format is:

| 16 O | 16 C | 15 C | 15 O | 02 O | 02 C | 01 C | 01 O |
|---|---|---|---|---|---|---|---|
| D4SA | D3SA | D2SA | D1SA | 30 O | 30 C | 29 C | 29 O |
| 18 O | 18 C | 17 C | 17 O | 04 O | 04 C | 03 C | 03 O |
| D4SB | D3SB | D2SB | D1SB | 32 O | 32 C | 31 C | 31 O |
| 20 O | 20 C | 19 C | 19 O | 06 O | 06 C | 05 C | 05 O |
| D4SC | D3SC | D2SC | D1SC | 34 O | 34 C | 33 C | 33 O |
| 22 O | 22 C | 21 C | 21 O | 08 O | 08 C | 07 C | 07 O |

| D4SD | D3SD | D2SD | D1SD | 36 O | 36 C | 35 C | 35 O |
|---|---|---|---|---|---|---|---|
| 24 O | 24 C | 23 C | 23 O | 10 O | 10 C | 09 C | 09 O |
| D4SE | D3SE | D2SE | D1SE | 38 O | 38 C | 37 C | 37 O |
| 26 O | 26 C | 25 C | 25 O | 12 O | 12 C | 11 C | 11 O |
| D4SF | D3SF | D2SF | D1SF | 40 O | 40 C | 39 C | 39 O |
| 28 O | 28 C | 27 C | 27 O | 14 O | 14 C | 13 C | 13 O |
| D4SG | D3SG | D2SG | D1SG | 42 O | 42 C | 41 C | 41 O |
| X | X | MNTN | PULS | REVW | MANL | HALT | RUN |
| D4DP | D3DP | D2DP | D1DP | X | OPEN | CLOS | NOCHG |

```
## O means => breaker open
## C means => breaker closed
D#Sx means => display #, segment x
D#DP means => display #, decimal point

*************************************************
)IGFORM

:aps input BCD digit to bits in display table
. zero means segment ON

he column # in the EM2000 varies between columns 4 through 7 on odd bytes
n the DISPTAB table.  The routine takes the row formatted info in table
)IGPAT and converts it to the column format required in DIGPAT.

NPUTS:  BCD Digit @ [varptr-1], column # @ [varptr-2]
ETURNS: None
OCALS:  Segment pattern [varptr], disptab index [varptr+1], !ColMask [varptr+2]
HANGES: None

                        ----------------
           varptr-2        | Col. mask        | Mask of column to fix passed from caller
                        ----------------
           varptr-1        | BCD #            | BCD digit to format passed from caller
                        ----------------
ntry/exit ptr>      varptr | Segment Pattern  |     From table digpat
                        ----------------
           varptr+1        | Current disptab  | Index into disptab array
                        ----------------
           varptr+2        | Comp. col. mask  | Compliment of column mask
                        ----------------

form ldx      varptr  * get stack ptr
     lda      #1
     sta      1,x     * save disptab byte counter
     ldx      -1,x    * get BCD digit (or DP)
     lda      digpat,x        * get segment pattern
     sta              * save segment pattern on stack
     lda              * get column mask
     coma             * compliment pattern mask
     sta      2,x     * save it

     lsr      ,x      * digit bit = 0?
     bcc      df1     * yes, put 0 in table
     lda      -2,x    * else, get column mask
     ldx      1,x     * load index into disptab
     ora      disptab,x       * set table bit to 1
     bra      df2

1    lda      2,x     * get complimented column mask
     ldx      1,x     * get disptab index
     and      disptab,x       * clear table bit

2    sta      disptab,x       * fix table
     ldx      varptr  * restore stack frame
     inc      1,x
```

```
        inc     1,x     * prepare for next digit segment
        lda     #16
        cmp     1,x     * past table end?
        bcc     df3     * no, loop
        rts             * else, return

;***************************************************
BKR2DISP

converts breaker slot # (0 to 41) in [varptr-1] to byte # and doublet #
dublets are the even numbered bits in each byte which signify the first
bit of the two ON/OFF bits for each breaker in the status display

byte# = (slot# % 14) & 0xfe)) + int(chan / 28)
doublet# = ((slot# % 2) * 2) + (4 * (slot# / 14)) - (8 * (slot# / 28))

INPUTS:  at entry, Slot# @ [varptr-1]
RETURNS: at exit, byte# @ [varptr], doublet# @ [varptr+1]
LOCALS:  none

X and A trashed

                          -----------
            varptr-5     | Slot#     | Slot number passed from caller
                          -----------
entry/exit ptr>    varptr-4     | Byte#     | Byte# returned on exit
                          -----------
            varptr-3     | Doublet#  | Doublet# returned on exit
                          -----------
            varptr-2     | Dividend  | passed to divide
                          -----------
            varptr-1     | Divisor   | passed to divide
                          -----------
ptr after fixup>   varptr  | Quotient  | varptr on entry to divide, Quotient returned
                          -----------
                         | Remainder | Remainder returned from divide
                          -----------

* solve byte# = (slot# % 14) & 0xfe)) + int(slot# / 28)
bkr2disp        ldx     varptr  * get stack pointer
        lda     #4      * number of local, returned, passed variables
        add     varptr
        sta     varptr
        tax
* from here on, x points to quotient of divide routine

        lda     -5,x    * slot# = dividend
        sta     -2,x
        lda     #14
        sta     -1,x    * divisor = 14

        bsr     divide

        lda     #$fe
        and     1,x     * fixup remainder
        sta     -4,x    * [x] = (slot# % 14) & 0xfe

        lda     -5,x    * get slot number
        sta     -2,x
        lda     #28
        sta     -1,x
        bsr     divide  * [x+2] = slot# / 28

        lda     -4,x
        add     ,x      * byte# = [x] = [x] + (slot# / 28)
        sta     -4,x    * save for return

   * solve for doublet number
   ublet# = ((slot# % 2) * 2) + (4 * (slot# / 14)) - (8 * (slot# / 28))

        lda     -5,x    * get slot #
        and     #1
        lsla            * (slot# % 2) * 2
        sta     -3,x    * store partial doublet
```

```
    lda     -5,x      * get slot#
    sta     -2,x      * to psuedo stack dividend
    lda     #14       * get divisor
    sta     -1,x      * to psuedo stack
    bsr     divide

    lda     ,x        * get quotient
    lsla
    lsla
    add     -3,x
    sta     -3,x      *((slot# % 2) * 2) + (4 * (slot# / 14))

    lda     -5,x
    sta     -2,x
    lda     #28
    sta     -1,x
    bsr     divide

    lda     ,x        * get slot# / 28
    lsla
    lsla
    lsla              * 8 * (slot# / 28)
    nega
    add     -3,x      * doublet# -= 8 * (slot# / 28)
    sta     -3,x      * doublet# to psuedo stack

    lda     varptr
    sub     #4
    sta     varptr
    tax               * fix psuedo stack pointer
    rts

**********************************************
VIDE
                        -----------
          varptr-2        | Dividend  | passed variable from caller
                        -----------
          varptr-1        | Divisor   | passed variable fram caller
                        -----------
try/exit ptr>  varptr     | Quotient  | return value to caller
                        -----------
          varptr+1        | Remainder | return value to caller
                        -----------

PUTS:  dividend=[varptr-2], divisor=[varptr-1]
TURNS: quotient=[varptr], remainder=[varptr+1]
CALS:  temp quotient in [varptr]

vides an 8-bit number by another 8-bit number...[varptr-2]/[varptr-1]
esn't check for divide by zero
trashed
vide doesn't call anything, varptr unaffected

de  ldx     varptr    * get stack pointer
    clr     ,x        * clear quotient
    lda     -2,x      * get dividend
    sub     -1,x      * dividend < divisor?
    bcs     div1      * yes, calculate remainder
    inc     ,x        * else, increment quotient
    bra     div2

    add     -1,x      * calc remainder
    sta     1,x       * remainder to stack frame [varptr+1]
    rts

**********************************************
JXDISP

odates display based on what is in the display table DISPTAB
akes data from table and writes it directly to the LED's
ower 3 bits of PORTC contains address of 1-of-8 display mux presently displayed

NPUTS:  PORTC
ETURNS:
OCALS:  temp data for new PORTC
HANGES:
```

and X trashed

```
disp ldx     intptr  * set for temp storage
     lda     PORTC
     and     #$f8    * mask out lower bits
     sta     ,x
     lda     PORTC
     inca
     and     #7
     ora     ,x
     clr     PADIR
     clr     PBDIR   * stop driving array
     sta     PORTC   * set next display column

     bclr    3,PORTC
     bset    3,PORTC * strobe HC137

     and     #7
     tax
     lslx            * normalize ([disptab] = 2 * (PORTC * 7))
     lda     disptab,x
     ora     flashmsk        * turn display off if flashmask == 1
     sta     PORTA   * set first LED column
     incx
     lda     disptab,x
     ora     flashmsk
     sta     PORTB   * set second column

     lda     #$ff
     sta     PADIR
     sta     PBDIR   * display rows ON

     tst     flashctr        * flash counter active from procsw routine?
     beq     exmux   * no, exit
     inc     flashctr        * else, increment counter
     lda     flashctr        * get present counter
     cmpa    #FLASHDLY       * counter > delay?
     bcs     exmux   * no, exit

     clr     flashctr        * else, clear flash counter
     clr     flashmsk        * enable display

ux   rts
```

Appendix B (Part I)

```
; HEADER
; FILEID FUSEFUS /designs/em2kact/em2kact.fus 14005bb9
; CHECKSUM 14005bb9
; PROGRAM Action Logic System
; VERSION 1.22
; DEPEND DDFDIE /actel/die1020.ddf 9fe38a0b
; DEPEND FUSEADL /designs/em2kact/em2kact.adl a0fd292e
; DEPEND FUSESEG /designs/em2kact/em2kact.seg 5fc03720
; DEPEND FUSELOC /designs/em2kact/em2kact.loc bdc35912
; DEPEND MODLIB /actel/modlib.lib b0797af4
; VAR DDFDIE /actel/die1020.ddf
; VAR FUSEADL /designs/em2kact/em2kact.adl
; VAR ADLIB /actel/adl04.lib
; VAR DDFPACKAGE /actel/pkg1020.ddf
; VAR ROUTEADL /designs/em2kact/em2kact.adl
; VAR ROUTELOC /designs/em2kact/em2kact.loc
; VAR PLACEPIN /designs/em2kact/em2kact.pin
; VAR PLACECRT /designs/em2kact/em2kact.crt
; VAR FUSESEG /designs/em2kact/em2kact.seg
; VAR PLACEADL /designs/em2kact/em2kact.adl
; VAR FUSELOC /designs/em2kact/em2kact.loc
```

```
; VAR FUSEEXTRA 1
; VAR FUSALLLATE 1
; VAR MODLIB /actel/modlib.lib.
; ENDHEADER
X03110b0b0b1012
X0b110b010b1012
X0b120b030b1012
X03110b09131112
X0b110b06131112
X0b120b06131112
X030e0b0b050e0f
X0b0f0b07050e0f
X03130b0b061113
X0b110b03061113
X0b120b01061113
X030d0b09060d0e
X0b0e0b06060d0e
X03140b0b131314
X0b130b01131314
X03150b0b081516
X0b160b03081516
X03100b0b180c16
X0b130b00180c16
X03100b09080a14
X0b0d0b01080a14
X0b0e0b01080a14
X030a0b0c180a0b
X0b0a0b04180a0b
X0b0b0b04180a0b
X03180b0b0d1618
X0b160b010d1618
X0b170b010d1618
X0b180b030d1618
X03080b0b0e0810
X0b0c0b070e0810
X03080b0c180809
X0b080b00180809
X0b090b00180809
X03070b0b100708
X0b080b01100708
X03190b0b08191a
X0b1a0b0308191a
X0b1a0b0508191a
X03170b080e111a
X0b140b070e111a
X0b150b070e111a
X0b170b070e111a
X0b190b070e111a
X030b0b0c12060f
X0b0f0b0412060f
X03160b0801101b
X0b100b0701101b
X0b110b0701101b
X0b160b0701101b
X0b180b0701101b
X031b0b0c071a1b
X0b1a0b07071a1b
X03050b0c100506
X0b060b07100506
X031c0b0c081b1c
X0b1c0b01081b1c
X03040b0b0e0405
X0b050b010e0405
X030f0b0b000e1d
X0b1a0b01000e1d
X0b1b0b01000e1d
X03130b09020c1f
X0b120b00020c1f
X0b140b06020c1f
X0b190b01020c1f
X0b1a0b00020c1f
X0b1b0b00020c1f
X0b1e0b07020c1f
X0b1f0b06020c1f
X031f0b09071e1f
X0b1e0b00071e1f
X031b0b0b100b20
X0b120b07100b20
X0b140b01100b20
X0b190b06100b20
X0b1b0b05100b20
X0b1b0b07100b20
X0b1f0b01100b20
X03040b0a06000a
X0b040b0106000a
X0b080b0306000a
X0b090b0106000a
X0b0a0b0606000a
X03080b0a0b0009
X0b050b030b0009
X0b070b010b0009
X0b090b060b0009
X03030b0c0e0003
X0b020b070e0003
X031a0b08111721
X0b1a0b06111721
X0b1b0b06111721
X0b200b06111721
X0b210b06111721
X03200b0b182021
X0b200b01182021
X0b210b05182021
X03230b0b002123
X0b210b07002123
X03220b0b182223
X0b230b01182223
X03230b09102324
X0b230b00102324
X0b240b00102324
X03250b0b112526
X0b250b01112526
X0b260b05112526
X03270b09092627
X0b270b07092627
X03230b0801222b
X0b230b0701222b
X0b250b0701222b
X0b280b0701222b
X0b170b0603002b
X0b180b0603002b
X0b000b0004002b
X0b000b0104002b
X0b000b0204002b
X0b000b0304002b
X0b010b0004002b
X0b010b0104002b
X0b010b0504002b
X0b020b0004002b
X0b020b0104002h
X0b020b0204002b
X0b020b0404002b
X0b020b0504002b
X0b030b0104002b
X0b030b0204002b
X0b030b0504002b
X0b030b0704002b
X0b040b0404002b
X0b040b0504002b
X0b040b0604002b
X0b040h0704002h
X0b050b0004002b
X0b050b0204002b
X0b050b0404002b
X0b050b0504002b
X0b050b0604002b
X0b050b0704002b
X0b060b0004002b
X0b060b0104002b
X0b060b0204002b
X0b060b0404002b
X0b060b0504002b
X0b070b0004002b
X0b070b0504002b
X0b070b0604002b
X0b080b0404002b
X0b080b0504002b
X0b080b0604002b
X0b080b0704002b
X0b090b0304002b
X0b090b0404002b
X0b090b0504002b
X0b090b0704002b
X0b0a0b0104002b
X0b0a0b0204002b
X0b0a0b0304002b
X0b0a0b0504002b
X0b0a0b0704002b
X0b0b0b0104002b
X0b0b0b0204002b
X0b0b0b0304002b
X0b0b0b0504002b
X0b0b0b0604002b
X0b0b0b0704002b
X0b0c0b0004002b
X0b0c0b0104002b
X0b0c0b0204002b
X0b0c0b0304002b
X0b0c0b0504002b
X0b0c0b0604002b
X0b0d0b0004002b
X0b0d0b0204002b
X0b0d0b0304002b
X0b0d0b0404002b
X0b0d0b0604002b
X0b0d0b0704002b
X0b0e0b0304002b
X0b0e0b0504002b
X0b0e0b0704002b
X0b0f0b0104002b
X0b0f0b0204002b
X0b0f0b0304002b
X0b0f0b0504002b
X0b0f0b0604002b
X0b100b0004002b
X0b100b0104002b
X0b100b0204002b
X0b100b0304002b
X0b100b0504002b
X0b100b0604002b
X0b110b0004002b
X0b110b0204002b
X0b110b0504002b
X0b120b0204002b
X0b120b0504002b
X0b130b0204002b
X0b130b0404002b
X0b130b0504002b
X0b130b0604002b
X0b130b0704002b
X0b140b0004002b
X0b140b0204002b
X0b140b0304002b
X0b150b0004002b
X0b150b0104002b
X0b150b0204002b
X0b150b0304002b
X0b150b0604002b
X0b160b0004002b
X0b160b0204002h
X0b160b0604002b
X0b170b0004002b
X0b170b0204002b
X0b170b0304002b
X0b180b0004002b
X0b180b0204002b
X0b190b0004002b
X0b190b0204002b
X0b190b0304002b
X0b1b0b0304002b
X0b1b0b0404002b
X0b1c0b0304002b
X0b1c0b0404002b
X0b1c0b0604002b
X0b1c0b0704002b
X0b1d0b0304002b
X0b1d0b0404002b
X0b1d0b0604002b
X0b1d0b0704002b
X0b1e0b0304002b
X0b1e0b0404002b
X0b1e0b0604002b
X0b1f0b0004002b
X0b1f0b0204002b
X0b1f0b0304002h
X0b1f0b0404002b
X0b1f0b0704002b
X0b200b0404002b
X0b200b0704002b
X0b210b0004002b
X0b210b0204002b
X0b220b0004002b
X0b220b0104002b
X0b220b0204002b
X0b220b0304002b
X0b220b0404002b
X0b220b0504002b
X0b220h0604002b
X0b220b0704002b
X0b230b0504002b
X0b230b0604002b
X0b240b0104002b
X0b240b0304002b
X0b240b0504002h
X0b250b0004002b
X0b250h0204002h
X0b260b0004002b
X0b260h0204002b
X0b270b0104002b
X0b270b0404002b
X0b?70b0504002b
X0b280b0004002b
X0b280b0104002b
X0b280b0204002b
X0b280b0504002b
X0b290b0004002b
X0b290b0104002b
X0b290b0204002b
X0b290b0504002b
X0b2a0b0004002b
X0b2a0b0104002b
X0b2a0b0504002b
X03240b0a08212b
X0b230b0308212b
X0b240b0608212b
X0b250b0608212b
X0b260b0608212b
X0b010b060c002b
X0b020b060c002b
X0b030b040c002b
X0b030b060c002b
X0b1e0b050c002b
X0b1f0b050c002b
X0b200b020c002b
X0b200b030c002b
X0b210b030c002b
X0b210b040c002b
X0b230b020c002b
X0b230b040c002b
X0b240b020c002b
X0b240b040c002b
X0b250b030c002b
X0b250b040c002b
X0h260b030c002b
X0b260b040c002b
X0b270b020c002b
X0b270b060c002b
X0b280b040c002b
X0b280b060c002b
X0b290b040c002h
X0b290b060c002b
X0b2a0b060c002b
X0b2b0b090c002b
X0b2b0b0a0c002b
X0b2b0b0b0c002b
X0b2b0b0c0c002b
X031f0b0c0e1e2b
X0b200b050e1e2b
X0b210b010e1e2b
X0b250b050e1e2b
X0b260b010e1e2b
X03240b0b0f1a2b
X0b1a0b040f1a2b
X0b1b0b020f1a2b
X03250b0818242b
X0b170a03081718
X0b180a03081718
X030e0a090e0810
X0b080a000e0810
X0b0a[illegible]020e0810
X0b0a0a040e0810
X03090a0c180809
X0b080a04180809
X0b090a00180809
X03070a09100708
X0b070a01100708
X0b080a03100708
X03190a090e111a
X0b140a030e111a
X0b190a030e111a
X03090a0b12060f
X0b0d0a0412060f
X0b0d0a0512060f
X0b0e0a0112060f
X031a0a0a01101b
X0b100a0001101b
X0b140a0001101b
V021c0a00
X031a0a09181a1c
X0a1c0a00181a1c
V02040a00
V021d0a00
X03060a0c080406
X0b040a03080406
X031d0a0a000e1d
X0b110a00000e1d
X0b150a00000e1d
X031d0a0b071e1d
X0b1d0a05071e1d
X0b050a0009000b
X0b050a0109000b
X0b090a0109000b
X03030a090b0009
X0b020a050b0009
X0b030a010b0009
X0a040a000b0009
X0b060a020b0009
X0b090a030b0009
X030f0a0b0d0013
X0b060a070d0013
X0b0b0a010d0013
X0b0c0a010d0013
X0b0f0a060d0013
X0b120a010d0013
X0b130a010d0013
X03020a0c0e0003
X0b020a030e0003
X030b0a0b110011
X0b080a02110011
X03000a05120002
X0b010a05120002
X030c0a0a13000d
X0a030a0013000d
X0b050a0613000d
X0b0a0a0713000d
X031f0a0b011f21
X0b1f0a00011f21
X0b210a00011f21
X03170a0a111721
X0b1b0a05111721
X0b1c0a06111721
X0b200a07111721
X0b210a07111721
X0b010a0404002b
X0b020a0404002b
X0b020a0604002b
X0b020a0704002b
X0b030a0404002b
X0b030a0504002b
X0b030a0704002b
X0b040a0204002b
X0b040a0704002b
X0b050a0204002b
X0b050a0504002b
X0b050a0704002b
X0b060a0104002b
X0b060a0304002b
X0b060a0404002b
X0b060a0604002b
X0b070a0004002b
X0b070a0404002h
X0b070a0504002b
X0b070a0704002h
X0b080a0504002b
X0b080a0704002h
X0b090a0404002b
X0b090a0504002b
X0b090a0704002b
X0b0a0a0104002b
X0b0a0a0304002b
X0b0a0a0504002b
X0b0b0a0204002b
X0b0b0a0304002b
X0b0b0a0704002b
X0b0c0a0304002b
X0b0c0a0404002b
X0b0c0a0604002b
X0b170a0204002b
X0b170a0504002b
X0b170a0604002b
X0b170a0704002h
X0b180a0204002b
X0b180a0604002h
X0b180a0704002b
X0b190a0204002h
X0b190a0504002h
X0b190a0604002b
X0b190a0704002b
X0b1a0a0004002b
X0b1a0a0204002b
X0b1a0a0404002b
X0b1a0a0504002b
X0b1a0a0604002b
X0b1b0a0004002b
X0b1b0a0204002b
X0b1b0a0404002b
X0b1b0a0604002b
X0b1b0a0704002b
X0b1c0a0204002b
X0b1c0a0504002b
X0b1c0a0704002b
X0b1d0a0204002b
X0b1d0a0704002h
X0b1e0a0204002b
X0b1e0a0504002b
X0b1e0a0604002b
X0b1e0a0704002b
X0b1f0a0204002b
X0b1f0a0504002b
X0b1f0a0704002b
X0b200a0204002b
X03210a0c05122b
X0b130a0605122b
X0b140a0105122b
X0b160a0105122b
X0b180a0105122b
X0b1b0a0105122h
X0b1d0a0105122b
X03150a0a06142b
X0b160a0506142b
X0b1a0a0706142b
X0b1d0a0606142b
X0b200a0606142b
X0b210a0106142b
X03210a0908212b
X0b270a0108212b
X032b0a040a002h
X0b010a070a002b
X0b230a070a002b
X0b260a070a002b
X03180a0a0h162h
X0b180a050b162b
X0b1a0a010b162b
X0a1d0a000b162b
X0a200a000b162b
X0b010a060c002b
X0b020a020c002b
X0b030a020c002b
X0b040a040c002b
X0b050a040c002b
X0b060a050c002b
X0b070a060c002b
X0b090a020c002b
X0b0c0a020c002b
X0b0d0a020c002b
```

X0b040b020c002b
X0b040b030c002b
X0b060b060c002b
X0b070b030c002b
X0b080b020c002b
X0b090b020c002b
X0b0c0b040c002b
X0b0d0b050c002b
X0b0e0b000c002b
X0b0e0b020c002b
X0b0e0b040c002b
X0b100b040c002b
X0b110b040c002b
X0b120b040c002b
X0b130b030c002b
X0b140b040c002b
X0b140b050c002b
X0b150b040c002b
X0b150b050c002b
X0b160b040c002b
X0b160b050c002b
X0b170b040c002b
X0b170b050c002b
X0b180b040c002b
X0b180b050c002b
X0b190b040c002b
X0b190b050c002b
X0b1a0b020c002b
X0b1c0b020c002b
X0b1c0b050c002b
X0b1d0b020c002b
X0b1d0b050c002b
X0b1e0b020c002b
X0b230a040c002b
X0b240a040c002b
X0b250a040c002b
X0b260a040c002b
X0b270a030c002b
X0b270a040c002b
X0b280a030c002b
X0b280a040c002b
X0b290a040c002b
X0b2a0a060c002b
X0b2b0a0b0c002b
X0b2b0a0c0c002b
X03270a0a0f1a2b
X0b1b0a030f1a2b
X03180a0814182b
X0b220a0014182b
X0b250a0714182b
X0b260a0114182b
X03290a0c15292b
X0b2b0a0915292b
X0310090a051011
X0b100900051011
X0b110900051011
V020f0901
X030f0909060f10
X0b0f0903060f10
X0b0f0905060f10
X0b100901060f10
X0312090c131112
X0b110901131112
V02130901
X030e090a050e0f
X0b0e0900050e0f
X0b0f0900050e0f
X0312090a111213
X0b120900111213
X0b130900111213
X03130909131314
X0b130905131314
V020c0901
V02150901

X0b240b0718242b
X0b260b0718242b
X0b290b0718242b
X03100a09051011
X0b100a01051011
V020f0a00
V02130a00
X030e0a0c050e0f
X0a0f0a00050e0f
X03120a09111213
X0b120a05111213
X0b130a05111213
X03130a09131314
X0b140a05131314
X03150a090b1315
X0b130a020b1315
X0b150a030b1315
V020b0a00
X030b0a09060b0c
X0b0b0a05060b0c
X0b0c0a05060b0c
X03160a0b180c16
X0b0c0a00180c16
X0b0d0a00180c16
X0b0d0a07180c16
X0b0e0a07180c16
V020a0a00
X030a0a0b080a14
X0b0d0a01080a14
X030c0a0b0b0a0c
X0a0a0a000b0a0c
X0a0b0a000b0a0c
X03170a09081718
X03180909071819
X0b180901071819
X0b190903071819
V021a0901
X0307090b100708
X0b070900100708
X031a090c0e111a
X0b1209010e111a
X0306090a0e0607
X0b0609020e0607
X0b0709010e0607
X030809091206 0f
X0b060906120 60f
X0b080903120 60f
X0b0d09001206 0f
V021c0901
X0305090b000507
X0b070907000507
X03060909100506
X0b050900100506
X0b060900100506
X031b0909081b1c
X0b1b0901081b1c
X0b1c0903081b1c
X03050909080406
X0b040907080406
X030409090e0405
X0b0409010e0405
X0b0509010e0405
X0316090b000e1d
X0b140903000e1d
X0a150901000e1d
X0b160903000e1d
X0a170901000e1d
X0b180903000e1d
X0a190901000e1d
X0b1b0903000e1d
X0a1c0901000e1d
X031d0908071c1d
X0b1d0907071c1d
X031d0909081d1e

V02030a00
V021e0a00
X03040a0c120305
X0b030a06120305
X031e0a09081d1e
X0b1e0a01081d1e
X031b0a0a020c1f
X0b160a00020c1f
X0b170a00020c1f
X031c0a0913151f
X0b160a0313151f
X0b1c0a0313151f
V02200a00
X031c0a0a100b20
X0b180a00100b20
X0b190a00100b20
X03080a0a01000f
X0b030a0301000f
X0b050a0301000f
X0b070a0301000f
X0b080a0101000f
X030b0a0c05000b
X0b020a0105000b
X0b040a0105000b
X0b0b0a0405000b
X030a0a0a06000a
X0b020a0006000a
X0b060a0006000a
X03000a04080003
X0b010a03080003
X03050a0909000b
X0b040a0509000b
X0b040a0609000b
X0b170906100b20
X0b180906100b20
X0b190906100b20
X0b1b0906100b20
X0b1c0906100b20
V02210901
X03020909080003
X0b020901080003
X0b030901080003
X0308090a0b0009
X0b0209030b0009
X0b0309030b0009
X0b0409030b0009
X0b0509030b0009
X0b0809010b0009
X030009060e0003
X0b0109030e0003
X03000905100004
X0b010904100004
X03000907120002
X0b010905120002
X0320090b111721
X0b1a0904111721
X0b1b0904111721
X0b1c0904111721
X0b1d0904111721
X0b1e0904111721
V02220901
X0320090a022022
X0b200902022022
X0b220902022022
V02240901
X0323090a102324
X0b230902102324
X0b240902102324
V02250901
X0321090a151c25
X0a220901151c25
X0b230906151c25
X0a250901151c25
X0325090a112526

X03200a0c182021
X0b200a01182021
V02230a00
V02240a00
X03220a0c112224
X0b220a07112224
X0b230a01112224
X0b240a07112224
X03250a09112526
X0b250a00112526
X0b260a00112526
V02270a00
X03280a09152628
X0a270a00152628
X03220a0801222b
X0b220a0501222b
X0b230a0501222b
X0b240a0501222b
X0b250a0501222b
X0b260a0501222b
X03260a0902262b
X0b280a0002262b
X0b290a0002262b
X0b080a0603002b
X0b090a0603002b
X0b0a0a0603002b
X0b0b0a0603002b
X0b0e0a0603002b
X0b000a0004002b
X0b000a0104002b
X0b000a0204002b
X0b000a0304002b
X0b010a0004002b
X0b03090004002b
X0b03090504002b
X0b04090004002b
X0b04090204002b
X0b04090504002b
X0b05090504002b
X0b05090704002b
X0b06090104002b
X0b06090304002b
X0b06090404002b
X0b06090504002b
X0b06090704002b
X0b07090404002b
X0b07090504002b
X0b08090004002b
X0b08090204002b
X0b08090404002b
X0b08090504002b
X0b09090104002b
X0b09090304002b
X0b09090404002b
X0b09090504002b
X0b09090604002b
X0b09090704002b
X0b0a090004002b
X0b0a090204002b
X0b0a090404002b
X0b0a090504002b
X0b0a090604002b
X0b0a090704002b
X0b0b090404002b
X0b0b090504002b
X0b0b090704002b
X0b0c090304002b
X0b0c090404002b
X0b0c090704002b
X0b0d090104002b
X0b0d090304002b
X0b0d090404002b
X0b0d090604002b
X0b0d090704002b

X0b0c0a0704002b
X0b0e0a0204002b
X0b0e0a0504002b
X0b0f0a0504002b
X0b0f0a0704002b
X0b100a0204002b
X0b100a0504002b
X0b100a0604002b
X0b100a0704002b
X0b110a0104002b
X0b110a0204002b
X0b110a0304002b
X0b110a0504002b
X0b110a0604002b
X0b110a0704002b
X0b120a0004002b
X0b120a0204002b
X0b120a0304002b
X0b120a0404002b
X0b120a0604002b
X0b120a0704002b
X0b130a0304002b
X0b130a0704002b
X0b140a0204002b
X0b140a0604002b
X0b140a0704002b
X0b150a0204002b
X0b150a0504002b
X0b150a0604002b
X0b150a0704002b
X0b160a0204002b
X0b160a0604002b
X0b160a0704002b
X0b15090704002b
X0b16090004002b
X0b16090504002b
X0b17090004002b
X0b17090204002b
X0b17090404002b
X0b17090504002b
X0b17090704002b
X0b18090404002b
X0b18090504002b
X0b18090704002b
X0b19090004002b
X0b19090504002b
X0b1a090204002b
X0b1a090304002b
X0b1a090604002b
X0b1b090204002b
X0b1b090504002b
X0b1c090204002b
X0b1c090504002b
X0b1d090204002b
X0b1d090504002b
X0b1e090204002b
X0b1e090504002b
X0b1f090304002b
X0b1f090704002b
X0b20090304002b
X0b20090404002b
X0b20090604002b
X0b20090704002b
X0b21090004002b
X0b21090204002b
X0b21090304002b
X0b21090604002b
X0b22090304002b
X0b22090504002b
X0b22090704002b
X0b23090104002b
X0b23090304002b
X0b23090404002b
X0b23090504002b

X0b200a0504002b
X0b210a0204002b
X0b210a0504002b
X0b210a0604002b
X0b220a0204002b
X0b220a0304002b
X0b230a0204002b
X0b230a0304002b
X0b230a0604002b
X0b240a0204002b
X0b240a0304002b
X0b240a0604002b
X0b250a0204002b
X0b250a0304002b
X0b250a0604002b
X0b260a0204002b
X0b260a0304002b
X0b260a0604002b
X0b270a0204002b
X0b270a0504002b
X0b270a0604002b
X0b270a0704002b
X0b280a0204002b
X0b280a0504002b
X0b280a0604002b
X0b280a0704002b
X0b290a0104002b
X0b290a0204002b
X0b290a0604002b
X0b2a0a0004002b
X0b2a0a0104002b
X0b2a0a0404002b
X0b2b0a0a04002b
X0b2b090a04002b
X0314090b06142b
X0b1f090606142b
X0b26090406142b
X0b27090606142b
X0a28090106142b
X0320090907202b
X0b24090407202b
X0b28090607202b
X0322090b08212b
X0b22090608212b
X0b24090608212b
X0b25090608212b
X0324090b0a002b
X0a0f09010a002b
X0b0409040c002b
X0b0509020c002b
X0b0509040c002b
X0b0709020c002b
X0b0709030c002b
X0b0b09020c002b
X0b0b09030c002b
X0b0c09020c002b
X0b0d09020c002b
X0b0d09050c002b
X0b0e09020c002b
X0b0f09020c002b
X0b1009020c002b
X0b1009030c002b
X0b1109020c002b
X0b1109030c002b
X0b1209020c002b
X0b1209030c002b
X0b1309020c002b
X0b1809020c002b
X0b1a09050c002b
X0b1d09030c002b
X0b1e09030c002b
X0b1f09050c002b
X0b2009050c002b
X0b2109040c002b

X0b0d0a030c002b
X0b0d0a060c002b
X0b0e0a000c002b
X0b0e0a030c002b
X0b0e0a040c002b
X0b0f0a020c002b
X0b0f0a030c002b
X0b0f0a040c002b
X0b100a030c002b
X0b100a040c002b
X0b110a040c002b
X0b130a040c002b
X0b140a040c002b
X0b150a040c002b
X0b160a040c002b
X0b170a040c002b
X0b180a040c002b
X0b190a040c002b
X0b1a0a030c002b
X0b1c0a040c002b
X0b1d0a030c002b
X0b1d0a040c002b
X0b1e0a030c002b
X0b1e0a040c002b
X0b1f0a030c002b
X0b1f0a040c002b
X0b1f0a060c002b
X0b200a030c002b
X0b200a040c002b
X0b210a030c002b
X0b210a040c002b
X0b220a040c002b
X0b220a060c002b
X0b100801060f10
X0311080b131112
X0b110803131112
X0b110805131112
X0b120801131112
X030f080a050e0f
X0b0e0802050e0f
X0b0f0800050e0f
X030e0809130e10
X0b100800130e10
V020d0800
X030c080b050c0d
X0b0c0803050c0d
X0b0c0805050c0d
X0b0d0801050c0d
X030c0809090c0e
X0b0d0804090c0e
X0b0e0801090c0e
X0313080b0b1315
X0b1308030b1315
X0b1508040b1315
X0315080b081516
X0b150802081516
X0b150803081516
X030a0809080a14
X03140808080a14
X0317080b071617
X0b170803071617
X0b170804071617
X0309080a10090a
X0b0a080010090a
X030a080b00080a
X0b08080700080a
X030c080c0e0810
X0b0908070e0810
X0308080c180809
X0b0908011180809
X0318080b071819
X0b180800071819
X0b180803071819
V02070800

X031409090d1415
X0b1409010d1415
X0b1509030d1415
X030b090a060b0c
X0b0b0900060b0c
X0b0c0900060b0c
V02170901
X030d090a080a14
X0b110906080a14
X030c09090b0a0c
X0b0a09030b0a0c
X0b0c09050b0a0c
X030b090c180a0b
X0b0b0901180a0b
X03160909071617
X0b160901071617
X0b170903071617
X0309090b02090b
X0b09090002090b
X0309090910090a
X0b0a090110090a
V02190901
X030b09080e0810
X0b0809070e0810
X0309090c180809
X0b090902180809

X0b1d0901081d1e
X0b1e0901081d1e
V021f0901
X031a090b020c1f
X031a0908020c1f
X0b120906020c1f
X0b130906020c1f
X0b1d0906020c1f
X0b1e0906020c1f
X031e0909071e1f
X0b1f0902071e1f
X031d090b13151f
X0b1a090713151f
X0b1b090713151f
X0b1c090713151f
X0b1e090713151f
X031d090c181d1f
X0a1f0901181d1f
V02010901
V02200901
X031f0909081f20
X0b1f0904081f20
X031e090b100b20
X0b140906100b20
X0b150906100b20
X0b160906100b20

X0b250902112526
X0b260902112526
V02270901
X0327090a092627
X0b270902092627
V02280901
X0327090901222b
X0b22090401222b
X0b02090603002b
X0b03090603002b
X0b04090603002b
X0b05090603002b
X0b07090603002b
X0b08090603002b
X0b0b090603002b
X0b0c090603002b
X0b0f090603002b
X0b10090603002b
X0b00090004002b
X0b00090104002b
X0b00090204002b
X0b00090304002b
X0b01090204002b
X0b01090604002b
X0b02090004002b
X0b02090504002b

X0b0e090104002b
X0b0e090304002b
X0b0e090404002b
X0b0e090504002b
X0b0e090604002b
X0b0e090704002b
X0b0f090404002b
X0b0f090704002b
X0b10090404002b
X0b10090504002b
X0b10090704002b
X0b11090404002b
X0b11090504002b
X0b11090704002b
X0b12090404002b
X0b12090504002b
X0b12090704002b
X0b13090304002b
X0b13090404002b
X0b13090704002b
X0b14090004002b
X0b14090504002b
X0b15090004002b
X0b15090204002b
X0b15090404002b
X0b15090504002b

X0b23090704002b
X0b24090304002b
X0b24090504002b
X0b24090704002b
X0b25090304002b
X0b25090404002b
X0b25090504002b
X0b25090704002b
X0b26090104002b
X0b26090304002b
X0b26090504002b
X0b26090704002b
X0b27090304002b
X0b27090404002b
X0b27090704002b
X0b28090304002b
X0b28090404002b
X0b28090704002b
X0b29090104002b
X0b29090404002b
X0b29090504002b
X0b29090704002b
X0b2a090004002b
X0b2a090104002b
X0b2a090504002b
X0b2b090904002b

X0b2109050c002b
X0b2709050c002b
X0b2809020c002b
X0b2809050c002b
X0b2909020c002b
X0b2909060c002b
X0b2a09060c002b
X0b2b090b0c002b
X0b2b090c0c002b
X0321090c0e1c2b
X0b1f09000e1c2b
X0b2209000e1c2b
X0b2409000e1c2b
X0b2609000e1c2b
X0329090a15292b
X0b29090015292b
X0320090817002b
X0a01090117002b
X0b01090717002b
X0b18090017002b
X0b21090717002b
X0a24090117002b
X0b26090617002b
X030f080b060f10
X0b0f0803060f10
X0b0f0805060f10

V021a0800
X031308090e111a
X0b1408010e111a
X0b1508000e111a
X0b1708000e111a
X0b1808060e111a
V02060800
V021b0800
X0306080b0e0607
X0b0608030e0607
X0b0608050e0607
X0b0708010e0607
X030c080a12060f
X0b0b080212060f
X0b0c080012060f
X0b0e080712060f
V02050800
V021c0800
X0305080a100506
X0b050802100506
X0b060802100506
X031c0808181a1c
X0b1a0806181a1c
X0b1b0806181a1c
V021d0800
X0304080b0e0405

X0b0408030e0405
X0b0408050e0405
X0b0508010e0405
V021e0800
X03030809120305
X0b040806120305
X031e080c011c1e
X0b1c0806011c1e
X0b1d0806011c1e
X0b1e0806011c1e
V02010800
V02200800
X031f080a081f20
X0b1f0800081f20
X0b200802081f20
X0313080a100b20
X0b0b0807100b20
X0b0e0804100b20
X0b120802100b20
X0b130800100b20
X030a080806000a
X0b05080606000a
X0b06080606000a
X0b0a080206000a
X0312080b070015
X0b0a0801070015
X0b0b0801070015
X0b0b0804070015
X030108090b0009
X030808080b0009
X030d08090d0013
X0b0408010d0013
X0b0608010d0013
X0b0b08000d0013
X0b0c08010d0013
X0b0e08000d0013
X0b0f08010d0013
X0b1108010d0013
X0b1208000d0013
X0304080a110011
X03100808110011
X0b0d0806110011
X03000804120002
X0b010804120002
X0311080a140017
X0b0a0806140017
X0b100804140017
X0b110800140017

X0326080a092627
X0b260800092627
X0b270802092627
X0327080c102527
X0b260807102527
V02280800
X0327080b152628
X0a280800152628
X0329080a02262b
X0b26080102262b
X0b27080102262b
X0b29080302262b
X0b0b080603002b
X0b0c080603002b
X0b0e080603002b
X0b0f080603002b
X0b10080603002b
X0b11080603002b
X0b12080603002b
X0b13080603002b
X0b28080603002b
X0b29080603002b
X0b00080004002b
X0b00080104002b
X0b00080204002b
X0b00080304002b
X0b01080104002b
X0b01080204002b
X0b01080604002b
X0b02080004002b
X0b02080104002b
X0b02080404002b
X0b03080004002b
X0b03080104002b
X0b03080404002b
X0b04080004002b
X0b04080204002b
X0b04080404002b
X0b04080704002b
X0b05080404002b
X0b05080504002b
X0b05080704002b
X0b06080404002b
X0b06080704002b
X0b07080204002b
X0b07080504002b
X0b07080604002b
X0b07080704002b

X0b0f080704002b
X0b10080504002b
X0b10080704002b
X0b11080404002b
X0b11080704002b
X0b12080504002b
X0b12080704002b
X0b13080404002b
X0b13080504002b
X0b13080704002b
X0b14080004002b
X0b14080304002b
X0b14080404002b
X0b14080504002b
X0b14080704002b
X0b15080504002b
X0b15080704002b
X0b16080004002b
X0b16080104002b
X0b16080304002b
X0b16080404002b
X0b16080504002b
X0b17080204002b
X0b17080504002b
X0b17080704002b
X0b18080404002b
X0b18080504002b
X0b18080704002b
X0b19080004002b
X0b19080104002b
X0b19080304002b
X0b19080404002b
X0b19080504002b
X0b1a080104002b
X0b1a080204002b
X0b1a080304002b
X0b1a080404002b
X0b1a080504002b
X0b1a080704002b
X0b1b080104002b
X0b1b080204002b
X0b1b080404002b
X0b1c080204002b
X0b1c080404002b
X0b1c080504002b
X0b1c080704002b
X0b1d080104002b
X0b1d080204002b

X0b21080104002b
X0b21080204002b
X0b21080304002b
X0b21080404002h
X0b21080604002b
X0b22080104002b
X0b22080304002b
X0b22080404002b
X0b23080104002b
X0b23080404002b
X0b24080404002b
X0b24080504002b
X0b25080404002b
X0b25080504002b
X0b25080704002b
X0b26080304002b
X0b26080404002b
X0b27080404002b
X0b27080504002b
X0b27080704002b
X0b28080104002b
X0b28080304002b
X0b28080504002b
X0b28080704002b
X0b29080404002b
X0b29080504002b
X0b29080704002b
X0b2a080004002b
X0b2a080104002b
X0b2a080404002b
X0b2b080904002b
X0b2b080a04002b
X0b2b080c04002b
X0328080b09282b
X0b29080109282b
X0320080c0a002b
X0a0108000a002b
X0b1908070a002b
X0b1c08010a002b
X0b2108070a002b
X0b2208070a002b
X0b0208060c002b
X0b0308060c002b
X0b0508030c002b
X0b0708030c002b
X0b0708040c002b
X0b0808030c002b
X0b0808040c002b

X0b1708060c002b
X0b1808010c002b
X0b1808020c002b
X0b1908060c002b
X0b1c08030c002b
X0b1f08050c002b
X0b2108050c002b
X0b2208050c002b
X0b2608050c002b
X0b2908020c002b
X0b2a08060c002b
X0b2b080b0c002b
X031e080b0d1c2b
X0b1f08060d1c2b
X0b2008060d1c2b
X0b2208060d1c2b
X0b2308060d1c2b
X0b2408060d1c2h
X0b2508060d1c2b
X0b2608060d1c2b
X0b2708060d1c2b
X0328080c0e1c2b
X0b1f08020e1c2b
X0a2008000e1c2b
X0b2208020e1c2b
X0a2308000e1c2b
X0b2408020e1c2b
X0a2508000e1c2b
X0b2608020e1c2b
X0a2708000e1c2b
X0328080a10282b
X0b28080210282b
X0b28080410282b
X0b29080010282b
X0310080912102b
X0b10080212102b
X0b12080412102b
X0b24080112102b
X0324080818242b
X0b24080318242b
X0b25080318242b
X0b27080318242b
V02110701
V020f0701
X030e070c050e0f
X0b0e0700050e0f
X0311070c061113
X0b110702061113

V020a0701
X0310070b080a14
X0b0a0706080a14
X0b0c0705080a14
X0b0f0703080a14
X0b100701080a14
X030a070c180a0b
X0b0a0702180a0b
X0316070c071617
X0b160700071617
X0309070c10090a
X0b09070210090a
X03180709081718
X0b180704081718
V02080701
X030b070b0e0810
X0b0807070e0810
X0308070b180809
X0b090706180809
X0319070c071819
X0b190700071819
X0307070a100708
X0a080701100708
X0318070b09181a
X0b1a070209181a
X0312070b0e111a
X0b1107030e111a
X0b1207000e111a
X0b1207010e111a
X0b1807030e111a
V02060701
X030d070b12060f
X0b06070512060f
X0b07070012060f
X0b0b070012060f
X0b0c070312060f
X0b0d070112060f
X0310070c01101b
X0b10070201101b
X0b14070501101b
X0b18070201101b
X031b0709071a1b
X0b1a0704071a1b
V021c0701
X031b070c081b1c
X0b1b0700081b1c
V02040701
X030f070c000e1d

X0b170706100b20
X0b180706100b20
X0305070b070015
X0b040703070015
X0b050701070015
X0b070707070015
X0b0d0700070015
X0b110700070015
X0b110705070015
X0b150703070015
X0307070b0b0009
X0b0407050b0009
X0b0607030b0009
X0b0707010b0009
X0301070a180007
X03070708180007
X0321070b011f21
X0b1f0704011f21
X0317070b111721
X0b1c0702111721
X0321070a182021
X0b210707182021
X03220708022022
X0b200701022022
X0b210704022022
X0b220704022022
X0322070b102122
X0b220707102122
V02240701
V02250701
X0325070c092425
X0b250706092425
V02270701
X03270709092627
X0b270706092627
X0324070801222b
X0b24070501222b
X0b25070501222b
X0b27070501222b
X0b29070401222b
X0329070b02262b
X0b26070002262b
X0b04070603002b
X0b05070603002b
X0b06070603002b
X0b07070603002b
X0b0c070603002b
X0b0d070603002b

X03210808111721
X0a1a0800111721
X0a1c0800111721
X0b1f0807111721
V02230800
X031f080b091b23
X0a1b0800091b23
X0a1d0800091b23
X0a1e0800091b23
X0322080a182223
X0b220800182223
X0b230802182223
V02250800
X0324080a092425
X0b240800092425
X0b250802092425
X0326080c002426
X0b240807002426
V02270800
X0b08080004002b
X0b08080204002b
X0b08080504002b
X0b08080604002b
X0b09080004002b
X0b09080204002b
X0b09080304002b
X0b09080404002b
X0b09080604002b
X0b0a080404002b
X0b0a080504002b
X0b0a080704002b
X0b0b080504002b
X0b0c080404002b
X0b0c080704002b
X0b0d080504002b
X0b0d080704002b
X0b0e080504002b
X0b0f080404002b
X0b1d080304002b
X0b1d080404002b
X0b1d080504002b
X0b1d080704002b
X0b1e080104002b
X0b1e080204002b
X0b1e080304002b
X0b1e080404002b
X0b1e080504002b
X0b1e080704002b
X0b1f080104002b
X0b1f080304002b
X0b1f080404002b
X0b20080104002b
X0b20080304002b
X0b20080404002b
X0b20080504002b
X0b20080704002b
X0b21080004002b
X0b0908050c002b
X0b0a08030c002b
X0b0b08030c002b
X0b0c08020c002b
X0b0d08020c002b
X0b0d08030c002b
X0b0e08030c002b
X0b0f08020c002b
X0b1008030c002b
X0b1108020c002b
X0b1208030c002b
X0b1308010c002b
X0b1308020c002b
X0b1408060c002b
X0b1508010c002b
X0b1508060c002b
X0b1608060c002b
X0b1608070c002b
X0b1708010c002b
X0b110704061113
X0b130703061113
X0312070c111213
X0b120702111213
X0b120704111213
V02140701
X030f070a0b0d0f
X0b0d07070b0d0f
X0b0f07050b0d0f
X0314070c131314
X0b140702131314
V020c0701
X0315070b0d1415
X0b1507020d1415
V020b0701
X03150709081516
X0b150704081516
X03110709180c16
X0b140703180c16
X0b0f0700000e1d
X0b170703000e1d
X031c070b071c1d
X0b1c0704071c1d
X031d0708081d1e
X0b1d0701081d1e
X0313070b020c1f
X0b1f0702020c1f
X0317070913151f
X0b15070713151f
X0b18070713151f
X0b1a070713151f
X0b1c070713151f
X0b1f070713151f
X0320070c081f20
X0b200700081f20
X03140708100b20
X0b130706100b20
X0b150706100b20
X0b0f070603002b
X0b10070603002b
X0b11070603002b
X0b12070603002b
X0b00070004002b
X0b00070104002b
X0b00070204002b
X0b00070304002b
X0b01070004002b
X0b01070104002b
X0b01070504002b
X0b02070004002b
X0b02070104002b
X0b02070504002b
X0b03070004002b
X0b03070104002b
X0b03070504002b
X0b04070004002b
X0b05070004002b
X0b05070504002b
X0b06070004002b
X0b07070404002b
X0b07070504002b
X0b08070304002b
X0b08070404002b
X0b08070604002b
X0b09070104002b
X0b09070304002b
X0b09070404002b
X0b09070504002b
X0b09070704002b
X0b0a070304002b
X0b0a070404002b
X0b0a070704002b
X0b0b070304002b
X0b0b070404002b
X0b0b070604002b
X0b0b070704002b
X0b0c070404002b
X0b0c070704002b
X0b0d070404002b
X0b0d070504002b
X0b0e070104002b
X0b0e070304002b
X0b0e070404002b
X0b0e070504002b
X0b0e070604002b
X0b0e070704002b
X0b0f070404002b
X0b0f070704002b
X0b10070404002b
X0b10070504002b
X0b10070704002b
X0b11070704002b
X0b12070504002b
X0b12070704002b
X0b13070404002b
X0b13070504002b
X0b13070704002b
X0b14070404002b
X0b14070704002b
X0b15070504002b
X0b16070104002b
X0b16070304002b
X0b16070404002b
X0b16070604002b
X0b16070704002b
X0b17070004002b
X0b17070504002b
X0b18070504002b
X0b19070404002b
X0b19070504002b
X0b19070604002b
X0b19070704002b
X0b1e070504002b
X0b1e070704002b
X0b1f070104002b
X0b1f070304002b
X0b1f070504002b
X0b1f070604002b
X0b20070404002b
X0b20070504002b
X0b20070704002b
X0b21070104002b
X0b21070204002b
X0b21070304002b
X0b21070504002b
X0b21070604002b
X0b22070104002b
X0b22070204002b
X0b22070304002b
X0b22070504002b
X0b22070604002b
X0b23070104002b
X0b23070404002b
X0b23070504002b
X0b23070704002b
X0b24070304002b
X0b24070404002b
X0b24070604002b
X0b24070704002b
X0b25070304002b
X0b25070704002b
X0b26070104002b
X0b26070304002b
X0b26070404002b
X0b26070504002b
X0b26070604002b
X0b26070704002b
X0b27070304002b
X0b27070404002b
X0b28070004002b
X0b28070204002b
X0b28070404002b
X0b28070504002b
X0b29070104002b
X0b29070204002b
X0b29070304002b
X0b29070504002b
X0b29070604002b
X0b29070704002b
X0b2a070104002b
X0b2a070404002b
X0b2a070504002b
X0b2a070704002b
X0b2b070904002b
X0b2b070c04002b
X0314070906142b
X0b15070006142b
X0b0507030c002b
X0b0707020c002b
X0b0707030c002b
X0b0807020c002b
X0b0807050c002b
X0b0907000c002b
X0b0a07000c002b
X0b0a07050c002b
X0b0b07020c002b
X0b0b07050c002b
X0b0c07020c002b
X0b0d07020c002b
X0b0d07030c002b
X0b0e07020c002b
X0b0f07020c002b
X0b1007000c002b
X0b1007030c002b
X0b1207030c002b
X0b1307000c002b
X0b1307010c002b
X0b1307020c002b
X0b1407060c002b
X0b1507010c002b
X0b1607020c002b
X0b1607050c002b
X0b1707010c002b
X0b1807010c002b
X0b1907020c002b
X0b1907030c002b
X0b1a07030c002b
X0b1a07060c002b
X0b1b07020c002b
X0b1b07060c002b
X0b1c07050c002b
X0b1d07020c002b
X0b1d07050c002b
X0b1d07060c002b
X0b1e07030c002b
X0b1e07060c002b
X0b2007020c002b
X0b2007030c002b
X0b2007060c002b
X0b2307020c002b
X0b2307060c002b
X0b2407020c002b
X0b2607020c002b
X0b2707020c002b
X0b2807030c002b
X0b2807070c002b
X0b2a07020c002b
X0b2a07060c002b
X0b2b070a0c002b
X0b2b070b0c002b
X031d070c14182b
X0b19070114182b
X0b28070118242b
X0b29070018242b
X0b2a070018242b
V02110600
X03110609051011
X0b100605051011
X0b110601051011
V02120600
X030e060c130e10
X0b100602130e10
V020d0600
V02140600
X030d060a060d0e
X0b0d0605060d0e
X0313060c091214
X0b130600091214
X0b140602091214
X03130609131314
X0b130602131314
X0a140600131314
V020e0600
X030d060c050c0d
X0b0c0606050c0d
X030b060c060b0c
X0a0c0600060b0c
X0315060c081516
X0b150604081516
X0b160600081516
X030e060b180c16
X0b0e0606180c16
X0b0f0606180c16
X0b110606180c16
X0b120606180c16
X030d060b080a14
X0b0a0602080a14
X0b0b0600080a14
X0b0e0600080a14
X0316060c091517
X0b150602091517
X0b150607091517
X0b160607091517
V02080600
X0308060a0e0810
X0b1006030e0810
X0319060c071819
X0b180602071819
X0b180607071819
X0b190601071819
X0319060b181719
X0b180601181719
X0b190607181719
V02070600
X0307060c100708
X0a080600100708
X0318060c09181a
X0b1b0607071a1b
X031a060c0d191b
X0b1a06040d191b
X0b1b06000d191b
X03060609100506
X0b050601100506
X0b060603100506
X031d060c000e1d
X03180608000e1d
X0b1c0602000e1d
X031c060c071c1d
X0b1c0604071c1d
X0b1d0600071c1d
X031c0608011c1e
X0b1d0607011c1e
X0b1e0600011c1e
X031f060b071e1f
X0b1f0607071e1f
X0317060913151f
X0b15060013151f
X0b18060013151f
X0b1a060013151f
X0b1c060013151f
X0b1f060013151f
X031d0608181d1f
X0b1d0601181d1f
X0b1e0607181d1f
X0b1f0601181d1f
X031f060c081f20
X0b1f0604081f20
X0b200600081f20
X0309060c06000a
X0b07060706000a
X0b08060106000a
X0b09060106000a
X0b0a060306000a
X03140608070015
X0b090606070015
X0b0a0606070015
X0b100606070015
X030a060c09000b
X0b07060109000b
X0b08060709000b
X0b09060709000b
X0b0a060109000b
X0b0b060709000b
X03020609120002
X0b010601120002
X0b020603120002
X0316060a140017
X030a0608140017
X03210609111721
X03170608111721
V02230600
X0320060b091b23
X0b250607151c25
X0326060b112526
X0b260600112526
X0327060c092627
X0b270601092627
X0327060a102527
X0b250606102527
X0b260606102527
X0b270607102527
X0328060b152628
X0b270603152628
X0b270605152628
X0b15060603002b
X0b16060603002b
X0b18060603002b
X0b19060603002b
X0b1a060603002b
X0b1b060603002b
X0b1c060603002b
X0b1d060603002b
X0b1f060603002b
X0b20060603002b
X0b23060603002b
X0b24060603002b
X0b29060603002b
X0b2a060603002b
X0b00060104002b
X0b00060204002b
X0b00060304002b
X0b01060004002b
X0b01060304002b
X0b01060404002b
X0b01060704002b
X0b02060004002b
X0b02060404002b
X0b02060704002b
X0b03060004002b
X0b03060104002b
X0b03060304002b
X0b03060404002b
X0b03060504002b
X0b03060704002b
X0b04060004002b
X0b04060104002b
X0b04060404002b
X0b05060004002b
X0b05060304002b
X0b05060404002b
X0b05060704002b
X0b06060004002b
X0b06060404002b
X0b06060704002b
X0b07060204002b
X0b07060504002b
X0b07060604002b
X0b0c060104002b
X0b0c060204002b
X0b0c060304002b
X0b0c060504002b
X0b0c060704002b
X0b0d060204002b
X0b0d060304002b
X0b0d060604002b
X0b0d060704002b
X0b0e060104002b
X0b0e060404002b
X0b0f060104002b
X0b0f060304002b
X0b0f060404002b
X0b0f060504002b
X0b0f060704002b
X0b10060404002b
X0b10060704002b
X0b11060404002b
X0b11060504002b
X0b11060704002b
X0b12060404002b
X0b12060504002b
X0b12060704002b
X0b13060104002b
X0b13060304002b
X0b13060404002b
X0b13060504002b
X0b13060704002b
X0b14060104002b
X0b14060304002b
X0b14060404002b
X0b14060504002b
X0b14060704002b
X0b15060304002b
X0b16060104002b
X0b16060304002b
X0b16060404002b
X0b17060004002b
X0b17060104002b
X0b17060304002b
X0b17060404002b
X0b17060504002b
X0b17060704002b
X0b18060304002b
X0b19060404002b
X0b19060504002b
X0b1a060104002b
X0b1a060304002b
X0b1a060504002b
X0b1b060304002b
X0b1b060404002b
X0b1c060104002b
X0b1d060304002b
X0b1d060404002b

X0b1a070504002b
X0b1b070104002b
X0b1b070404002b
X0b1b070504002b
X0b1b070704002b
X0b1c070304002b
X0b1d070304002b
X0b1d070404002b
X0b1d070704002b
X0b1e070004002b
X0b1e070204002b
X0b1e070404002b
X0b18070006142b
X0b1a070006142b
X0b1c070006142b
X0b1f070006142b
X0324070c08212b
X0b24070008212b
X0a25070108212b
X0b27070008212b
X0b28070608212b
X0b0107060c002b
X0b0207060c002b
X0b0307060c002b
X0b1c070614182b
X0b1d070014182b
X0b21070014182b
X0b22070014182b
X0306070917002b
X0b1a070117002b
X0b1c070117002b
X032a070c18242b
X0b25070018242b
X0b25070218242b
X0b25070418242b
X0b27070718242b
X0b18060409181a
X0b19060009181a
X0318060e0e111a
X0b1306060e111a
X0b1406060e111a
X0307060b12060f
X0b09060212060f
X0b0b060612060f
X0b0f060012060f
X031b060c071a1b
X0b1a0602071a1b
X0b1a0607071a1b
X0b1d0605091b23
X0b1e0605091b23
X0b1f0605091b23
X0323060c102324
X0b230602102324
X0b230604102324
X0b240600102324
V02250600
X0325060b022325
X0a230600022325
X0321060c151c25
X0b240607151c25
X0b08060204002b
X0b08060304002b
X0b08060604002b
X0b09060404002b
X0b09060504002b
X0b0a060404002b
X0b0a060504002b
X0b0a060704002b
X0b0b060104002b
X0b0b060204002b
X0b0b060304002b
X0b0b060504002b
X0b1e060204002b
X0b1e060304002b
X0b1f060304002b
X0b20060104002b
X0b20060404002b
X0b21060004002b
X0b21060104002b
X0b21060204002b
X0b21060304002b
X0b21060404002b
X0b21060504002b
X0b21060704002b

X0b22060004002b
X0b22060104002b
X0b22060204002b
X0b22060404002b
X0b23060104002b
X0b24060104002b
X0b24060304002b
X0b24060404002b
X0b25060104002b
X0b25060204002b
X0b25060304002b
X0b26060104002b
X0b26060404002b
X0b27060004002b
X0b27060204002b
X0b27060604002b
X0b28060004002b
X0b28060104002b
X0b28060204002b
X0b28060604002b
X0b29060104002b
X0b29060404002b
X0b2a060104002b
X0b2a060404002b
X0312060905122b
X0320060805122b
X0b12060305122b
X0b22060605122b
X0b0006000c002b
X0b0106050c002b
X0b0106060c002b
X0b0206050c002b
X0b0206060c002b
X0b0306060c002b
X0b0406060c002b
X0b0506050c002b
X0b0506060c002b
X0b0606050c002b
X0b0606060c002b
X0b0706030c002b
X0b0706040c002b
X0b0806040c002b
X0b0806050c002b
X0b0906000c002b
X0b0906030c002b
X0b0a06000c002b
X0b0b06040c002b
X0b0c06040c002b
X0b0d06040c002b
X0b0e06020c002b
X0b0f06020c002b
X0b1006000c002b
X0b1106020c002b
X0b1106030c002b
X0b1206010c002b
X0b1206020c002b
X0b1506050c002b
X0b1606020c002b
X0b1606050c002b
X0b1706060c002b
X0b1806050c002b
X0b1906020c002b
X0b1906030c002b
X0b1e06060c002b
X0b2006020c002b
X0b2406020c002b
X0b2406050c002b
X0b2506040c002b
X0b2506050c002b
X0b2606020c002b
X0b2706040c002b
X0b2806040c002b
X0b2906020c002b
X0b2a06020c002b
X0b2b060a0c002b
X0b2b060b0c002b
X0b2b060c0c002b
X0320060c0e1e2b
X032b06040e1e2b
X0b1f06020e1e2b
X0b2106060e1e2b
X0329060c15292b
X0b29060015292b
X0b2a060015292b
X0324060918242b
X0b2b060918242b
V02100501
X0310050b051011
X0b100506051011
X0b110506051011
X0310050a060f10
X0a100501060f10
X03100509090f11
X0b100503090f11
X0b100505090f11
X0b110501090f11
X0311050a131112
X0b110500131112
X0b120500131112
X030e050a050e0f
X0b0e0500050e0f
X0b0f0500050e0f
X0312050c111213
X0b120503111213
V020d0501
X03140508091214
X0b120506091214
V02150501
X030c050a050c0d
X0b0c0500050c0d
X0b0d0500050c0d
X030c0509060b0c
X0b0b0507060b0c
X0315050b081516
X0b150500081516
X0314050c080a14
X0b0b0501080a14
X0b0c0506080a14
X0b0d0506080a14
X0b0f0506080a14
X030a05090b0a0c
X0b0c05010b0a0c
X0316050a071617
X0b160502071617
V02180501
X0309050a10090a
X0b180502081718
X030805090e0810
X0b0f05010e0810
X0308050a180809
X0b080500180809
X0319050a181719
X0b170506181719
X031a050a08191a
X0b1a050008191a
X0318050b0e111a
X0b1305060e111a
X0b1705000e111a
X0b1805000e111a
V02060501
V021b0501
X030a050a12060f
X0a0d050112060f
X0314050b01101b
X0b14050101101b
X0b17050101101b
X031905090d191b
X0b1a05060d191b
X0a1b05010d191b
X03050509100506
X0b050503100506
X0b060503100506
V021e0501
X031e050c081d1e
X0b1e0506081d1e
V02020501
X031a050913151f
X0a15050113151f
X0b16050613151f
X031f050a081f20
X0b1f0500081f20
X030b050805000b
X0b03050105000b
X030c050b070015
X0b090502070015
X0b0a0502070015
X0b0c0502070015
X0b0d0502070015
X0b0e0502070015
X0b0f0502070015
X0b110502070015
X0b120502070015
X0304050a0b0009
X0b0305000b0009
X0b0405020b0009
X0b0505060b0009
X0b0605060b0009
X0313050b0d0013
X0b0605070d0013
X0b0b05030d0013
X0b0c05030d0013
X0b0f05030d0013
X0b1005070d0013
X0b1305010d0013
X030105090e0003
X0b0105030e0003
X0b0205030e0003
X0302050a120002
X0b010500120002
X0b010501180007
X0b020500180007
X0a020501180007
X0b040500180007
X0b050501180007
X0a060501180007
X03210508111721
X0b1d0506111721
X0a1e0501111721
X031d050a091b23
X03220508091b23
X0b1d0500091b23
X0325050a092425
X0b250501092425
X031e0508151c25
X0b1f0506151c25
V02270501
X0326050a092627
X0b260500092627
X0b270500092627
X0322050c01222b
X0b24050001222b
X0b28050701222b
X0b00050204002b
X0b00050304002b
X0b01050204002b
X0b01050704002b
X0b02050704002b
X0b03050204002b
X0b03050504002b
X0b03050704002b
X0b04050104002b
X0b04050504002b
X0b04050704002b
X0b05050004002b
X0b06050004002b
X0b06050204002b
X0b07050104002b
X0b07050304002b
X0b07050404002b
X0b07050504002b
X0b07050604002b
X0b07050704002b
X0b08050104002b
X0b08050304002b
X0b08050404002b
X0b08050504002b
X0b08050604002b
X0b08050704002b
X0b09050104002b
X0b09050304002b
X0b09050404002b
X0b09050504002b
X0b09050604002b
X0b09050704002b
X0b0a050104002b
X0b0a050304002b
X0b0a050404002b
X0b0a050504002b
X0b0a050604002b
X0b0a050704002b
X0b0b050004002b
X0b0b050204002b
X0b0c050504002b
X0b0c050704002b
X0b0d050404002b
X0b0d050704002b
X0b0e050104002b
X0b0e050404002b
X0b0e050504002b
X0b0e050704002b
X0b0f050404002b
X0b0f050504002b
X0b0f050704002b
X0b10050404002b
X0b11050404002b
X0b11050504002b
X0b11050704002b
X0b12050304002b
X0b12050504002b
X0b12050704002b
X0b13050004002b
X0b13050504002b
X0b14050004002b
X0b14050504002b
X0b15050404002b
X0b15050504002b
X0b15050604002b
X0b15050704002b
X0b16050104002b
X0b16050304002b
X0b16050504002b
X0b16050704002b
X0b17050304002b
X0b17050704002b
X0b18050504002b
X0b18050604002b
X0b18050704002b
X0b19050004002b
X0b19050104002b
X0b19050204002b
X0b19050304002b
X0b19050404002b
X0b19050604002b
X0b19050704002b
X0b1a050104002b
X0b1a050304002b
X0b1a050404002b
X0b1a050704002b
X0b1b050004002b
X0b1b050504002b
X0b1b050604002b
X0b1c050104002b
X0b1c050404002b
X0b1c050504002b
X0b1c050704002b
X0b1d050104002b
X0b1d050304002b
X0b1d050404002b
X0b1d050504002b
X0b1d050704002b
X0b1e050004002b
X0b1e050204002b
X0b1e050304002b
X0b1e050404002b
X0b1e050504002b
X0b1f050504002b
X0b1f050704002b
X0b20050104002b
X0b20050404002b
X0b20050504002b
X0b20050704002b
X0b21050404002b
X0b21050504002b
X0b21050704002b
X0b22050004002b
X0b22050104002b
X0b22050504002b
X0b23050004002b
X0b23050104002b
X0b23050504002b
X0b24050304002b
X0b24050604002b
X0b25050004002b
X0b25050204002b
X0b25050304002b
X0b25050404002b
X0b25050604002b
X0b26050104002b
X0b26050404002b
X0b26050504002b
X0b26050704002b
X0b27050304002b
X0b27050404002b
X0b27050604002b
X0b27050704002b
X0b28050004002b
X0b28050104002b
X0b28050204002b
X0b28050504002b
X0b29050004002b
X0b29050104002b
X0b29050504002b
X0b2a050004002b
X0b2a050104002b
X0b2a050204002b
X0b2a050404002b
X0b2a050504002b
X0b2a050704002b
X0320050a07202b
X0b20050007202b
X0b21050107202b
X0b25050707202b
X0321050a08212b
X0b21050008212b
X0b24050108212b
X0b24050708212b
X0b0005000c002b
X0b0005010c002b
X0b0105040c002b
X0b0105050c002b
X0b0205040c002b
X0b0205050c002b
X0b0305030c002b
X0b0305040c002b
X0b0305060c002b
X0b0405040c002b
X0b0405060c002b
X0b0505050c002b
X0b0d05030c002b
X0b0d05050c002b
X0b0e05060c002b
X0b1005020c002b
X0b1105030c002b
X0b1205010c002b
X0b1305030c002b
X0b1405030c002b
X0b1405060c002b
X0b1505020c002b
X0b1505030c002b
X0b1605040c002b
X0b1705040c002b
X0b1705050c002b
X0b1805030c002b
X0b1805040c002b
X0b1905050c002b
X0b1a05020c002b
X0b1a05050c002b
X0b1b05030c002b
X0b1c05020c002b
X0b1c05060c002b
X0b1d05020c002b
X0b1f05020c002b
X0b2005020c002b
X0b2005060c002b
X0b2105020c002b
X0b2105030c002b
X0b2105060c002b
X0b2205060c002b
X0b2305060c002b
X0b2405020c002b
X0b2405040c002b
X0b2405050c002b
X0b2505050c002b
X0b2605020c002b
X0b2605060c002b
X0b2705020c002b
X0b2705050c002b
X0b2805040c002b
X0b2805060c002b
X0b2905060c002b
X0b2a05060c002b
X0b2b050b0c002b
X0b2b050c0c002b
X032a050a15292b
X0b2b050a15292b
X0325050918242b
X0b2b050918242b
V02100400
X030f040c060f10
X0a100400060f10
X030f0409090f11
X0b110402090f11
X0312040b111213
X0b130405111213
X030d0409060d0e
X0b0e0402060d0e
X0313040b0b1315
X0b1504070b1315
X031404080d1415
X0b1404070d1415
V02160400

| | | | | | | |
|---|---|---|---|---|---|---|
| X0b1b06020c002b | X0b09050010090a | X0b010506120002 | X0b0b050404002b | X0b1e050704002b | X0b0605040c002b | X030b040a060b0c |
| X0b1b06050c002b | X0b0a050010090a | X0b020502120002 | X0b0b050504002b | X0b1f050104002b | X0b0605050c002b | X0b0c0402060b0c |
| X0b1d06020c002b | X0317050a081718 | X0b020506120002 | X0b0b050604002b | X0b1f050304002b | X0b0705020c002b | X0315040a081516 |
| X0b1e06040c002b | X0b170502081718 | X03030509180007 | X0b0c050404002b | X0b1f050404002b | X0b0805020c002b | X0b150402081516 |
| X0b160402081516 | X0b020400080003 | X0b03040104002b | X0b1a040404002b | X0b0504060c002b | X0b16040116002b | X0306030e0e0607 |
| X030f040b180c16 | X0b030400080003 | X0b04040104002b | X0b1b040004002b | X0b0604030c002b | X0b17040116002b | X0b0603020e0607 |
| X0b0e0401180c16 | X0302040c0b0009 | X0b05040004002b | X0b1b040404002b | X0b0604050c002b | X0b19040116002b | X030d030912060f |
| X0b0f0403180c16 | X0b0804050b0009 | X0b05040104002b | X0b1c040104002b | X0b0804020c002b | X0b1d040116002b | X0b09030412060f |
| X0b100407180c16 | X0310040b0d0013 | X0b05040404002b | X0b1d040304002b | X0b0a04030c002b | X0b20040016002b | X0306030a100506 |
| X0b110407180c16 | X0b0904060d0013 | X0b06040004002b | X0b1d040404002b | X0b0b04040c002b | X0b21040016002b | X0b050300100506 |
| X030c040b080a14 | X0b0a04060d0013 | X0b06040204002b | X0b1d040504002b | X0b0e04050c002b | X030f040a17002b | V021d0301 |
| X0b0a0402080a14 | X0b0c04060d0013 | X0b06040404002b | X0b1e040104002b | X0b0f04050c002b | X0b0a040117002b | X031d030b0e1b1d |
| X0b0d0402080a14 | X0b0d04060d0013 | X0b06040604002b | X0b1e040304002b | X0b1204050c002b | X0b0e040417002b | X0b1b03070e1b1d |
| X0b0f0402080a14 | X0b0e04060d0013 | X0b07040104002b | X0b1e040404002b | X0b1304060c002b | X0b0f040017002b | V021f0301 |
| X0b120402080a14 | X0b0f04060d0013 | X0b08040404002b | X0b1f040204002b | X0b1404060c002b | X0b13040117002b | X0319030a13151f |
| V02180400 | X0b1104060d0013 | X0b09040104002b | X0b20040104002b | X0b1504040c002b | X0a1c040017002b | X0b17030713151f |
| X030b040902090b | X0b1204060d0013 | X0b09040304002b | X0b20040204002b | X0b1604030c002b | X0b1f040417002b | X0b1e030713151f |
| X0b09040202090b | X0301040a0e0003 | X0b09040504002b | X0b20040304002b | X0b1604040c002b | X0325040a18242b | X030a030b06000a |
| X0317040c081718 | X0b0104020e0003 | X0b0a040404002b | X0b21040404002b | X0b1604050c002b | X0325040818242b | X0b01030106000a |
| X0b170400081718 | X0b0204020e0003 | X0b0a040504002b | X0b21040504002b | X0b1704040c002b | X0b28040018242b | X0301030b080003 |
| X03020408180809 | X031804080f0019 | X0b0b040004002b | X0b22040004002b | X0b1704050c002b | X0310030c051011 | X0b000301080003 |
| X0b080403180809 | X0b0804070f0019 | X0b0b040104002b | X0b22040404002b | X0b1804040c002b | X0b110304051011 | X030203090b0009 |
| X0318040a071819 | X03020409100004 | X0b0b040204002b | X0b23040004002b | X0b1904040c002b | V020f0301 | X0b0803050b0009 |
| X0b180402071819 | X0b030406100004 | X0b0b040304002b | X0b23040104002b | X0b1904060c002b | X030e030b050e0f | X030003050e0003 |
| V02070400 | X0b040406100004 | X0b0b040504002b | X0b23040404002b | X0b1a04020c002b | X0b0e0303050e0f | X0b0203020e0003 |
| X0309040b080709 | X0311040c110011 | X0b0b040704002b | X0b24040104002b | X0b1a04050c002b | X0b0f0303050e0f | X0310030b110011 |
| X0b070406080709 | X0b090400110011 | X0b0c040104002b | X0b24040204002b | X0b1b04030c002b | X03120309111213 | X0b010306110011 |
| X0b080406080709 | X0b0c0400110011 | X0b0c040304002b | X0b24040304002b | X0b1b04050c002b | X0b130300111213 | X03000306120002 |
| X0307040a100708 | X0b0e0400110011 | X0b0c040504002b | X0b24040504002b | X0b1b04060c002b | X030e030c0b0d0f | X0b020304120002 |
| X0b070402100708 | X0b110400110011 | X0b0c040704002b | X0b24040604002b | X0b1d04020c002b | X0b0d03000b0d0f | X0321030c011f21 |
| X0b070404100708 | X0301040b120002 | X0b0d040104002b | X0b24040704002b | X0b1e04020c002b | X0b0e03020b0d0f | X0b1f0307011f21 |
| X0b080400100708 | X0b000400120002 | X0b0d040304002b | X0b25040004002b | X0b1e04050c002b | X0b0e03060b0d0f | X0b200304011f21 |
| X0319040c08191a | X0b000401120002 | X0b0d040404002b | X0b25040104002b | X0b1e04060c002b | X0b0f03060b0d0f | X031a030a111721 |
| X0b19040008191a | X0b010401120002 | X0b0d040504002b | X0b25040204002b | X0b1f04030c002b | V02160301 | X0b210306111721 |
| X0312040a0e111a | X031f040a011f21 | X0b0d040704002b | X0b25040604002b | X0b1f04050c002b | X030b030c060b0c | V02220301 |
| X0b1104040e111a | X0b210401011f21 | X0b0e040304002b | X0b26040304002b | X0b2004050c002b | X0b0b0302060b0c | X0324030b102324 |
| X0b1204000e111a | X031e040a111721 | X0b0e040704002b | X0b26040404002b | X0b2104030c002b | X0b0c0302060b0c | X0b240304102324 |
| X0b1204070e111a | X0b1f0400111721 | X0b0f040404002b | X0b26040704002b | X0b2204030c002b | X0316030b081516 | X03220309112224 |
| X0b1a04000e111a | X0b200404111721 | X0b0f040704002b | X0b27040404002b | X0b2204050c002b | X0b160307081516 | X0b220307112224 |
| X03080409020608 | X0b210402111721 | X0b10040104002b | X0b27040504002b | X0b2204060c002b | X0314030c180c16 | X0b230304112224 |
| X0b080401020608 | X0321040a002123 | X0b10040204002b | X0b27040704002b | X0b2304060c002b | X0b0f0307180c16 | X0b240301112224 |
| X030604090e0607 | X03230408002123 | X0b10040304002b | X0b28040104002b | X0b2404040c002b | V02170301 | X031e030c151c25 |
| X0b0604070e0607 | X0b210407002123 | X0b10040404002b | X0b28040204002b | X0b2504040c002b | X030c030b0b0a0c | X0b200300151c25 |
| X0306040b12060f | X03210409091b23 | X0b10040504002b | X0b28040304002b | X0b2604020c002b | X0b0a03020b0a0c | X0b220300151c25 |
| X0b09040712060f | X0b1b0407091b23 | X0b10040604002b | X0b28040504002b | X0b2604050c002b | X030a030c10090a | X0b230300151c25 |
| X0316040901101b | X0b1f0407091b23 | X0b11040104002b | X0b28040604002b | X0b2704020c002b | X0b09030210090a | X0b240300151c25 |
| X0b19040201101b | X0b220407091b23 | X0b11040304002b | X0b28040704002b | X0b2804040c002b | X0b0a030010090a | X03260309002426 |
| V021c0400 | V02240400 | X0b11040504002b | X0b29040004002b | X0b2904050c002b | V02080301 | X0b240306002426 |
| V02040400 | X031e0409151c25 | X0b12040304002b | X0b29040304002b | X0b2904060c002b | V02190301 | V02270301 |
| X0304040a080406 | X0b200407151c25 | X0b12040404002b | X0b29040404002b | X0b2a04040c002b | X030d030b0e0810 | X0326030c092627 |
| X0b060401080406 | X0b220401151c25 | X0b13040004002b | X0b29040704002b | X0b2a04060c002b | X0b0b03000e0810 | X0b260302092627 |
| X031c040a071c1d | X03260408112526 | X0b13040304002b | X0b2a040204002b | X0b2b04090c002b | X0b0c03000e0810 | X0b260306092627 |
| X0b1c0402071c1d | X0b260400112526 | X0b13040404002b | X0b2a040504002b | X0b2b040b0c002b | X0b0e03000e0810 | X0b270304092627 |
| X0b1c0404071c1d | X0326040c092627 | X0b14040004002b | X0b2a040704002b | X0b2b040c0c002b | X0b0e03010e0810 | X0b270306092627 |
| X0b1d0400071c1d | X0b260406092627 | X0b14040104002b | X030a040a0a002b | X0311040b17102b | X0a0f03010e0810 | X0326030b152628 |
| X0303040a120305 | X0b270406092627 | X0b14040304002b | X0b0904040a002b | X0b15040612102b | X0308030c180809 | X0b260301152628 |
| X0b030402120305 | X0327040b102527 | X0b14040404002b | X0b0a040c0a002b | X0b16040612102b | X0b080300180809 | X0b270303152628 |
| X0b040402120305 | X0b260401102527 | X0b14040504002b | X0b0a04070a002b | X0b1a040612102b | X0b090300180809 | V022a0301 |
| X031f0409071e1f | X0b270403102527 | X0b15040104002b | X0b0b04060a002b | X0b1c040612102b | X0318030b071819 | X0328030b02262b |
| X0b1e0407071e1f | X0327040a152628 | X0b15040304002b | X0b1304070a002b | X0b1d040612102b | X0b180300071819 | X0b26030002262b |
| X0b1f0401071e1f | X0b270400152628 | X0b15040504002b | X0b1604070a002b | X0b1f040612102b | X0b190300071819 | X0b26030302262b |
| X031d040913151f | X0324040a01222b | X0b17040204002b | X0b1704070a002b | X0b20040612102b | X03070308080709 | X0a27030102262b |
| X0b1a040713151f | X0b2b040a01222b | X0b17040304002b | X0b1904070a002b | X0b21040612102b | X0b080303080709 | X0b28030002262b |
| X0b1b040113151f | X0b01040603002b | X0b18040104002b | X0b1d04070a002b | X032a040b15292b | X0307030c100708 | X0b29030302262b |
| X030b040b100b20 | X0b02040603002b | X0b18040304002b | X0b1e04000a002b | X0b29040115292b | X0b070300100708 | X0b2a030002262b |
| X0b150400100b20 | X0b17040603002b | X0b18040504002b | X0b0004030c002b | X0b2a040015292b | X0b080302100708 | X0a2a030102262b |
| X0a160400100b20 | X0b18040603002b | X0b18040704002b | X0b0104030c002b | X0b2a040315292b | X0b080304100708 | X0b00030204002b |
| X030a040c06000a | X0b00040204002b | X0b19040304002b | X0b0104040c002b | X030d040a16002b | X0319030c08191a | X0b01030004002b |
| X0a07040006000a | X0b01040504002b | X0b19040504002b | X0b0204040c002b | X0b0c040416002b | X0b19030208191a | X0b01030304002b |
| X03030409080003 | X0b01040704002b | X0b1a040104002b | X0b0304040c002b | X0b0d040016002b | V02060301 | X0b02030104002b |
| X0b010400080003 | X0b02040104002b | X0b1a040304002b | X0b0404040c002b | X0b12040116002b | V021b0301 | X0b02030504002b |
| X0b02030704002b | X0b14030404002b | X0b23030704002b | X0b1503050c002b | X0b0d0201080a14 | X0320020b081f20 | X0b08020704002b |
| X0b03030004002b | X0b14030604002b | X0b24030204002b | X0b1603030c002b | V02180200 | X0b200207081f20 | X0b09020104002b |
| X0b03030104002b | X0b14030704002b | X0b24030504002b | X0b1703030c002b | X0309020b02090b | X030b020b05000b | X0b09020404002b |

X0b03030504002b
X0b04030004002b
X0b04030104002b
X0b04030504002b
X0b05030104002b
X0b05030204002b
X0b05030504002b
X0b05030704002b
X0b06030304002b
X0b06030504002b
X0b06030604002b
X0b06030704002b
X0b07030104002b
X0b07030404002b
X0b07030504002b
X0b07030704002b
X0b08030604002b
X0b08030704002b
X0b09030104002b
X0b09030304002b
X0b09030604002b
X0b09030704002b
X0b0a030104002b
X0b0a030304002b
X0b0a030404002b
X0b0a030504002b
X0b0a030604002b
X0b0a030704002b
X0b0b030504002b
X0b0b030704002b
X0b0c030504002b
X0b0c030704002b
X0b0d030204002b
X0b0d030504002b
X0b0d030704002b
X0b0e030704002b
X0b0f030004002b
X0b0f030204002b
X0b0f030404002b
X0b10030104002b
X0b10030204002b
X0b10030304002b
X0b10030604002b
X0b10030704002b
X0b11030104002b
X0b11030204002b
X0b11030304002b
X0b11030604002b
X0b11030704002b
X0b12030004002b
X0b12030104002b
X0b12030304002b
X0b12030504002b
X0b12030604002b
X0b13030104002b
X0b13030204002b
X0b13030304002b
X0b13030504002b
X0b13030604002b
X0b13030704002b
X0b14030004002b
X0b14030104002b
X0b14030204002b
X0b14030304002b
X0b27020104002b
X0b27020304002b
X0b27020404002b
X0b27020704002b
X0b28020404002b
X0b28020504002b
X0b28020704002b
X0b29020404002b
X0b29020504002b
X0b29020704002b

X0b15030004002b
X0b15030104002b
X0b15030204002b
X0b15030304002b
X0b15030604002b
X0b15030704002b
X0b16030004002b
X0b16030204002b
X0b16030404002b
X0b16030504002b
X0b16030604002b
X0b17030004002b
X0b17030204002b
X0b17030604002b
X0b18030504002b
X0b18030704002b
X0b19030404002b
X0b19030604002b
X0b19030704002b
X0b1a030004002b
X0b1a030204002b
X0b1a030304002b
X0b1a030404002b
X0b1a030604002b
X0b1a030704002b
X0b1b030004002b
X0b1b030204002b
X0b1b030304002b
X0b1b030404002b
X0b1b030604002b
X0b1c030004002b
X0b1c030104002b
X0b1c030204002b
X0b1c030404002b
X0b1c030504002b
X0b1c030704002b
X0b1d030004002b
X0b1d030504002b
X0b1d030604002b
X0b1e030004002b
X0b1e030204002b
X0b1e030304002b
X0b1e030404002b
X0b1e030604002b
X0b1f030004002b
X0b1f030204002b
X0b1f030304002b
X0b1f030604002b
X0b20030204002b
X0b20030304002b
X0b20030604002b
X0b20030704002b
X0b21030004002b
X0b21030104002b
X0b21030204002b
X0b21030304002b
X0b21030404002b
X0b21030704002b
X0b22030204002b
X0b22030304002b
X0b22030604002b
X0b23030104002b
X0b23030204002b
X0b23030504002b
X0b1c02040c002b
X0b1c02050c002b
X0b1c02060c002b
X0b1d02060c002b
X0b1e02040c002b
X0b1f02040c002b
X0b1f02050c002b
X0b2002040c002b
X0b2002050c002b
X0b2202000c002b

X0b24030704002b
X0b25030104002b
X0b25030204002b
X0b25030504002b
X0b25030704002b
X0b26030404002b
X0b26030504002b
X0b26030704002b
X0b27030204002b
X0b27030504002b
X0b27030704002b
X0b28030404002b
X0b28030504002b
X0b28030704002b
X0b29030204002b
X0b29030504002b
X0b29030704002b
X0b2a030404002b
X0b2a030504002b
X0b2a030704002b
X0328030a09282b
X0b2b030a09282b
X032a03090a002b
X030b03080a002b
X0b0b03010a002b
X0b0c03010a002b
X0b0d03010a002b
X0b1803010a002b
X0b2803010a002b
X0321030b0b162b
X031603080b162b
X0b1a03010b162b
X0b1e03010b162b
X0b2003010b162b
X0b0003000c002b
X0b0003030c002b
X0b0103050c002b
X0b0203060c002b
X0b0303060c002b
X0b0403060c002b
X0b0503040c002b
X0b0503060c002b
X0b0603040c002b
X0b0703020c002b
X0b0703060c002b
X0b0903050c002b
X0b0b03030c002b
X0b0b03040c002b
X0b0b03060c002b
X0b0c03030c002b
X0b0c03040c002b
X0b0c03060c002b
X0b0d03030c002b
X0b0d03040c002b
X0b0d03060c002b
X0b0e03040c002b
X0b0e03050c002b
X0b0f03050c002b
X0b1003040c002b
X0b1003050c002b
X0b1103050c002b
X0b1303040c002b
X0b1403050c002b
X0b1503040c002b
X0316010c081516
X0b150102081516
X03150109111416
X0b150104111416
X030c010a080a14
X0b0b0102080a14
X0b0c0100080a14
X0b0d0107080a14
X0b0e0100080a14
X0b0e0106080a14

X0b1703040c002b
X0b1703050c002b
X0b1803020c002b
X0b1803030c002b
X0b1803040c002b
X0b1803060c002b
X0b1903030c002b
X0b1903050c002b
X0b1a03050c002b
X0b1b03050c002b
X0b1c03060c002b
X0b1d03030c002b
X0b1e03050c002b
X0b1f03040c002b
X0b1f03050c002b
X0b2003050c002b
X0b2103050c002b
X0b2203040c002b
X0b2203050c002b
X0b2303060c002b
X0b2403030c002b
X0b2503040c002b
X0b2503060c002b
X0b2803030c002b
X0b2803060c002b
X0b2903040c002b
X0b2b03090c002b
X0b2b030b0c002b
X0b2b030c0c002b
X032a030c10282b
X0b29030010282b
X0b29030610282b
X0b2a030210282b
X0b2a030610282b
X0329030b15292b
X0b29030115292b
X0b2a030315292b
X0328030c18242b
X0b25030018242b
X0b27030018242b
X0b28030218242b
V02100200
V02110200
X03100208060f10
X0b100207060f10
V020e0200
X03120209111213
X0b130202111213
X030d020c060d0e
X0b0d0202060d0e
X0b0e0202060d0e
X030f020c0b0d0f
X0b0d02030b0d0f
X0b0e02030b0d0f
X030d020b050c0d
X0b0c0200050c0d
X0b0d0200050c0d
X0315020c0d1415
X0b1502010d1415
X0314020a180c16
X0b0f0200180c16
X0b110206180c16
X0b130206180c16
X030a020c080a14
X0b220103102122
X0322010b182223
X0b230106182223
V02260101
X03250109112526
X0b250101112526
X0b260103112526
V02280101
X03270109152628
X0b270101152628

X0b09020602090b
X0b0a020602090b
X0309020c10090a
X0b09020010090a
X0b0a020010090a
V02080200
V02190200
X030c020c0e0810
X0b0b02000e0810
X0b0c02020e0810
X0b0d02060e0810
X0b0e02060e0810
X0318020c071819
X0b180202071819
X0b190202071819
X0308020b100708
X0b070200100708
X0319020b08191a
X0b19020108191a
X0316020a0e111a
X0b1102000e111a
X0b1102070e111a
X0b1402000e111a
X0b1502070e111a
V02060200
X0306020c0e0607
X0b0702070e0607
X030c020b12060f
X0b09020212060f
X0b0a020212060f
X0319020a01101b
X0b10020601101b
X0b12020101101b
X0b14020601101b
X0b15020001101b
X0305020c100506
X0b050202100506
X0b060202100506
X031c020a000e1d
X0b100200000e1d
X0b120207000e1d
X0b140202000e1d
X0b150206000e1d
X0b1a0200000e1d
X0b1a0207000e1d
X031e020b011c1e
X0b1c0207011c1e
V02020200
X0314020b020c1f
X0b130207020c1f
X0b170200020c1f
X0b180206020c1f
X0b190206020c1f
X0b1c0200020c1f
X031f020b071e1f
X0b1f0207071e1f
X0315020b13151f
X0b16020013151f
X0b19020713151f
X0b1b020013151f
X031e0209001e20
X0b1e0203001e20
X0b1f0200001e20
X0b200206001e20
X0b13010704002b
X0b14010404002b
X0b14010604002b
X0b14010704002b
X0b15010604002b
X0b15010704002b
X0b16010104002b
X0b16010404002b
X0b16010504002b
X0b16010704002b

X0b05020005000b
X0b06020005000b
X03000207080003
X0b020202080003
X030002040e0003
X0b0202040e0003
X03000206120002
X0b020205120002
X0306020b13000d
X0b05020613000d
X0b06020613000d
X0b07020613000d
X0b08020613000d
X0b0b020613000d
X0b0c020613000d
X031b020b111721
X0b180207111721
X0321020c182021
X0b200200182021
X0322020c102122
X0b210205102122
X03220209002123
X03210208002123
X0b210202002123
X0b220203002123
X0b230200002123
X0320020c091b23
X0b1d0205091b23
X0324020b102324
X0b240200102324
X0323020c022325
X0b250205022325
X031e020c151c25
X0b1f0202151c25
X0b200202151c25
X0b220202151c25
X0b230202151c25
X0b240202151c25
X0325020c112526
X0b250200112526
X0b260202112526
X0327020c152628
X0b270200152628
X0b280202152628
X0327020b00272b
X0b29020600272b
X0b2a020600272b
X0324020c01222b
X0b27020501222b
X0b00020204002b
X0b01020004002b
X0b01020104002b
X0b01020404002b
X0b02020304002b
X0b03020004002b
X0b03020404002b
X0b03020704002b
X0b04020004002b
X0b04020404002b
X0b04020704002b
X0b05020104002b
X0b06020104002b
X0b07020204002b
X0b08020404002b
X0b0801050c002b
X0b0901060c002b
X0b0a01060c002b
X0b0b01050c002b
X0b0c01050c002b
X0b0d01020c002b
X0b0f01050c002b
X0b1001050c002b
X0b1001060c002b
X0b1101020c002b

X0b0a020104002b
X0b0a020404002b
X0b0b020204002b
X0b0b020704002b
X0b0c020704002b
X0b0d020504002b
X0b0d020704002b
X0b0e020504002b
X0b0e020704002b
X0b0f020404002b
X0b0f020604002b
X0b0f020704002b
X0b10020204002b
X0b10020404002b
X0b11020104002b
X0b11020204002b
X0b11020304002b
X0b11020404002b
X0b12020004002b
X0b12020404002b
X0b14020404002b
X0b14020704002b
X0b15020204002b
X0b15020304002b
X0b16020104002b
X0b16020204002b
X0b16020604002b
X0b17020404002b
X0b17020604002b
X0b18020404002b
X0b19020404002b
X0b19020504002b
X0b1a020204002b
X0b1a020504002b
X0b1b020204002b
X0b1b020604002b
X0b1b020704002b
X0b1c020204002b
X0b1d020004002b
X0b1d020104002b
X0b1d020304002b
X0b1d020404002b
X0b1d020704002b
X0b1e020004002b
X0b1e020204002b
X0b1e020504002b
X0b1e020604002b
X0b1e020704002b
X0b1f020604002b
X0b21020104002b
X0b21020304002b
X0b21020404002b
X0b21020704002b
X0b22020504002b
X0b22020604002b
X0b22020704002b
X0b24020704002b
X0b25020104002b
X0b25020304002b
X0b25020404002b
X0b25020704002b
X0b26020404002b
X0b26020504002b
X0b26020704002b
X030b000b0a0810
X0b0900020a0810
X0b0a00020a0810
X0b0b00020a0810
X0b0c00020a0810
X0318000a00181a
X0b18000000181a
X0b19000200181a
X031a000c0b191b
X0b1a00020b191b

X0b2a020404002b
X0b2a020504002b
X0b2a020704002b
X0b2b020a04002b
X0328020a08212b
X0b25020608212b
X0b26020608212b
X0b27020608212b
X0b28020608212b
X032b02040a002b
X0b0202010a002b
X0b0202060a002b
X0b0002000c002b
X0b0002010c002b
X0b0002030c002b
X0b0102060c002b
X0b0302050c002b
X0b0302060c002b
X0b0402050c002b
X0b0402060c002b
X0b0502040c002b
X0b0602040c002b
X0b0702040c002b
X0b0702050c002b
X0b0802020c002b
X0b0802050c002b
X0b0b02040c002b
X0b0b02050c002b
X0b0c02040c002b
X0b0c02050c002b
X0b0d02040c002b
X0b0e02040c002b
X0b0f02020c002b
X0b0f02050c002b
X0b1002050c002b
X0b1102050c002b
X0b1202030c002b
X0b1202050c002b
X0b1202060c002b
X0b1302000c002b
X0b1302040c002b
X0b1302050c002b
X0b1402050c002b
X0b1502040c002b
X0b1502050c002b
X0b1602040c002b
X0b1702020c002b
X0b1702050c002b
X0b1702070c002b
X0b1802050c002b
X0b1902030c002b
X0b1a02010c002b
X0b1a02030c002b
X0b1a02040c002b
X0b1a02060c002b
X0b1b02040c002b
X0b1b02050c002b
X0b17000404002b
X0b17000604002b
X0b18000404002b
X0b19000404002b
X0b1a000604002b
X0b1b000404002b
X0b1c000404002b
X0b1d000004002b
X0b1d000404002b
X0b1e000004002b
X0b1e000404002b
X0b1f000004002b
X0b1f000404002b
X0b20000004002b
X0b20000404002b
X0b21000004002b
X0b21000404002b
X0b2202040c002b
X0b2302040c002b
X0b2302050c002b
X0b2302070c002b
X0b2402040c002b
X0b2402050c002b
X0b2b02090c002b
X0b2b020b0c002b
X0b2b020c0c002b
X032802090d1c2b
X031d02080d1c2b
X0b2102000d1c2b
X0b2402060d1c2b
X0b2802030d1c2b
X032602090f1a2b
X031c02080f1a2b
X0b2102060f1a2b
X0b2302060f1a2b
X0b2602030f1a2b
X0329020c15292b
X0b29020015292b
X0b2a020215292b
X0320020817002b
X0a02020017002b
X0b02020717002b
X0328020b18242b
X0b25020218242b
X0b26020018242b
X0b27020218242b
X0b28020018242b
X0b29020218242b
X0b2a020018242b
X0311010c051011
X0b110100051011
V02120101
X030f010b060f10
X0b0f0107060f10
X03110109131112
X0b120103131112
V020e0101
X0313010b061113
X0b110107061113
X0313010c111213
X0b130104111213
V020d0101
X030e010a060d0e
X0b0d0106060d0e
X030f010c0b0d0f
X0b0d01000b0d0f
X0b0d01050b0d0f
X0b0e01050b0d0f
X0314010a131314
X0b140102131314
X0315010c0d1415
X0b1501030d1415
X030d010a000b0d
X0b0b0104000b0d
X0b2100060c002b
X0b2200060c002b
X0b2300060c002b
X0b2400060c002b
X0b2500060c002b
X0b2600060c002b
X0b2700060c002b
X0b2800040c002b
X0b2a00060c002b
X0b2b00090c002b
X0b2b000b0c002b
X03100c08051011
X0b100c01051011
V02120b01
X03100c0a060f10
X0b100c07060f10
X03120c0c0b1012
X030b010b0b0a0c
X0b0a01020b0a0c
X0b0c01020b0a0c
X0316010a071617
X0b160102071617
X0315010b091517
X0b170107091517
X0317010b081718
X0b170100081718
X030a010a0e0810
X0b0901020e0810
X0b0a01000e0810
X0a0c01010e0810
X0b0e01020e0810
X03190109071819
X0b180102071819
X0319010a08191a
X0b19010208191a
X0b1a010708191a
X031a010a09181a
X0b18010409181a
X0317010a0e111a
X0b1301020e111a
X030e010912060f
X0b09010412060f
X0311010a01101b
X0b13010001101b
X0b15010001101b
X0b18010001101b
X0b1b010001101b
X031a0109071a1b
X0b1b0104071a1b
X031b010c081b1c
X0b1b0102081b1c
X031a010c181a1c
X0b1a0100181a1c
X031c010a071c1d
X0b1c0102071c1d
V021e0101
X031d0109081d1e
X0b1d0101081d1e
X0b1e0103081d1e
V02020101
X0308010c05000b
X0b09010005000b
X0b0b010005000b
X03030109080003
X0b020105080003
X0301010b0e0003
X0b0001000e0003
X0b0001010e0003
X0b0301050e0003
X031a010b111721
X0b170106111721
V02220101
X03210109102122
X0b210101102122
X031a0c0b071a1b
X0b1a0c05071a1b
X0b1b0c05071a1b
V021c0b01
X031b0c0a081b1c
X0b1b0c02081b1c
X0b1c0c02081b1c
V021d0b01
X030f0c0a000e1d
X0b130c00000e1d
X0b140c00000e1d
X0b170c00000e1d
X0b170c01000e1d
X0b180c00000e1d
X0a180c01000e1d
X0b1b0c00000e1d
X0b1c0c00000e1d
X0b280103152628
X0b1d010603002b
X0b1e010603002b
X0b21010603002b
X0b22010603002b
X0b25010603002b
X0b26010603002b
X0b27010603002b
X0b28010603002b
X0b00010204002b
X0b01010004002b
X0b01010104002b
X0b01010504002b
X0b02010004002b
X0b02010304002b
X0b02010604002b
X0b03010004002b
X0b04010004002b
X0b04010604002b
X0b05010004002b
X0b05010104002b
X0b05010504002b
X0b06010004002b
X0b06010104002b
X0b06010504002b
X0b07010004002b
X0b08010004002b
X0b08010604002b
X0b09010104002b
X0b09010504002b
X0b09010704002b
X0b0a010104002b
X0b0a010404002b
X0b0a010504002b
X0b0a010704002b
X0b0b010604002b
X0b0b010704002b
X0b0c010404002b
X0b0c010604002b
X0b0c010704002b
X0b0d010304002b
X0b0d010404002b
X0b0e010304002b
X0b0e010404002b
X0b0e010704002b
X0b0f010004002b
X0b0f010204002b
X0b0f010404002b
X0b0f010604002b
X0b10010004002b
X0b11010104002b
X0b11010304002b
X0b11010404002b
X0b11010504002b
X0b11010604002b
X0b12010004002b
X0b12010604002b
X0b1f0c04151c25
X0b200c00151c25
X09210c01151c25
X0b230c04151c25
X0b240c00151c25
V02260b01
X03250c0c112526
X0b250c06112526
X03260c0b01222b
X0b230c0701222b
X0b240c0701222b
X0b250c0101222b
X0b260c0501222b
X0b000c0004002b
X0b000c0204002b
X0b000c0304002b
X0b010c0104002b
X0b17010404002b
X0b18010704002b
X0b19010104002b
X0b19010304002b
X0b19010404002b
X0b19010504002b
X0b19010604002b
X0b19010704002b
X0b1a010204002b
X0b1a010304002b
X0b1a010604002b
X0b1b010604002b
X0b1b010704002b
X0b1c010404002b
X0b1c010704002b
X0b1d010004002b
X0b1d010504002b
X0b1e010004002b
X0b1e010504002b
X0b1f010004002b
X0b20010004002b
X0b21010004002b
X0b21010504002b
X0b22010004002b
X0b22010504002b
X0b23010004002b
X0b24010004002b
X0b24010604002b
X0b25010004002b
X0b25010504002b
X0b26010004002b
X0b26010504002b
X0b27010004002b
X0b27010504002b
X0b28010004002b
X0b28010204002b
X0b28010404002b
X0b28010504002b
X0b29010004002b
X0b29010204002b
X0b29010504002b
X0b29010604002b
X0b2a010004002b
X0b2a010504002b
X0b2a010604002b
X0b2b010904002b
X0329010909282b
X0b28010709282b
X0b29010709282b
X0b0001030c002b
X0b0101060c002b
X0b0301060c002b
X0b0401050c002b
X0b0501060c002b
X0b0601060c002b
X0b0701050c002b
X0b0701060c002b
X0b150c0604002b
X0b160c0104002b
X0b160c0304002b
X0b170c0704002b
X0b180c0704002b
X0b190c0104002b
X0b190c0204002b
X0b190c0304002b
X0b190c0404002b
X0b190c0504002b
X0b1a0c0304002b
X0b1a0c0704002b
X0b1b0c0304002b
X0b1b0c0704002b
X0b1c0c0504002b
X0b1d0c0504002b
X0b1e0c0504002b
X0b1201050c002b
X0b1301050c002b
X0b1301060c002b
X0b1401050c002b
X0b1501010c002b
X0b1501050c002b
X0b1601060c002b
X0b1701020c002b
X0b1701050c002b
X0b1801050c002b
X0b1801060c002b
X0b1a01010c002b
X0b1a01040c002b
X0b1a01050c002b
X0b1b01050c002b
X0b1c01050c002b
X0b1c01060c002b
X0b1f01050c002b
X0b1f01060c002b
X0b2001050c002b
X0b2001060c002b
X0b2301050c002b
X0b2401050c002b
X0b2901040c002b
X0b2b010b0c002b
X0b2b010c0c002b
X031c010c0d1c2b
X0b1d01030d1c2b
X0a1e01010d1c2b
X0b2101030d1c2b
X0a2201010d1c2b
X0b2501030d1c2b
X0a2601010d1c2b
X0b2701030d1c2b
X0a2801010d1c2b
X0329010a15292b
X0b2b010a15292b
V02140000
X0313000a001214
X0b130000001214
X0b140002001214
V02160000
X030b000a0b0a0c
X0b0b00000b0a0c
X0b0c00000b0a0c
X0315000a001517
X0b150000001517
X0b160002001517
X0309000a0d090b
X0b0900000d090b
X0b0a00000d090b
V02190000
X0309000b01080d
X0b09000601080d
X0b0a000601080d
X0b0b000601080d
X0b0c000601080d
X0b0b0c050c002b
X0b0b0c060c002b
X0b0c0c050c002b
X0b0d0c030c002b
X0b0d0c040c002b
X0b0e0c040c002b
X0b0e0c060c002b
X0b0f0c020c002b
X0b0f0c050c002b
X0b0f0c060c002b
X0b100c050c002b
X0b110c010c002b
X0b110c030c002b
X0b120c040c002b
X0b130c040c002b
X0b140c040c002b
X0b140c050c002b
V021c0000
X031b000a011a1c
X0b1b0000011a1c
X0b1c0002011a1c
X030f000a0d0c1f
X0b1300060d0c1f
X0b1400060d0c1f
X0b1500060d0c1f
X0b1600060d0c1f
X0b1800060d0c1f
X0b1900060d0c1f
X0b1b00060d0c1f
X0b1c00060d0c1f
X0b01000004002b
X0b01000404002b
X0b02000004002b
X0b02000404002b
X0b03000004002b
X0b03000404002b
X0b04000004002b
X0b04000404002b
X0b05000004002b
X0b05000404002b
X0b06000004002b
X0b06000404002b
X0b07000004002b
X0b07000404002b
X0b08000004002b
X0b08000404002b
X0b09000404002b
X0b0a000404002b
X0b0b000404002b
X0b0c000404002b
X0b0d000004002b
X0b0d000204002b
X0b0d000404002b
X0b0d000604002b
X0b0e000004002b
X0b0e000204002b
X0b0e000404002b
X0b0e000604002b
X0b0f000004002b
X0b0f000204002b
X0b0f000604002b
X0b10000004002b
X0b10000404002b
X0b11000004002b
X0b11000204002b
X0b11000604002b
X0b12000004002b
X0b12000404002b
X0b13000404002b
X0b14000404002b
X0b15000404002b
X0b16000404002b
X0b17000004002b
X0b17000204002b
X030f0d0c050e0f
X0b0e0d01050e0f
X0b0f0d01050e0f
V02140c00
X030d0d09060d0e
X0b0d0d05060d0e
X03130d09131314
X0b130d01131314
X0b140d05131314
V020c0c00
X030d0d0b050c0d
X0b0c0d02050c0d
X030c0d0a060b0c
X0b0c0d03060b0c
X0b0c0d05060b0c
X030c0d0b180c16
X0b0c0d01180c16

X0b22000004002b
X0b22000404002b
X0b23000004002b
X0b23000404002b
X0b24000004002b
X0b24000404002b
X0b25000004002b
X0b25000404002b
X0b26000004002b
X0b26000404002b
X0b27000004002b
X0b27000404002b
X0b28000004002b
X0b28000204002b
X0b28000604002b
X0b29000004002b
X0b29000204002b
X0b29000404002b
X0b29000604002b
X0b2a000004002b
X0b2a000404002b
X0318000b06122b
X0b13000206122b
X0a14000006122b
X0b15000206122b
X0a16000006122b
X0b18000206122b
X0a19000006122b
X0b1b000206122b
X0a1c000006122b
X0b0000010c002b
X0b0000030c002b
X0b0100060c002b
X0b0200060c002b
X0b0300060c002b
X0b0400060c002b
X0b0500060c002b
X0b0600060c002b
X0b0700060c002b
X0b0800060c002b
X0b0f00040c002b
X0b1000060c002b
X0b1100040c002b
X0b1200060c002b
X0b1a00000c002b
X0b1a00040c002b
X0b1d00060c002b
X0b1e00060c002b
X0b1f00060c002b
X0b2000060c002b
X031e0d0b081d1e
X0b1e0d06081d1e
V02200c00
X03200d0a081f20
X0b1f0d00081f20
X0b200d04081f20
X03150d0c070015
X0b060d07070015
X03140d0a0f0019
X0b090d060f0019
X0b0a0d060f0019
X0b130d000f0019
X0b140d020f0019
X0b190d060f0019
X0b190d070f0019
X03110d0c110011
X0b050d07110011
X03200d08022022
X0b220d01022022
X03230d08182223
X0b230d01182223
V02240c00
X03240d0a102324
X0b230d00102324
X0b100c060b1012
V020c0b01
V020d0b01
X030e0c0c060d0c
X0b0e0c07060d0c
X03140c09091214
X0b120c06091214
X03130c0a131314
X0b130c02131314
X0b140c02131314
X030d0c0c050c0d
X0b0c0c06050c0d
X03140c0a0d1415
X0b150c010d1415
X030d0c09000b0d
X0b0b0c07000b0d
X0b0c0c02000b0d
X0b0d0c07000b0d
X030c0c0c060b0c
X0b0c0c00060b0c
X03160c0c180c16
X0b0d0c06180c16
X030b0c08080a14
X0b0c0c07080a14
X0b0f0c07080a14
X0b130c07080a14
V02090b01
V02180b01
X03170c0a081718
X0b170c02081718
X0b180c02081718
X03180c0c041618
X0b160c060d1618
X03170c0b181719
X0b170c03181719
X0b180c03181719
V021a0b01
X03070c0a100708
X0b070c02100708
X0b080c02100708
X03190c0c08191a
X0b1a0c0608191a
X03120c0b0e111a
X0b120c030e111a
X0b190c070e111a
V021b0b01
X03180c0a01101b
X0b130c0601101b
X0b140c0601101b
X0b160c0701101b
X0b0f0d0704002b
X0b100d0004002b
X0b100d0104002b
X0b100d0204002b
X0b100d0504002b
X0b110d0104002b
X0b110d0404002b
X0b110d0504002b
X0b110d0704002b
X0b120d0104002b
X0b120d0504002b
X0b130d0204002b
X0b130d0704002b
X0b140d0704002b
X0b150d0104002b
X0b150d0504002b
X0b150d0704002b
X0b160d0104002b
X0b160d0504002b
X0b170d0104002b
X0b170d0204002b
X0b170d0504002b
X0b170d0704002b
X0b180d0104002b
X031c0c0b071c1d
X0a1d0c01071c1d
V021e0b01
X03030c0a120305
X0b030c02120305
X0b040c02120305
X031e0c0b081d1e
X0b1d0c07081d1e
V021f0b01
X031e0c0c071e1f
X0a1e0c01071e1f
X031c0c0a13151f
X0b150c0713151f
X0b170c0613151f
X0b180c0613151f
X0b190c0613151f
X031f0c0a081f20
X0b1f0c00081f20
X0b200c04081f20
X030f0c0901000f
X0b030c0001000f
X0b040c0001000f
X0b070c0001000f
X0b080c0001000f
X0b0f0c0001000f
X030a0c0906000a
X0b050c0706000a
X0b070c0606000a
X0b070c0706000a
X0b080c0606000a
X0b0a0c0706000a
X03080c090b0009
X0b030c060b0009
X0b040c060b0009
X0b040c070b0009
X0b080c070b0009
X03050c0b110011
X0b0e0c03110011
X03180c0b111721
X0b190c00111721
X0b1b0c06111721
X0b1c0c06111721
X03230c09002123
X0b210c06002123
X03230c0c091b23
X0b1d0c06091b23
X03230c0a102324
X0b230c00102324
X0b240c04102324
X031f0c0c151c25
X0b280d0504002b
X0b290d0104002b
X0b290d0504002b
X0b290d0704002b
X0b2a0d0104002b
X0b2a0d0504002b
X0b2a0d0704002b
X0b2b0d0904002b
X0b2b0d0a04002b
X0b000d000c002b
X0b000d010c007b
X0b010d040c002b
X0b010d060c002b
X0b020d040c002b
X0b020d060c002b
X0b030d040c002b
X0b030d060c002b
X0b040d040c002b
X0b040d060c002b
X0b050d040c002b
X0b050d060c002b
X0b060d040c002b
X0b060d060c002b
X0b070d040c002b
X0b010c0604002b
X0b020c0104002b
X0b020c0604002b
X0b030c0104002b
X0b040c0104002b
X0b040c0304002b
X0b040c0504002b
X0b050c0104002b
X0b050c0304002b
X0b050c0504002b
X0b060c0104002b
X0b070c0104002b
X0b070c0304002b
X0b070c0504002b
X0b080c0104002b
X0b080c0304002b
X0b080c0504002b
X0b090c0304002b
X0b090c0704002b
X0b0a0c0104002b
X0b0a0c0304002b
X0b0b0c0004002b
X0b0b0c0104002b
X0b0b0c0304002b
X0b0b0c0404002b
X0b0c0c0104002b
X0b0c0c0304002b
X0b0c0c0404002b
X0b0d0c0504002b
X0b0e0c0504002b
X0b0f0c0104002b
X0b0f0c0304002b
X0b0f0c0404002b
X0b100c0004002b
X0b100c0204002b
X0b100c0304002b
X0b100c0404002b
X0b110c0404002b
X0b110c0504002b
X0b110c0604002b
X0b110c0704002b
X0b120c0504002b
X0b120c0704002b
X0b130c0104002b
X0b130c0304002b
X0b130c0504002b
X0b140c0104002b
X0b140c0304002b
X0b140c0704002b
X0b150c0504002b
X0b1e0d030c002b
X0b1e0d040c002b
X0b1f0d040c002b
X0b1f0d060c002b
X0b200d020c002b
X0b200d060c002b
X0b210d040c002b
X0b210d060c002b
X0b210d070c002b
X0b220d040c002b
X0b220d070c002b
X0b230d040c002b
X0b230d050c002b
X0b240d020c002b
X0b240d060c002b
X0b250d040c002b
X0b250d050c002b
X0b250d070c002b
X0b260d040c002b
X0b260d060c002b
X0b270d060c002b
X0b280d060c002b
X0b290d040c002b
X0b290d060c002b
X0b1e0c0704002b
X0b1f0c0504002b
X0b1f0c0704002b
X0b200c0304002b
X0b200c0704002b
X0b210c0704002b
X0b220c0504002b
X0b220c0704002b
X0b230c0104002b
X0b230c0304002b
X0b230c0504002b
X0b240c0504002b
X0b250c0304002b
X0b250c0704002b
X0b260c0704002b
X0b270c0004002b
X0b270c0104002b
X0b270c0404002b
X0b280c0004002b
X0b280c0104002b
X0b280c0404002b
X0b290c0104002b
X0b290c0604002b
X0b2a0c0104002b
X0b2a0c0604002b
X0b2b0c0904002b
X03200c0a07202b
X0b220c0307202b
X0b230c0607202b
X0b240c0107202b
X0b240c0607202b
X03250c0908212b
X0b220c0608212b
X0b000c010c002b
X0b010c040c002b
X0b020c040c002b
X0b030c040c002b
X0b040c040c002b
X0b050c040c002b
X0b050c060c002b
X0b060c040c002b
X0b060c060c002b
X0b070c040c002b
X0b080c040c002b
X0b090c040c002b
X0b090c050c002b
X0b090c060c002b
X0b0a0c040c002b
X0b0a0c050c002b
X0b0a0c060c002b
X0b250c07071c25
X0b000c0204002b
X0b010c0104002b
X0b020c0104002b
X0b030c0104002b
X0b040c0104002b
X0b050c0104002b
X0b060c0104002b
X0b070c0304002b
X0b070c0704002b
X0b080c0704002b
X0b090c0304002b
X0b090c0704002b
X0b0a0c0704002b
X0b0b0c0104002b
X0b0c0c0304002b
X0b0c0c0704002b
X0b0d0c0304002b
X0b0d0c0704002b
X0b0e0c0304002b
X0b0e0c0704002b
X0b0f0c0304002b
X0b0f0c0704002b
X0b100c0104002b
X0b150c030c002b
X0b150c040c002b
X0b160c040c002b
X0b160c050c002b
X0b170c040c002b
X0b170c050c002b
X0b180c040c002b
X0b180c050c002b
X0b1a0c040c002b
X0b1b0c040c002b
X0b1c0c030c002b
X0b1c0c040c002b
X0b1d0c030c002b
X0b1d0c040c002b
X0b1e0c030c002b
X0b1e0c040c002b
X0b1e0c060c002b
X0b1f0c020c002b
X0b1f0c030c002b
X0b200c020c002b
X0b200c050c002b
X0b210c030c002b
X0b210c040c002b
X0b220c040c002b
X0b230c020c002b
X0b240c020c002b
X0b250c040c002b
X0b250c050c002b
X0b260c030c002b
X0b260c040c002b
X0b260c060c002b
X0b270c060c002b
X0b280c060c002b
X0b290c040c002b
X0b2a0c040c002b
X0b2b0c0b0c002b
X0b2b0c0c0c002b
X03270c0c0d1c2b
X0b1c0c070c1c2b
X03210c0b0e1e2b
X0b1f0c060e1e2b
X0b200c010e1e2b
X0b200c060e1e2b
X0b210c050e1e2b
X0b220c010e1e2b
X0b240c030e1e2b
X03280c0c10282b
X0b2b0c0a10282b
X03100d0b051011
X0b100d07051011
X0b230c050c002b
X0b250c050c002b
X0b2b0e0c0c002b
X0b0d0d01180c16
X0b130d05180c16
X0b140d01180c16
X03140d0c080a14
X0b0a0d07080a14
V02180c00
X03090d0910090a
X0b090d0310090a
X0b0a0d0310090a
V02190c00
X03100d0c0e0810
X0b090d070e0810
X03180d0a181719
X0b170d00181719
X0b180d02181719
X0b190d01181719
X03070d09100708
X0b070d03100708
X0b080d03100708
X03190d0a08191a
X0b1a0d0108191a
X03190d0909181a
X0b1a0d0609181a
X031a0d080e111a
X0b130d060e111a
X0b140d060e111a
X03080d0a020608
X0b070d00020608
X0b070d06020608
X0b080d02020608
X0b080d06020608
X030f0d0912060f
X0b070d0112060f
X09080d0012060f
X0b080d0112060f
X0b090d0112060f
X0b0a0d0112060f
X0b0f0d0512060f
V021c0c00
X031c0d0a081b1c
X0b1b0d00081b1c
X0b1c0d02081b1c
V02040c00
X03170d0c000e1d
X0b0e0d07000e1d
X03040d0a120305
X0b030d00120305
X0b040d02120305
X031c0d0b011c1e
X0b1e0d01011c1e

```
X0b240d04102324
X03250d08092425
X0b250d01092425
X03240d0c151c25
X0b1e0d07151c25
X03260d0c092627
X0b260d07092627
X032b0d0401222b
X0b220d0601222b
X0b0c0d0603002b
X0b0d0d0603002b
X0b000d0204002b
X0b000d0304002b
X0b010d0104002b
X0b010d0504002b
X0b010d0704002b
X0b020d0104002b
X0b020d0504002b
X0b020d0704002b
X0b030d0104002b
X0b030d0204002b
X0b030d0504002b
X0b030d0704002b
X0b040d0104002b
X0b040d0504002b
X0b040d0704002b
X0b050d0104002b
X0b050d0504002b
X0b060d0104002b
X0b060d0504002b
X0b070d0204002b
X0b070d0704002b
X0b080d0704002b
X0b0b0d0004002b
X0b0b0d0104002b
X0b0b0d0504002b
X0b0c0d0404002b
X0b0c0d0704002b
X0b0d0d0304002b
X0b0f0d0004002b
X0b0f0d0204002b
X0b0f0d0304002b
X0b0f0d0404002b
X0b180d0504002b
X0b180d0704002b
X0b190d0204002b
X0b190d0504002b
X0b1a0d0304002b
X0b1a0d0504002b
X0b1b0d0104002b
X0b1b0d0204002b
X0b1b0d0504002b
X0b1b0d0704002b
X0b1c0d0104002b
X0b1c0d0504002b
X0b1c0d0704002b
X0b1d0d0104002b
X0b1d0d0504002b
X0b1e0d0504002b
X0b1f0d0104002b
X0b1f0d0204002b
X0b1f0d0504002b
X0b1f0d0704002b
X0b200d0104002b
X0b200d0504002b
X0b200d0704002b
X0b210d0104002b
X0b210d0504002b
X0b220d0304002b
X0b220d0504002b
X0b230d0204002b
X0b230d0304002b
X0b230d0604002b
X0b230d0704002b
X0b240d0104002b
X0b240d0504002b
X0b240d0704002b
X0b250d0304002b
X0b250d0604002b
X0b260d0104002b
X0b260d0504002b
X0b270d0004002b
X0b270d0104002b
X0b270d0504002b
X0b280d0004002b
X0b280d0104002b
X0b070d050c002b
X0b080d040c002b
X0b080d050c002b
X0b090d040c002b
X0b090d050c002b
X0b0a0d040c002b
X0b0a0d050c002b
X0b0b0d060c002b
X0b0d0d040c002b
X0b0d0d070c002b
X0b0e0d030c002b
X0b0e0d040c002b
X0b0e0d050c002b
X0b100d040c002b
X0b100d060c002b
X0b110d060c002b
X0b120d040c002b
X0b120d060c002b
X0b120d070c002b
X0b130d030c002b
X0b130d040c002b
X0b140d030c002b
X0b140d040c002b
X0b150d040c002b
X0b150d060c002b
X0b160d040c002b
X0b160d060c002b
X0b160d070c002b
X0b170d040c002b
X0b170d060c002b
X0b180d040c002b
X0b180d060c002b
X0b190d030c002b
X0b190d040c002b
X0b1a0d040c002b
X0b1a0d070c002b
X0b1b0d040c002b
X0b1b0d060c002b
X0b1c0d040c002b
X0b1c0d060c002b
X0b1d0d040c002b
X0b1d0d060c002b
X0b1d0d070c002b
X0b2a0d040c002b
X0b2a0d060c002b
X0b2b0d0b0c002b
X0b2b0d0c0c002b
X031a0d090f1a2b
X03240d080f1a2b
X03110d0a17002b
X03260d0817002b
X0b0e0d0617002b
X0b0f0d0617002b
V020f0d01
V020e0d01
X030e0e09010e10
X0b0e0e05010e10
X0b0f0e05010e10
X03130e0c011113
X0b130e01011113
V020d0d01
V02140d01
X03140e09001214
X0b140e05001214
V020c0d01
X030c0e09000c0e
X0b0c0e05000c0e
X0b0d0e05000c0e
V020a0d01
X030a0e090d090b
X0b090e010d090b
X0b0a0e030d090b
V02080d01
V02190d01
V021a0d01
X03080e090b0709
X0b070e010b0709
X0b080e030b0709
V021e0d01
V02220d01
X03220e08002123
X0b220e05002123
X03220e0c0b2224
X0b220e070b2224
X03220e09071c25
X0b230e07071c25
X0b110e0104002b
X0b120e0104002b
X0b130e0504002b
X0b130e0704002b
X0b140e0704002b
X0b150e0104002b
X0b160e0104002b
X0b170e0104002b
X0b180e0104002b
X0b190e0304002b
X0b190e0704002b
X0b1a0e0304002b
X0b1a0e0704002b
X0b1b0e0104002b
X0b1c0e0104002b
X0b1d0e0104002b
X0b1e0e0304002b
X0b1e0e0704002b
X0b1f0e0104002b
X0b200e0104002b
X0b210e0104002b
X0b220e0304002b
X0b230e0104002b
X0b230e0304002b
X0b240e0104002b
X0b250e0104002b
X0b250e0304002b
X0b260e0104002b
X0b270e0104002b
X0b280e0104002b
X0b290e0104002b
X0b2a0e0104002b
X0b2b0e0a04002b
X0b000e000c002b
X0b070e050c002b
X0b080e050c002b
X0b090e050c002b
X0b0a0e050c002b
X0b130e030c002b
X0b140e030c002b
X0b190e050c002b
X0b1a0e050c002b
X0b1e0e050c002b
```

APPX B (P. ii)

```
; HEADER
; FILEID DEFDES /designs/em2kact/em2kact.def fb2c06f5
; CHECKSUM fb2c06f5
; PROGRAM Action Logic System
; VERSION 1.22
; VAR DEFSYS /actel/system.def
; VAR DEFUSR /actuser/ron/ron.def
; VAR DEFDES /designs/em2kact/em2kact.def
; ENDHEADER
data PACKAGE pkg1020
data DIE die1020
data PLACECLOCKBALANCESTRENGTH 6
data ta-temp-derate ind
data timer-layout post
data timer-condition ind
data ta-volt-derate V450
```

APPENDIX F (PART III)

```
; HEADER
; FILEID PIN /designs/EM2KACT/EM2KACT.pin of bc24d0
; CHECKSUM e3ee24d0
; PROGRAM Action Logic System
; VERSION 1.22
; DEPEND DDFDIE /actel/die1020.ddf 91-38a0b
; DEPEND DDFPACKAGE /actel/pkg1020.ddf 5b8528d6
; VAR DDFDIE /actel/die1020.ddf
; VAR DDFPACKAGE /actel/pkg1020.ddf
; ENDHEADER
DEF em2kact.
NET NONRST; ; PIN:54.
NET NBCLKIN; ; PIN:64.
```

PINOUTS CORRESPOND TO FIGURES INDICATED

| Net | Pinout note |
|---|---|
| NET TX; ; PIN:2. | RS 232 XMIT LINE |
| NET P_DVALID; ; PIN:42. | |
| NET P_COMERR; ; PIN:41. | |
| NET NBCLKOUT; ; PIN:59. | |
| NET XIN; ; PIN:53. | |
| NET XOUT; ; PIN:55. | |
| NET P_PMO; ; PIN:70.<br>NET P_NMO; ; PIN:71.<br>NET P_PM1; ; PIN:62.<br>NET P_NM1; ; PIN:63.<br>NET P_PM2; ; PIN:57.<br>NET P_NM2; ; PIN:58.<br>NET P_PM3; ; PIN:76.<br>NET P_NM3; ; PIN:77.<br>NET P_PM4; ; PIN:78. | SAME A PS[], NS[], PM[], NME[] IN DIAGRAMS 9i, 9j, 9k CONNECT TO $CD_b$, $CD_a$, $RD_b$, AND $RD_a$ RESPECTIVELY ON FIG. 9b |
| NET RCV; ; PIN:3. | CONNECT TO FIG. 9[illegible] SIGNAL [illegible] |
| NET P_NM4; ; PIN:79.<br>NET P_PM5; ; PIN:80.<br>NET P_NM5; ; PIN:81.<br>NET P_PWO; ; PIN:44. | SAME A PS[], NS[], PM[], NME[] IN DIAGRAMS 9i, 9j, 9k CONNECT TO $CD_b$, $CD_a$, $RD_b$, AND $RD_a$ RESPECTIVELY ON FIG. 9b |
| NET P_CSO; ; PIN:27. | CONTACT STATUS INPUTS CONNECT TO "NEW #" OF FIG. 9a. |
| NET P_NSO; ; PIN:45.<br>NET P_PS1; ; PIN:48.<br>NET P_NS1; ; PIN:49. | SAME A PS[], NS[], PM[], NME[] IN DIAGRAMS 9i, 9j, 9k CONNECT TO $CD_b$, $CD_a$, $RD_b$, AND $RD_a$ RESPECTIVELY ON FIG. 9b |
| NET P_CS1; ; PIN:28. | CONTACT STATUS INPUTS CONNECT TO "NEW #" OF FIG. 9a. |
| NET P_PS2; ; PIN:50.<br>NET P_NS2; ; PIN:51.<br>NET P_PS3; ; PIN:10. | SAME A PS[], NS[], PM[], NME[] IN DIAGRAMS 9i, 9j, 9k CONNECT TO $CD_b$, $CD_a$, $RD_b$, AND $RD_a$ RESPECTIVELY ON FIG. 9b |
| NET P_CS2; ; PIN:29. | CONTACT STATUS INPUTS CONNECT TO "NEW #" OF FIG. 9a. |
| NET P_NS3; ; PIN:9.<br>NET P_PS4; ; PIN:8.<br>NET P_NS4; ; PIN:7. | SAME A PS[], NS[], PM[], NME[] IN DIAGRAMS 9i, 9j, 9k CONNECT TO $CD_b$, $CD_a$, $RD_b$, AND $RD_a$ RESPECTIVELY ON FIG. 9b |
| NET P-CS3; ; PIN:30. | CONTACT STATUS INPUTS CONNECT TO "NEW #" OF FIG. 9a. |
| NET P_PS5; ; PIN:6.<br>NET P_NS5; ; PIN:5. | SAME A PS[], NS[], PM[], NME[] IN DIAGRAMS 9i, 9j, 9k CONNECT TO $CD_b$, $CD_a$, $RD_b$, AND $RD_a$ RESPECTIVELY ON FIG. 9b |
| NET P_CS4; ; PIN:31. | CONTACT STATUS INPUTS CONNECT TO "NEW #" OF FIG. 9a. |
| NET P_PS6; ; PIN:84.<br>NET P_NS6; ; PIN:83. | SAME A PS[], NS[], PM[], NME[] IN DIAGRAMS 9i, 9j, 9k CONNECT TO $CD_b$, $CD_a$, $RD_b$, AND $RD_a$ RESPECTIVELY ON FIG. 9b |
| NET P_MSTO; ; PIN:16.<br>NET P_MST1; ; PIN:17.<br>NET P_MST2; ; PIN:20. | MOTOR READ STATUS INPUTS CONNECT TO MSTAT ON FIG. 9b |
| NET P_CS5; ; PIN:32. | CONTACT STATUS INPUTS CONNECT TO "NEW #" OF FIG. 9a. |
| NET P_MST3; ; PIN:21.<br>NET P_MST4; ; PIN:22.<br>NET P_MST5; ; PIN:23. | MOTOR READ STATUS INPUTS CONNECT TO MSTAT ON FIG. 9b |
| NET P_TDRV; ; PIN:35 | OPTO TRANS DRIVER LINE (FIG. 9i, [illegible]) CONNECT TO "NEW #" ON FIG. 9a |

Note: Erroneous COMM messages result in the gate array responding with two all 1's response bytes (ie., 11111111 and 11111111), the gate array resetting itself with no other action, and then the gate array waiting for the next valid byte 0.

The following tables are a complete list of EM2000 Gate Array Commands and responses between a controller and the device.

Gate Array READ MOTOR Commands/Responses

| Command Messages | | No Motor Present Response | | Motor Present Response | |
|---|---|---|---|---|---|
| Command Byte 1 | Command Byte 0 | Response Byte 1 | Response Byte 0 | Response Byte 1 | Response Byte 0 |
| 00000001 | 00000000 | 00000001 | 00000000 | 11010001 | 00000000 |
| 00000001 | 10100010 | 00000001 | 10100010 | 11010001 | 10100010 |
| 00000001 | 11100100 | 00000001 | 11100100 | 11010001 | 11100100 |
| 00000001 | 01000110 | 00000001 | 01000110 | 11010001 | 01000110 |
| 00000001 | 01101000 | 00000001 | 01101000 | 11010001 | 01101000 |
| 00000001 | 11001010 | 00000001 | 11001010 | 11010001 | 11001010 |
| 00000001 | 10001100 | 00000001 | 10001100 | 11010001 | 10001100 |
| 00000001 | 00101110 | 00000001 | 00101110 | 11010001 | 00101110 |
| 00000001 | 11010000 | 00000001 | 11010000 | 11010001 | 11010000 |
| 00000001 | 01110010 | 00000001 | 01110010 | 11010001 | 01110010 |
| 00000001 | 00110100 | 00000001 | 00110100 | 11010001 | 00110100 |
| 00000001 | 10010110 | 00000001 | 10010110 | 11010001 | 10010110 |
| 00000001 | 10111000 | 00000001 | 10111000 | 11010001 | 10111000 |
| 00000001 | 00011010 | 00000001 | 00011010 | 11010001 | 00011010 |
| 00000001 | 01011100 | 00000001 | 01011100 | 11010001 | 01011100 |
| 00000001 | 11111110 | 00000001 | 11111110 | 11010001 | 11111110 |
| 10100011 | 00000000 | 10100011 | 00000000 | 01110011 | 00000000 |
| 10100011 | 10100010 | 10100011 | 10100010 | 01110011 | 10100010 |
| 10100011 | 11100100 | 10100011 | 11100100 | 01110011 | 11100100 |
| 10100011 | 01000110 | 10100011 | 01000110 | 01110011 | 01000110 |
| 10100011 | 01101000 | 10100011 | 01101000 | 01110011 | 01101000 |
| 10100011 | 11001010 | 10100011 | 11001010 | 01110011 | 11001010 |
| 10100011 | 10001100 | 10100011 | 10001100 | 01110011 | 10001100 |
| 10100011 | 00101110 | 10100011 | 00101110 | 01110011 | 00101110 |
| 10100011 | 11010000 | 10100011 | 11010000 | 01110011 | 11010000 |
| 10100011 | 01110010 | 10100011 | 01110010 | 01110011 | 01110010 |
| 10100011 | 00110100 | 10100011 | 00110100 | 01110011 | 00110100 |
| 10100011 | 10010110 | 10100011 | 10010110 | 01110011 | 10010110 |
| 10100011 | 10111000 | 10100011 | 10111000 | 01110011 | 10111000 |
| 10100011 | 00011010 | 10100011 | 00011010 | 01110011 | 00011010 |
| 10100011 | 01011100 | 10100011 | 01011100 | 01110011 | 01011100 |
| 10100011 | 11111110 | 10100011 | 11111110 | 01110011 | 11111110 |
| 11100101 | 00000000 | 11100101 | 00000000 | 00110101 | 00000000 |
| 11100101 | 10100010 | 11100101 | 10100010 | 00110101 | 10100010 |
| 11100101 | 11100100 | 11100101 | 11100100 | 00110101 | 11100100 |
| 11100101 | 01000110 | 11100101 | 01000110 | 00110101 | 01000110 |
| 11100101 | 01101000 | 11100101 | 01101000 | 00110101 | 01101000 |
| 11100101 | 11001010 | 11100101 | 11001010 | 00110101 | 11001010 |
| 11100101 | 10001100 | 11100101 | 10001100 | 00110101 | 10001100 |
| 11100101 | 00101110 | 11100101 | 00101110 | 00110101 | 00101110 |
| 11100101 | 11010000 | 11100101 | 11010000 | 00110101 | 11010000 |
| 11100101 | 01110010 | 11100101 | 01110010 | 00110101 | 01110010 |

Note: Erroneous COMM messages result in the gate array responding with two all 1's [illegible] bytes (ie., 1111111 and 1111111), the gate array resetting itself with no other action, and then the gate array waiting for the next valid byte 0.

Gate Array READ CONTACT Commands/Responses

| Command Messages | | Circuit Breaker Open Response | | Circuit Breaker Closed Response | |
|---|---|---|---|---|---|
| Command Byte 1 | Command Byte 0 | Response Byte 1 | Response Byte 0 | Response Byte 1 | Response Byte 0 |
| 01101001 | 00000000 | 00000001 | 00000000 | 11010001 | 00000000 |
| 01101001 | 10100010 | 00000001 | 10100010 | 11010001 | 10100010 |
| 01101001 | 11100100 | 00000001 | 11100100 | 11010001 | 11100100 |
| 01101001 | 01000110 | 00000001 | 01000110 | 11010001 | 01000110 |
| 01101001 | 01101000 | 00000001 | 01101000 | 11010001 | 01101000 |
| 01101001 | 11001010 | 00000001 | 11001010 | 11010001 | 11001010 |
| 01101001 | 10001100 | 00000001 | 10001100 | 11010001 | 10001100 |
| 01101001 | 00101110 | 00000001 | 00101110 | 11010001 | 00101110 |
| 01101001 | 11010000 | 00000001 | 11010000 | 11010001 | 11010000 |
| 01101001 | 01110010 | 00000001 | 01110010 | 11010001 | 01110010 |
| 01101001 | 00110100 | 00000001 | 00110100 | 11010001 | 00110100 |
| 01101001 | 10010110 | 00000001 | 10010110 | 11010001 | 10010110 |
| 01101001 | 10111000 | 00000001 | 10111000 | 11010001 | 10111000 |
| 01101001 | 00011010 | 00000001 | 00011010 | 11010001 | 00011010 |
| 01101001 | 01011100 | 00000001 | 01011100 | 11010001 | 01011100 |
| 01101001 | 11111110 | 00000001 | 11111110 | 11010001 | 11111110 |
| 11001011 | 00000000 | 10100011 | 00000000 | 01110011 | 00000000 |
| 11001011 | 10100010 | 10100011 | 10100010 | 01110011 | 10100010 |
| 11001011 | 11100100 | 10100011 | 11100100 | 01110011 | 11100100 |
| 11001011 | 01000110 | 10100011 | 01000110 | 01110011 | 01000110 |
| 11001011 | 01101000 | 10100011 | 01101000 | 01110011 | 01101000 |
| 11001011 | 11001010 | 10100011 | 11001010 | 01110011 | 11001010 |
| 11001011 | 10001100 | 10100011 | 10001100 | 01110011 | 10001100 |
| 11001011 | 00101110 | 10100011 | 00101110 | 01110011 | 00101110 |
| 11001011 | 11010000 | 10100011 | 11010000 | 01110011 | 11010000 |
| 11001011 | 01110010 | 10100011 | 01110010 | 01110011 | 01110010 |
| 11001011 | 00110100 | 10100011 | 00110100 | 01110011 | 00110100 |
| 11001011 | 10010110 | 10100011 | 10010110 | 01110011 | 10010110 |
| 11001011 | 10111000 | 10100011 | 10111000 | 01110011 | 10111000 |
| 11001011 | 00011010 | 10100011 | 00011010 | 01110011 | 00011010 |
| 11001011 | 01011100 | 10100011 | 01011100 | 01110011 | 01011100 |
| 11001011 | 11111110 | 10100011 | 11111110 | 01110011 | 11111110 |
| 11100101 | 00000000 | 11100101 | 00000000 | 00110101 | 00000000 |
| 11100101 | 10100010 | 11100101 | 10100010 | 00110101 | 10100010 |
| 11100101 | 11100100 | 11100101 | 11100100 | 00110101 | 11100100 |
| 11100101 | 01000110 | 11100101 | 01000110 | 00110101 | 01000110 |
| 11100101 | 01101000 | 11100101 | 01101000 | 00110101 | 01101000 |
| 11100101 | 11001010 | 11100101 | 11001010 | 00110101 | 11001010 |
| 11100101 | 10001100 | 11100101 | 10001100 | 00110101 | 10001100 |
| 11100101 | 00101110 | 11100101 | 00101110 | 00110101 | 00101110 |
| 11100101 | 11010000 | 11100101 | 11010000 | 00110101 | 11010000 |
| 11100101 | 01110010 | 11100101 | 01110010 | 00110101 | 01110010 |

Note: Erroneous COMM messages result in the gate array responding with two all 1's response bytes (ie., 1111111 and 1111111), the gate array resetting itself with no other action, and then the gate array waiting for the next valid byte 0.

Gate Array OPEN CONTACT Commands/Responses

| Command Messages | | Circuit Breaker Open Response | | Circuit Breaker Closed Response | |
|---|---|---|---|---|---|
| Command Byte 1 | Command Byte 0 | Response Byte 1 | Response Byte 0 | Response Byte 1 | Response Byte 0 |
| 11010001 | 00000000 | 00000001 | 00000000 | 11010001 | 00000000 |
| 11010001 | 10100010 | 00000001 | 10100010 | 11010001 | 10100010 |
| 11010001 | 11100100 | 00000001 | 11100100 | 11010001 | 11100100 |
| 11010001 | 01000110 | 00000001 | 01000110 | 11010001 | 01000110 |
| 11010001 | 01101000 | 00000001 | 01101000 | 11010001 | 01101000 |
| 11010001 | 11001010 | 00000001 | 11001010 | 11010001 | 11001010 |
| 11010001 | 10001100 | 00000001 | 10001100 | 11010001 | 10001100 |
| 11010001 | 00101110 | 00000001 | 00101110 | 11010001 | 00101110 |
| 11010001 | 11010000 | 00000001 | 11010000 | 11010001 | 11010000 |
| 11010001 | 01110010 | 00000001 | 01110010 | 11010001 | 01110010 |
| 11010001 | 00110100 | 00000001 | 00110100 | 11010001 | 00110100 |
| 11010001 | 10010110 | 00000001 | 10010110 | 11010001 | 10010110 |
| 11010001 | 10111000 | 00000001 | 10111000 | 11010001 | 10111000 |
| 11010001 | 00011010 | 00000001 | 00011010 | 11010001 | 00011010 |
| 11010001 | 01011100 | 00000001 | 01011100 | 11010001 | 01011100 |
| 11010001 | 11111110 | 00000001 | 11111110 | 11010001 | 11111110 |
| 01110011 | 00000000 | 10100011 | 00000000 | 01110011 | 00000000 |
| 01110011 | 10100010 | 10100011 | 10100010 | 01110011 | 10100010 |
| 01110011 | 11100100 | 10100011 | 11100100 | 01110011 | 11100100 |
| 01110011 | 01000110 | 10100011 | 01000110 | 01110011 | 01000110 |
| 01110011 | 01101000 | 10100011 | 01101000 | 01110011 | 01101000 |
| 01110011 | 11001010 | 10100011 | 11001010 | 01110011 | 11001010 |
| 01110011 | 10001100 | 10100011 | 10001100 | 01110011 | 10001100 |
| 01110011 | 00101110 | 10100011 | 00101110 | 01110011 | 00101110 |
| 01110011 | 11010000 | 10100011 | 11010000 | 01110011 | 11010000 |
| 01110011 | 01110010 | 10100011 | 01110010 | 01110011 | 01110010 |
| 01110011 | 00110100 | 10100011 | 00110100 | 01110011 | 00110100 |
| 01110011 | 10010110 | 10100011 | 10010110 | 01110011 | 10010110 |
| 01110011 | 10111000 | 10100011 | 10111000 | 01110011 | 10111000 |
| 01110011 | 00011010 | 10100011 | 00011010 | 01110011 | 00011010 |
| 01110011 | 01011100 | 10100011 | 01011100 | 01110011 | 01011100 |
| 01110011 | 11111110 | 10100011 | 11111110 | 01110011 | 11111110 |
| 00110101 | 00000000 | 11100101 | 00000000 | 00110101 | 00000000 |
| 00110101 | 10100010 | 11100101 | 10100010 | 00110101 | 10100010 |
| 00110101 | 11100100 | 11100101 | 11100100 | 00110101 | 11100100 |
| 00110101 | 01000110 | 11100101 | 01000110 | 00110101 | 01000110 |
| 00110101 | 01101000 | 11100101 | 01101000 | 00110101 | 01101000 |
| 00110101 | 11001010 | 11100101 | 11001010 | 00110101 | 11001010 |
| 00110101 | 10001100 | 11100101 | 10001100 | 00110101 | 10001100 |
| 00110101 | 00101110 | 11100101 | 00101110 | 00110101 | 00101110 |
| 00110101 | 11010000 | 11100101 | 11010000 | 00110101 | 11010000 |
| 00110101 | 01110010 | 11100101 | 01110010 | 00110101 | 01110010 |

Note: Erroneous COMM messages result in the gate array responding with two all 1's response bytes (ie., 11111111 and 11111111), the gate array resetting itself with no other action, and then the gate array waiting for the next valid byte 0.

Gate Array CLOSE CONTACT Commands/Responses

| Command Messages | | Circuit Breaker Open Response | | Circuit Breaker Closed Response | |
|---|---|---|---|---|---|
| Command Byte 1 | Command Byte 0 | Response Byte 1 | Response Byte 0 | Response Byte 1 | Response Byte 0 |
| 10111001 | 00000000 | 00000001 | 00000000 | 11010001 | 00000000 |
| 10111001 | 10100010 | 00000001 | 10100010 | 11010001 | 10100010 |
| 10111001 | 11100100 | 00000001 | 11100100 | 11010001 | 11100100 |
| 10111001 | 01000110 | 00000001 | 01000110 | 11010001 | 01000110 |
| 10111001 | 01101000 | 00000001 | 01101000 | 11010001 | 01101000 |
| 10111001 | 11001010 | 00000001 | 11001010 | 11010001 | 11001010 |
| 10111001 | 10001100 | 00000001 | 10001100 | 11010001 | 10001100 |
| 10111001 | 00101110 | 00000001 | 00101110 | 11010001 | 00101110 |
| 10111001 | 11010000 | 00000001 | 11010000 | 11010001 | 11010000 |
| 10111001 | 01110010 | 00000001 | 01110010 | 11010001 | 01110010 |
| 10111001 | 00110100 | 00000001 | 00110100 | 11010001 | 00110100 |
| 10111001 | 10010110 | 00000001 | 10010110 | 11010001 | 10010110 |
| 10111001 | 10111000 | 00000001 | 10111000 | 11010001 | 10111000 |
| 10111001 | 00011010 | 00000001 | 00011010 | 11010001 | 00011010 |
| 10111001 | 01011100 | 00000001 | 01011100 | 11010001 | 01011100 |
| 10111001 | 11111110 | 00000001 | 11111110 | 11010001 | 11111110 |
| 00011011 | 00000000 | 10100011 | 00000000 | 01110011 | 00000000 |
| 00011011 | 10100010 | 10100011 | 10100010 | 01110011 | 10100010 |
| 00011011 | 11100100 | 10100011 | 11100100 | 01110011 | 11100100 |
| 00011011 | 01000110 | 10100011 | 01000110 | 01110011 | 01000110 |
| 00011011 | 01101000 | 10100011 | 01101000 | 01110011 | 01101000 |
| 00011011 | 11001010 | 10100011 | 11001010 | 01110011 | 11001010 |
| 00011011 | 10001100 | 10100011 | 10001100 | 01110011 | 10001100 |
| 00011011 | 00101110 | 10100011 | 00101110 | 01110011 | 00101110 |
| 00011011 | 11010000 | 10100011 | 11010000 | 01110011 | 11010000 |
| 00011011 | 01110010 | 10100011 | 01110010 | 01110011 | 01110010 |
| 00011011 | 00110100 | 10100011 | 00110100 | 01110011 | 00110100 |
| 00011011 | 10010110 | 10100011 | 10010110 | 01110011 | 10010110 |
| 00011011 | 10111000 | 10100011 | 10111000 | 01110011 | 10111000 |
| 00011011 | 00011010 | 10100011 | 00011010 | 01110011 | 00011010 |
| 00011011 | 01011100 | 10100011 | 01011100 | 01110011 | 01011100 |
| 00011011 | 11111110 | 10100011 | 11111110 | 01110011 | 11111110 |
| 01011101 | 00000000 | 11100101 | 00000000 | 00110101 | 00000000 |
| 01011101 | 10100010 | 11100101 | 10100010 | 00110101 | 10100010 |
| 01011101 | 11100100 | 11100101 | 11100100 | 00110101 | 11100100 |
| 01011101 | 01000110 | 11100101 | 01000110 | 00110101 | 01000110 |
| 01011101 | 01101000 | 11100101 | 01101000 | 00110101 | 01101000 |
| 01011101 | 11001010 | 11100101 | 11001010 | 00110101 | 11001010 |
| 01011101 | 10001100 | 11100101 | 10001100 | 00110101 | 10001100 |
| 01011101 | 00101110 | 11100101 | 00101110 | 00110101 | 00101110 |
| 01011101 | 11010000 | 11100101 | 11010000 | 00110101 | 11010000 |
| 01011101 | 01110010 | 11100101 | 01110010 | 00110101 | 01110010 |

What is claimed is:

1. For an electrical distribution system used to control current paths through a plurality of associated electrical switching means, at least one of which is operable by remote control in at least open and closed circuit positions, a circuit arrangement comprising:

a loadcenter-type enclosure which receives loadcenter power to source the current paths and which contains an array of termination points which are used in sets, such that each set includes a plurality of termination points, wherein each said set receives a remotely generated control signal designated for controlling said at least one electrical switching means; and a control circuit including control processing means, coupled to the array of termination points and responsive to said remotely generated control signal, for controlling said at least one electrical switching means between said at least open and closed circuit positions, wherein said termination points couple said remotely generated control signal to the arrangement wherein said termination points couple said remotely generated control signal to the arrangement, wherein said array of termination points includes an X by Y grid, X and Y being integers greater than one, said control circuit further includes termination processing means for reading the array of termination points and for informing said control processing means of the remotely generated control signal, said termination processing means includes a microcomputer, and wherein the array of termination points is read by sending a plurality of pole signals from said microcomputer and reading a plurality of associated status signals.

2. A circuit arrangement, according to claim 1, wherein the plurality of poll and status signals respectively correspond to the X and Y axis on the grid.

3. A circuit arrangement, according to claim 2, wherein the remotely generated control signal includes a pulsed signal for indicating that the associated electrical switching means should change positions between the open and closed circuit positions.

4. A circuit arrangement, according to claim 2, wherein the remotely generated control signal includes a level-indicating signal having an open position level and a closed position level for indicating the open and closed positions for the associated electrical switching means.

5. A circuit arrangement, according to claim 2, wherein the remotely generated control signal includes a level-indicating signal having an open position level and a closed position level for indicating the open and closed positions for the associated electrical switching means and includes a pulsed signal for indicating that the associated electrical switching means should change positions between the open and closed circuit positions.

6. An electrical distribution system for controlling a plurality of electrical switching devices, each electrical switching device operating in response to a remotely generated signal so as to provide at least open-circuit and closed-circuit positions, the system comprising:

signal generation means for generating the remotely generated signals;

a loadcenter-type enclosure which receives loadcenter power to source the current paths and contains the electrical switching means, and includes:

an array of termination points which are used in sets such that each set includes a plurality of termination points, wherein each said set receives an associated remotely generated control signal from the signal generation means designated for controlling at least one o the plurality of electrical switching means; and a control circuit including control processing means, coupled to the array of termination points and responsive to said remotely generated control signals, for controlling said plurality of electrical switching means between said at least open and closed circuit positions, wherein said termination points couple said remotely generated control signal to the enclosure, wherein said array of termination points includes an X by Y grid, X and Y being integers greater than one, said control circuit further includes a microcomputer which reads the array of termination points and informs said control processing means of the remotely generated control signals, and said microcomputer reads the remotely generated control signals at the array of termination points by sending a plurality of pole signals and reading a plurality of associated status signals.

7. An electrical distribution system, according to claim 6, wherein said array of termination points includes a prescribed arrangement of sets.

8. An electrical distribution system, according to claim 7, wherein each said set is connected to a group of wires so as to make a dry-contact termination.

9. An electrical distribution system, according to claim 8, wherein the control circuit is a user-operable programmable control circuit includes means for programming a prescribed map which correlates said sets to said plurality of electrical switching means.

10. An electrical distribution system, according to claim 9, wherein the remotely generated control signals include at least one of the following: (1) a level-indicating signal having an open position level and a closed position level for indicating the open and closed positions for the associated electrical switching means, and (2) a pulsed signal for indicating that the associated electrical switching means should change positions between the open and closed circuit positions.

11. An electrical distribution system for controlling a plurality of electrical switching devices, each electrical switching device operating in response to a remotely generated signal so as to provide at least open-circuit and closed-circuit positions, the system comprising:

signal generation means for generating the remotely generated signals;

an enclosure which contains the electrical switching means and contains:

an array of termination points which are used in sets, such that each set includes a plurality of termination points, wherein each said set receives an associated remotely generated control signal from the signal generation means for commanding at least one of the plurality of electrical switching means; and a programmable control circuit including control processing means, coupled to the array of termination points and responsive to said remotely generated control signals, for controlling said plurality of electrical switching means between said at least open and closed circuit positions, said control circuit being removable from said enclosure;

wherein said array includes an X by Y grid, wherein X and Y are both integers greater than 1 and said control circuit further includes a microcomputer which reads the array of termination points and informs said control processing means of the remotely generated control signals, wherein the microcomputer reads the remotely generated control signals at the array of termination points by sending a plurality of poll signals form said microcomputer and reading a plurality of associated status signals, and wherein the control circuit includes means for programming a prescribed map which correlates said sets to said plurality of electrical switching means.

12. An electrical distribution system, according to claim 11, wherein the array of termination points is electrically isolated from the control circuit.

* * * * *